(12) United States Patent
Sakai

(10) Patent No.: US 7,411,841 B2
(45) Date of Patent: Aug. 12, 2008

(54) MEMORY HAVING STORAGE MEANS

(75) Inventor: Naofumi Sakai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 666 days.

(21) Appl. No.: 10/874,168

(22) Filed: Jun. 24, 2004

(65) Prior Publication Data

US 2007/0217279 A1    Sep. 20, 2007

Related U.S. Application Data

(63) Continuation of application No. 10/390,649, filed on Mar. 19, 2003, now Pat. No. 6,795,351.

(30) Foreign Application Priority Data

| Mar. 20, 2002 | (JP) | 2002-77430 |
| May 13, 2002 | (JP) | 2002-136411 |
| Mar. 4, 2003 | (JP) | 2003-57179 |

(51) Int. Cl.
*G11C 16/04* (2006.01)

(52) U.S. Cl. .............. 365/189.09; 365/145; 365/189.08

(58) Field of Classification Search ........... 365/189.09, 365/145, 189.08, 189.04, 200, 210
See application file for complete search history.

(56) References Cited

U.S. PATENT DOCUMENTS

| 5,532,953 A | 7/1996 | Ruesch et al. ............... 365/145 |
| 5,541,871 A | 7/1996 | Nishimura et al. ........... 365/145 |
| 5,550,770 A | 8/1996 | Kuroda et al. | |
| 5,822,239 A | 10/1998 | Ishihara et al. .............. 365/145 |
| 6,088,257 A | 7/2000 | Jeon et al. .................... 365/145 |
| 6,356,475 B1 | 3/2002 | Tamura et al. | |
| 6,473,329 B1 | 10/2002 | Nakamura | |
| 6,522,572 B2 | 2/2003 | Nakamura ................... 365/145 |
| 6,795,351 B2 * | 9/2004 | Sakai ..................... 365/189.09 |
| 6,972,984 B2 * | 12/2005 | Maruyama ................... 365/145 |
| 7,016,217 B2 * | 12/2005 | Maruyama ................... 365/145 |
| 7,133,304 B2 * | 11/2006 | Madan et al. ............... 365/145 |
| 7,251,153 B2 * | 7/2007 | Sakai et al. ................... 365/145 |

(Continued)

FOREIGN PATENT DOCUMENTS

JP    06-077434 A    3/1994

(Continued)

OTHER PUBLICATIONS

Office Action for Korean Application No. 9-5-2005-045036166 mailed Sep. 12, 2005.

*Primary Examiner*—Son Dinh
*Assistant Examiner*—Hien N Nguyen
(74) *Attorney, Agent, or Firm*—McDermott Will & Emery LLP

(57) ABSTRACT

A memory capable of inhibiting a non-selected cell from disturbance is provided. This memory comprises a bit line, a word line arranged to intersect with the bit line and first storage means connected between the bit line and the word line, for applying voltages of opposite directions to the first storage means of a non-selected memory cell by the same number of times or substantially applying no voltages throughout a read operation and a rewrite operation while varying a rewriting method with a case of reading first data by the read operation and with a case of reading second data by the read operation.

18 Claims, 39 Drawing Sheets

U.S. PATENT DOCUMENTS

| | | |
|---|---|---|
| 2004/0022090 A1 | 2/2004 | Hasegawa et al. |
| 2004/0105297 A1 | 6/2004 | Takano |
| 2004/0109363 A1 | 6/2004 | Hamada |
| 2006/0067139 A1* | 3/2006 | Sakai et al. ............ 365/189.09 |

FOREIGN PATENT DOCUMENTS

| | | |
|---|---|---|
| JP | 08-218215 | 8/1996 |
| JP | 09-116107 A | 5/1997 |
| JP | 10-162587 A | 6/1998 |
| JP | 2002-284892 | 9/2000 |
| KR | 2001-0031598 | 4/2001 |
| WO | 99/26252 | 5/1999 |

* cited by examiner

IN WRITING

STANDBY STATE

MEMORY HAVING STORAGE MEANS

This is a Continuation of application Ser. No. 10/390,649 filed Mar. 19, 2003 now U.S. Pat No. 6,795,351. The disclosure of the prior application is hereby incorporated by reference herein in its entirety.

BACKGROUND OF THE INVENTION

1. Field of the Invention

The present invention relates to a memory.

2. Description of the Background Art

In general, volatile and nonvolatile memories are known as semiconductor memories. A DRAM (dynamic random access memory) is known as the nonvolatile memory, and a flash EEPROM (electrically erasable and programmable read only memory) is known as the nonvolatile memory. The DRAM and the flash EEPROM, which can be highly integrated, are widely employed.

FIG. 58 is an equivalent circuit diagram showing the structure of a memory cell 103 of a conventional DRAM. FIG. 59 is a sectional view showing the structure of a trench-type capacitor 102 employed for the conventional DRAM. Referring to FIG. 58, the memory cell 103 of the conventional DRAM serving as a nonvolatile memory is formed by a selection transistor 101 and the capacitor 102. The capacitor 102 stores information of the memory cell 103 as charges. In order to read information from the memory cell 103, a word line WL rises to bring the selection transistor 101 into an ON state. Thus, a cell capacitance Ccell and a bit line capacitance Cb1 are capacitively coupled with each other. Therefore, a bit line potential depending on the quantity of the charges stored in the memory cell 103 can be read.

In the memory cell 103 of the conventional DRAM having the aforementioned structure, an upper electrode 102a, a lower electrode 102c and a dielectric film 102b forming the trench-type capacitor 102 are longitudinally extended as shown in FIG. 59, in order to ensure the cell capacitance Ccell of the capacitor 102 also when the same is refined. If refinement further progresses, however, it is difficult to ensure the capacitance of the capacitor 102 also when employing the trench structure shown in FIG. 59. In other words, high integration of the DRAM resulting from reduction of a design rule approaches to the limit.

In the flash EEPROM (hereinafter referred to as a flash memory) serving as the nonvolatile memory, a memory cell of a CHE (channel hot electron) system such as a stacked or split gate memory cell is limited in refinement of the channel length. In a memory cell of an FN (Fouler-Nordheim) write system such as a NAND memory cell, the limit of refinement is equivalent to that of a logic transistor. However, the flash memory requires a high voltage of 15 V to 20 V for operations, and if the power supply voltage for the logic transistor is reduced, efficiency for forming the high voltage of 15 V to 20 V from the low power supply voltage is reduced. Therefore, power consumption is increased and the area of a charge pumping part is also increased, to disadvantageously hinder refinement.

A ferroelectric memory is known as one of recently noted nonvolatile memories. The ferroelectric memory utilizes pseudo capacitance change resulting from the direction of polarization of a ferroelectric substance as a memory element. The ferroelectric memory, capable of rewriting data at a high speed with a low voltage in principle, is spotlighted as an ideal memory having the advantages of the high speed and the low voltage of the DRAM as well as the advantage of nonvolatility of the flash memory.

Memory cell systems for a ferroelectric memory are roughly classified into three types of systems, i.e., a one-transistor one-capacitor system, a simple matrix system and a one-transistor system. FIG. 60 is an equivalent circuit diagram showing a memory cell 113 of a one-transistor one-capacitor ferroelectric memory. FIG. 61 is an equivalent circuit diagram showing a memory cell array of a simple matrix ferroelectric memory. FIG. 62 is a hysteresis diagram for illustrating operations of the simple matrix ferroelectric memory, and FIG. 63 is a hysteresis diagram for illustrating disturbance in the simple matrix ferroelectric memory. FIG. 64 is an equivalent circuit diagram showing a memory cell 131 of a one-transistor ferroelectric memory, and FIG. 65 is a hysteresis diagram for illustrating operations of the one-transistor ferroelectric memory. FIG. 66 is an equivalent circuit diagram for illustrating a voltage application state in writing of the one-transistor ferroelectric memory shown in FIG. 64, and FIG. 67 is an equivalent circuit diagram for illustrating a voltage application state in a standby state of the one-transistor ferroelectric memory shown in FIG. 64.

As shown in FIG. 60, the memory cell 113 of the one-transistor one-capacitor ferroelectric memory is formed by a selection transistor 111 and a ferroelectric capacitor 112, similarly to that of the DRAM. The memory cell 113 is different from that of the DRAM in the ferroelectric capacitor 112. In operation, a word line WL rises for bringing the selection transistor 111 into an ON state. Thus, a capacitor capacitance Ccell of the ferroelectric capacitor 112 is connected with a bit line capacitance Cb1. Then, a plate line PL is pulse-driven for transmitting charges in a quantity varying with the direction of polarization of the ferroelectric capacitor 112. The ferroelectric memory reads data as the voltage of the bit line BL, similarly to the case of the DRAM.

In the one-transistor one-capacitor ferroelectric memory having a structure similar to that of the DRAM, refinement of the ferroelectric capacitor 112 is limited. Therefore, the ferroelectric memory is limited in high integration similarly to the DRAM.

The simple matrix ferroelectric memory is now described with reference to FIGS. 61 to 63. As shown in FIG. 61, each memory cell 121 of the simple matrix ferroelectric memory is constituted by a ferroelectric capacitor 122 consisting of a word line WL and a bit line BL formed to extend in directions intersecting with each other and a ferroelectric film (not shown) arranged between the word line WL and the bit line WL. An end of the ferroelectric capacitor 122 is connected to the word line WL while another end thereof is connected to the bit line BL. The simple matrix ferroelectric memory, reading a potential resulting from capacitive coupling between the bit line BL and the ferroelectric capacitor 122, must ensure capacitances similarly to the DRAM. In the simple matrix ferroelectric memory, however, each memory cell 121 is formed by only the ferroelectric capacitor 122 with no selection transistor, whereby the degree of integration can be improved as compared with the one-transistor one-capacitor ferroelectric memory.

Operations of the simple matrix ferroelectric memory are now described with reference to FIGS. 61 and 62. Table 1 shows voltages applied to each cell 121 in reading/writing.

TABLE 1

|  | Standby | Reading | Writing "1" | Writing "0" |
| --- | --- | --- | --- | --- |
| Selected WL | ½ Vcc | Vcc | 0 | Vcc |
| Non-Selected WL | ½ Vcc | ⅓ Vcc | ⅔ Vcc | ⅓ Vcc |
| Selected BL | ½ Vcc | 0→Floating | Vcc | 0 |
| Non-Selected BL | ½ Vcc | ⅔ Vcc | ⅓ Vcc | ⅔ Vcc |

In a write operation, both ends of the ferroelectric capacitor 122 are at the same potential in a standby state. In order to write data "0", the simple matrix ferroelectric memory applies a voltage Vcc to the word line WL while applying a voltage of 0 V to the bit line BL. At this time, the simple matrix ferroelectric memory applies the voltage Vcc to the ferroelectric capacitor 122, thereby making a transition to a point A shown in FIG. 62. Thereafter the simple matrix ferroelectric memory sets both ends of the ferroelectric capacitor 122 to the same potential, for making a transition to "0" shown in FIG. 62. In order to write data "1", the simple matrix ferroelectric memory applies the voltage 0 V to the word line WL while applying the voltage Vcc to the bit line BL. At this time, the simple matrix ferroelectric memory applies a voltage −Vcc to the ferroelectric capacitor 122, thereby making a transition to a point B in FIG. 62. Thereafter the simple matrix ferroelectric memory sets both ends of the ferroelectric capacitor 122 to the same potential, for making a transition to "1" shown in FIG. 62.

In a read operation, the simple matrix ferroelectric memory first precharges the bit line BL to 0 V. Then, the simple matrix ferroelectric memory raises the word line WL to the voltage Vcc. This voltage is Vcc capacitively divided by a capacitance CFE of the ferroelectric capacitor 122 and a parasitic capacitance CBL of the bit line BL. The capacitance CFE of the ferroelectric capacitor 122 can be approximated as a capacitance C0 or C1 depending on held data. Therefore, the potential of the bit line BL is expressed as follows:

$$V0 = \{C0/(C0+CBL)\} \times Vcc \quad (1)$$

$$V1 = \{C1/(C1+CBL)\} \times Vcc \quad (2)$$

The equation (1) expresses the potential V0 of the bit line BL when holding data "0", and the equation (2) expresses the potential V1 of the bit line BL when holding data "1".

The simple matrix ferroelectric memory determines the potential difference between the bit line potentials V0 and V1 expressed in the above equations (1) and (2) respectively with a read amplifier, thereby reading the data. Data of the memory cell 121 is destroyed in this data reading and hence the simple matrix ferroelectric memory performs a write operation (restore operation) responsive to read data after the data reading.

In the simple matrix ferroelectric memory, however, data of non-selected cells disadvantageously disappear due to disturbance. In other words, it follows that a voltage ⅓Vcc is applied to all non-selected memory cells in writing and reading. As shown in FIG. 63, therefore, the quantity of polarization is decreased due to hysteresis characteristics of a ferroelectric substance, to result in disappearance of data.

The one-transistor ferroelectric memory is now described with reference to FIGS. 64 to 67. As shown in FIG. 64, the memory cell 131 of the one-transistor ferroelectric memory is formed by connecting a ferroelectric capacitor 132 to the gate of a MOS transistor 133. In the one-transistor ferroelectric memory, an end of the ferroelectric capacitor 132 is connected to a word line WL, while the other end thereof is connected to the gate of the MOS transistor 133 forming a cell transistor. In the one-transistor ferroelectric memory, the threshold voltage of the MOS transistor 133 varies with the direction of polarization of the ferroelectric capacitor 132, to change a memory cell current. The one-transistor ferroelectric memory reads data by determining this change of the memory cell current. The one-transistor ferroelectric memory reads data by detecting the memory cell current, and hence the capacitance of the ferroelectric capacitor 132 may not be increased to some extent in consideration of the bit line capacitance, dissimilarly to the one-transistor one-capacitor ferroelectric memory shown in FIG. 60. Therefore, the ferroelectric capacitor 132 can be reduced in size so that the one-transistor ferroelectric memory is suitable for refinement.

Operations of the one-transistor ferroelectric memory are now described. In a standby state, every word line WL, every bit line BL and every source line SL are at 0 V. In a write operation, the one-transistor ferroelectric memory applies a step-up voltage Vpp to the word line WL, in order to write data "0". At this time, the one-transistor ferroelectric memory applies a potential capacitively divided with the gate capacitance of the MOS transistor 133 to the ferroelectric capacitor 132, thereby making a transition to a point A shown in FIG. 65 despite an initial state. Thereafter the one-transistor ferroelectric memory returns the word line WL to 0 V, for making a transition to data "0" shown in FIG. 65. In order to write data "1", the one-transistor ferroelectric memory applies a voltage of 0 V to the word line WL while applying the step-up voltage Vpp to the bit line BL. In this case, the one-transistor ferroelectric memory applies a voltage −Vcc to the ferroelectric capacitor 132, thereby making a transition to a point B shown in FIG. 65. Thereafter the one-transistor ferroelectric memory returns the bit line BL to 0 V, thereby making a transition to data "1" shown in FIG. 65.

In a read operation, the one-transistor ferroelectric memory raises the word line WL to a voltage Vr causing no polarization inversion. Thus, the gate voltage of the cell transistor (MOS transistor) 133 varies with a write state. A current flowing through the cell transistor 133 varies with change of the gate voltage of the cell transistor 133, and the one-transistor ferroelectric memory reads the current difference through the bit line BL. The one-transistor ferroelectric memory, which may read not potential difference resulting from capacitive coupling between the ferroelectric capacitor 132 and a bit-line capacitance but the current of the cell transistor 133, requires no polarization inversion in reading. Therefore, the one-transistor ferroelectric memory is capable of non-destructive reading.

However, the one-transistor ferroelectric memory also has the problem of disturbance of non-selected cells, similarly to the aforementioned simple matrix ferroelectric memory. Further, data changes by the so-called reverse bias retention resulting from a continuous reverse bias state to the ferroelectric capacitor 132. When the one-transistor ferroelectric memory applies the step-up voltage Vpp to the word line WL thereby writing data as shown in FIG. 66 and thereafter returns to the standby state in data writing, a potential opposite to polarization is continuously applied as shown in FIG. 67. Therefore, the data holding time is disadvantageously reduced.

As hereinabove described, it is difficult to refine the conventional DRAM and the conventional flash memory, and hence a memory cell system allowing a higher degree of integration is demanded. While the one-transistor ferroelectric memory and the simple matrix ferroelectric memory can be high integrated, data of non-selected cells disappear due to disturbance or data change by reverse bias retention resulting from a continuous reverse bias state, as hereinabove described. Thus, it is difficult to put the conventional one-transistor and simple matrix ferroelectric memories into practice.

SUMMARY OF THE INVENTION

An object of the present invention is to provide a memory capable of suppressing disturbance erasing data from non-selected cells.

In order to attain the aforementioned object, a memory according to an aspect of the present invention comprises a bit line, a word line arranged to intersect with the bit line and first storage means connected between the bit line and the word line, for applying a first voltage pulse providing an electric field of a first direction and a second voltage pulse providing an electric field opposite to the first direction to the first storage means by the same number of times respectively throughout a read operation and an operation of rewriting read data while varying a technique for applying the first voltage pulse and the second voltage pulse to the first storage means with a case of reading first data by the read operation and with a case of reading second data by the read operation.

The memory according to the aforementioned aspect applies the first voltage pulse and the second voltage pulse of opposite directions to non-selected first storage means by the same number of times throughout the read operation and the operation of rewriting the read data as hereinabove described thereby canceling polarization deterioration resulting from disturbance in the first storage means of a non-selected cell for inhibiting the non-selected cell from disturbance. Further, the memory varies the technique for applying the first voltage pulse and the second voltage pulse to the first storage means with the case of reading the first data by the read operation and with the case of reading the second data by the read operation, to be capable of applying voltages of opposite directions to the non-selected first storage means by the same number of necessary times in the case of reading the first data and the case of reading the second data independently of each other.

The memory according to the aforementioned aspect preferably applies the first voltage pulse and the second voltage pulse of opposite directions once or substantially applies no voltages when reading the first data by the read operation, while applying the first voltage pulse and the second voltage pulse of opposite directions twice or substantially applying no voltages when reading the second data by the read operation. According to this structure, polarization deterioration is easily canceled in the non-selected first storage means when the memory reads the first data and the second data, whereby the non-selected first storage means can be inhibited from disturbance. The memory may apply voltage pulses having absolutely identical or different forms as the voltage pulses applied twice.

The memory according to the aforementioned aspect preferably performs the read operation and a rewrite operation of the first data when reading the first data by the read operation, while performing the read operation, the rewrite operation of the first data, a compensatory operation for rewriting the second data and a rewrite operation of the second data when reading the second data by the read operation. According to this structure, the memory can easily apply voltage pulses of opposite directions to the non-selected first storage means by the same number of necessary times in the case of reading the first data and the case of reading the second data independently of each other.

In the memory according to the aforementioned aspect, the operation of varying the technique for applying the first voltage pulse and the second voltage pulse to the first storage means may include an operation of varying the procedure for applying the first voltage pulse and the second voltage pulse to the first storage means. The wording "varying the procedure for applying the first voltage pulse and the second voltage pulse" indicates an operation of varying the sequence of application, i.e., varying the number and directions of the voltage pulses. Further, the first storage means receiving the first voltage pulse and the second voltage pulse may include selected first storage means connected to a selected bit line and a selected word line and non-selected first storage means other than the selected first storage means.

The memory according to the aforementioned aspect preferably performs the read operation, two operations of writing the first data and an operation of rewriting the second data when reading the second data by the read operation. According to this structure, polarization deterioration resulting from disturbance is easily canceled in the non-selected first storage means when the memory reads the second data by the read operation, whereby the non-selected first storage means can be inhibited from disturbance. Further, the memory requires no separate circuit for generating a compensatory operation.

The memory according to the aforementioned aspect may start the read operation after setting the word line and the bit line to substantially identical potentials.

The memory according to the aforementioned aspect preferably applies a voltage substantially ⅓ of a voltage applied to the selected first storage means to the non-selected first storage means. According to this structure, difference between the voltages applied to the selected and non-selected first storage means can be maximized, whereby the non-selected first storage means can be further inhibited from disturbance. The wording "voltage substantially ⅓ of the voltage applied to the first storage means" indicates a voltage value included within the range of at least ⅓Vin×0.9 and not more than ⅓Vin×1.1 assuming that Vin represents the voltage applied to the first storage means.

The memory according to the aforementioned aspect may apply a voltage substantially ⅓ of a voltage applied to selected first storage means when rewriting the data to non-selected first storage means connected to a non-selected bit line while applying a voltage smaller than substantially ⅓ of the voltage applied to the selected first storage means when rewriting the data to the non-selected first storage means connected to a selected bit line in the read operation. The memory according to the aforementioned aspect may apply a voltage smaller than substantially ⅓ of a voltage applied to selected first storage means when rewriting the data to non-selected first storage means connected to a selected bit line and thereafter apply a voltage substantially ⅓ of the voltage applied to the selected first storage means when rewriting the data in the read operation. The wording "voltage smaller than substantially ⅓ of the voltage applied to the selected first storage means when rewriting data" indicates a positive or negative voltage having an absolute value smaller than the absolute value of a voltage substantially ⅓ of the voltage applied to the selected first storage means when rewriting data.

The memory according to the aforementioned aspect may apply a voltage substantially ½ of a voltage applied to selected first storage means or no voltage to non-selected first storage means. The wording "voltage substantially ½ of the voltage applied to the selected first storage means" indicates a voltage value included within the range of at least ½Vin×0.9 and not more than ½Vin×1.1 assuming that Vin represents the voltage applied to the selected first storage means. The memory according to the aforementioned aspect may apply a voltage substantially ½ of a voltage applied to selected first storage means when rewriting the data or no voltage to non-selected first storage means connected to a non-selected bit line while applying a voltage smaller than substantially ½ of the voltage applied to the selected first storage means when rewriting the data or no voltage to the non-selected first storage means connected to a selected bit line in the read operation. The wording "voltage smaller than substantially ½ of the voltage applied to the selected first storage means when rewriting data" indicates a positive or negative voltage having an absolute value smaller than the absolute value of a voltage substantially ½ of the voltage applied to the selected first storage means when rewriting data.

The memory according to the aforementioned aspect may apply a voltage smaller than substantially ½ of a voltage applied to selected first storage means when rewriting the data to non-selected first storage means connected to a selected bit line and thereafter apply a voltage substantially ½ of the voltage applied to the selected first storage means when rewriting the data in the read operation, or may substantially apply no voltage to the non-selected first storage means connected to the non-selected bit line throughout the read operation.

The memory according to the aforementioned aspect preferably performs the read operation by sensing the voltage of a selected bit line. According to this structure, the voltage of the selected bit line varies with the case of reading the first data and with the case of reading the second data, whereby the memory can easily read data. In this case, the memory preferably senses the voltage of the selected bit line in a first period and thereafter returns the voltage of the selected bit line substantially to 0 V in a second period in the read operation, while the first period is preferably set to such a length that change of the quantity of polarization applied to non-selected first storage means connected to the selected bit line in the first period is sufficiently reduced as compared with change of the quantity of polarization applied to the non-selected first storage means connected to the selected bit line in the second period, and the second period is preferably set to such a length that the non-selected first storage means connected to the selected bit line receives change equivalent to change of the quantity of polarization applied to the non-selected first storage means connected to the selected bit line in the rewrite operation. According to this structure, polarization deterioration and polarization improvement are alternately repeated by the same number of times also in the non-selected first storage means connected to the selected bit line, whereby the non-selected first storage means connected to the selected bit line can be also inhibited from disturbance.

The memory according to the aforementioned aspect preferably performs the read operation by sensing a current flowing through a selected word line. According to this structure, the current flowing through the selected word line varies with the case of reading the first data and with the case of reading the second data, whereby the memory can readily read the data.

The memory according to the aforementioned aspect preferably performs the read operation by comparing the value of a current flowing through a selected word line with the value of a current flowing through a selected bit line. According to this structure, the value of the current flowing through the selected word line is identical to that of the current flowing through the selected bit line when the memory reads the first data while the value of the current flowing through the selected word line is different from the value of the current flowing through the selected bit line when the memory reads the second data, whereby the memory can easily read the data.

The memory according to the aforementioned aspect preferably further comprises a dummy cell including second storage means outputting reference data to be compared with data read by the read operation, for applying the first voltage pulse providing the electric field of the first direction and the second voltage pulse providing the electric field opposite to the first direction by the same number of times or substantially applying no voltage to the second storage means also in the dummy cell. According to this structure, non-selected first storage means can be inhibited from disturbance also in the dummy cell, whereby the memory can correctly read data when comparing the data read by the read operation with the reference data.

In this case, a region formed with the memory cell and a region formed with the dummy cell may be divided by dividing the word line, or the region formed with the memory cell and the region formed with the dummy cell may be divided by dividing the bit line.

The memory according to the aforementioned aspect preferably previously writes data reverse to data to be written and thereafter writes the data to be written in a data write operation. According to this structure, polarization deterioration resulting from disturbance is cancelled in non-selected first storage means, whereby the non-selected first storage means can be inhibited from disturbance.

In the memory according to the aforementioned aspect, the memory cell preferably includes a memory cell constituted by a ferroelectric capacitor consisting of the word line and the bit line formed to extend in directions intersecting with each other and a ferroelectric film arranged between the word line and the bit line. According to this structure, non-selected first storage means can be easily inhibited from disturbance in a simple matrix ferroelectric memory.

In the memory according to the aforementioned aspect, the memory cell preferably includes a memory cell constituted by a ferroelectric capacitor and a load capacitance. According to this structure, non-selected first storage means can be easily inhibited from disturbance in a simple matrix ferroelectric memory including the memory cell constituted by a ferroelectric capacitor and a load capacitance. In this case, the load capacitance may be either a ferroelectric capacitor or a paraelectric capacitor. Further, the memory applies a voltage substantially $(Cf+Ce)/Ce$ times a voltage applied when the memory cell is constituted by only the ferroelectric capacitor to the memory cell assuming that Cf represents the capacitance of the ferroelectric capacitor and Ce represents the load capacitance. According to this structure, voltage arrangement according to the present invention can be easily applied to a ferroelectric memory including the memory cell constituted by a ferroelectric capacitor and a load capacitance.

In the memory according to the aforementioned aspect, the memory cell preferably includes a memory cell having a ferroelectric capacitor including an end connected to the word line and another end connected to a gate electrode of a transistor. According to this structure, non-selected first storage means can be easily inhibited from disturbance in an FET-type ferroelectric memory. In this case, the memory performs the read operation of the data by measuring the drain current of the transistor. According to this structure, the value of the drain current varies with the case of reading the first data and with the case of reading the second data, whereby the memory can easily read the data. Further, the memory applies a voltage substantially $(Cf+Cg)/Cg$ times a voltage applied when the memory cell is constituted by only the ferroelectric capacitor to the memory cell assuming that Cf represents the capacitance of the ferroelectric capacitor and Cg represents the capacitance of the gate electrode. According to this structure, the voltage arrangement of the present invention can be easily applied to the FET-type ferroelectric memory.

The memory according to the aforementioned aspect preferably has a first structure of applying the first voltage pulse and the second voltage pulse of opposite directions having the same values to at least non-selected first storage means not sharing the word line and the bit line with selected first storage means and non-selected first storage means sharing the word line with the selected first storage means among non-selected first storage means or substantially applying no voltage throughout the read operation and the operation of rewriting the read data. According to this structure, at least the first storage means not sharing the word line and the bit line with the selected first storage means and the first storage means sharing the word line with the selected first storage means can be inhibited from disturbance among the non-selected first storage means.

In the memory according to the aforementioned aspect, the first voltage pulse and the second voltage pulse of opposite directions having the same values are preferably substantially ⅓ of a voltage applied to the first storage means when writing data, and the memory preferably applies the first voltage pulse and the second voltage pulse of opposite directions substantially ⅓ of the voltage applied to the first storage means when writing the data to at least the non-selected first storage means not sharing the word line and the bit line with the selected first storage means and the non-selected first storage means sharing the word line with the selected first storage means among the non-selected first storage means throughout the read operation and the operation of rewriting the read data. According to this structure, at least the first storage means not sharing the word line and the bit line with the selected first storage means and the first storage means sharing the word line with the selected first storage means can be inhibited from disturbance among the non-selected first storage means when employing a ⅓Vcc method.

In this case, the memory preferably applies the first voltage pulse and the second voltage pulse of opposite directions substantially ⅓ of the voltage applied to the first storage means when writing the data also to non-selected first storage means sharing the bit line with the selected first memory means among the non-selected first storage means by the same number of times throughout the read operation and the operation of rewriting the read data. According to this structure, the first storage means sharing the bit line with the selected first storage means can also be inhibited from disturbance in addition to the first storage means not sharing the word line and the bit line with the selected first storage means and the first storage means sharing the word line with the selected first storage means, whereby all non-selected first storage means can be inhibited from disturbance.

In the memory according to the aforementioned aspect, the first voltage pulse and the second voltage pulse of opposite directions having the same values are preferably substantially ½ of a voltage applied to the first storage means when writing data, and the memory preferably applies the first voltage pulse and the second voltage pulse of opposite directions substantially ½ of the voltage applied to the first storage means when writing the data to at least the non-selected first storage means sharing the word line with the selected first storage means by the same number of times while substantially applying no voltage to the non-selected first storage means not sharing the word line and said bit line with the selected first storage means throughout the read operation and the operation of rewriting the read data. According to this structure, at least the first storage means not sharing the word line and the bit line with the selected first storage means and the first storage means sharing the word line with the selected first storage means can be inhibited from disturbance among the non-selected first storage means when employing a ½Vcc method.

The memory according to the aforementioned aspect may apply a prescribed voltage to selected first storage means while applying a voltage m/n (m, n: positive integers) of the prescribed voltage to non-selected first storage means in the read operation and the rewrite operation. In this case, the memory preferably applies a voltage ⅓ of the prescribed voltage to the non-selected first storage means. According to this structure, the difference between the voltages applied to the selected first storage means and the non-selected first storage means can be maximized, whereby the non-selected first storage means can be further prevented from disturbance.

In the memory according to the aforementioned aspect, the first storage means may include a ferroelectric film, or may include a resistive element.

The memory according to the aforementioned aspect may apply a voltage not more than a polarization-inverted coercive voltage to non-selected first storage means. According to this structure, the quantity of deterioration finally caused in the non-selected cells can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
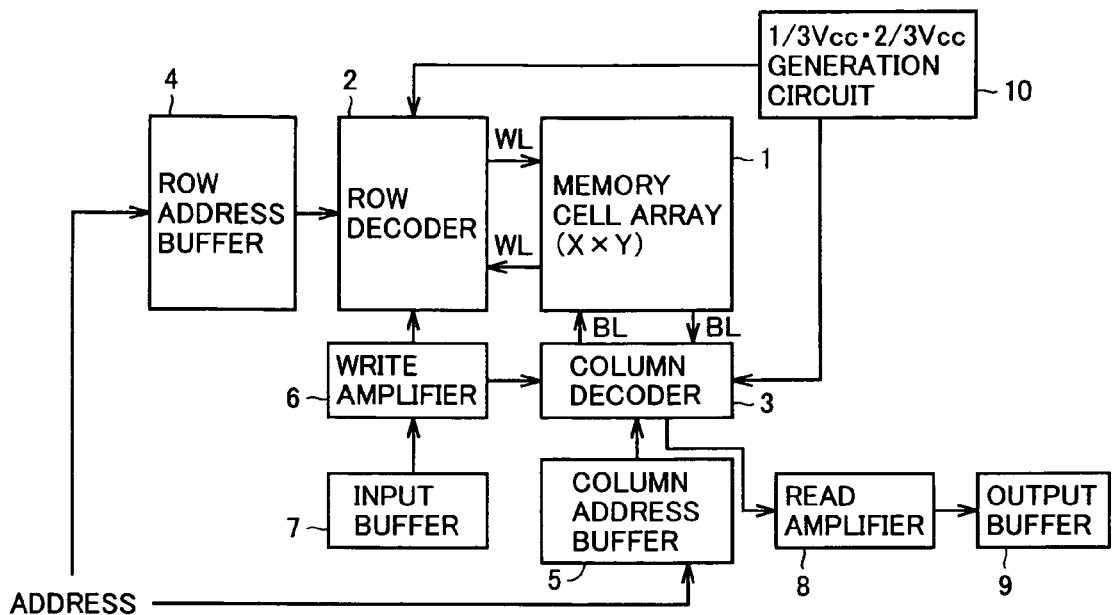
FIG. 1 is a block diagram showing the overall structure of a simple matrix ferroelectric memory according to a first embodiment of the present invention.

Embodiments of the present invention are now described with reference to the drawings.

First Embodiment

The overall structure of a simple matrix ferroelectric memory according to a first embodiment of the present invention is described with reference to FIG. 1. The ferroelectric memory according to the first embodiment comprises a memory cell array 1, a row decoder 2, a column decoder 3, a row address buffer 4, a column address buffer 5, a write amplifier 6, an input buffer 7, a read amplifier 8 consisting of a voltage sense amplifier, an output buffer 9 and a ⅓Vcc·⅔Vcc generation circuit 10.

Figure 61:
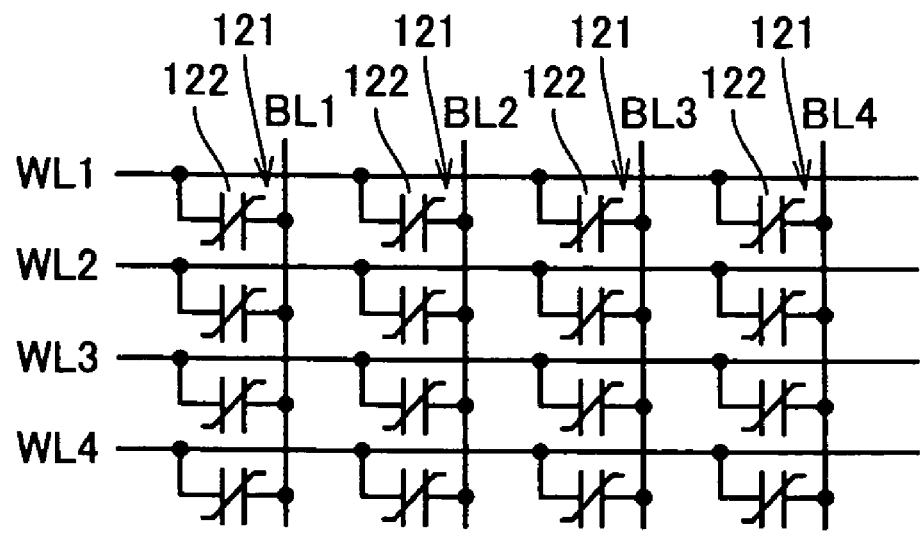
FIG. 61 is an equivalent circuit diagram showing a memory cell array of a conventional simple matrix ferroelectric memory.
Figure 62:
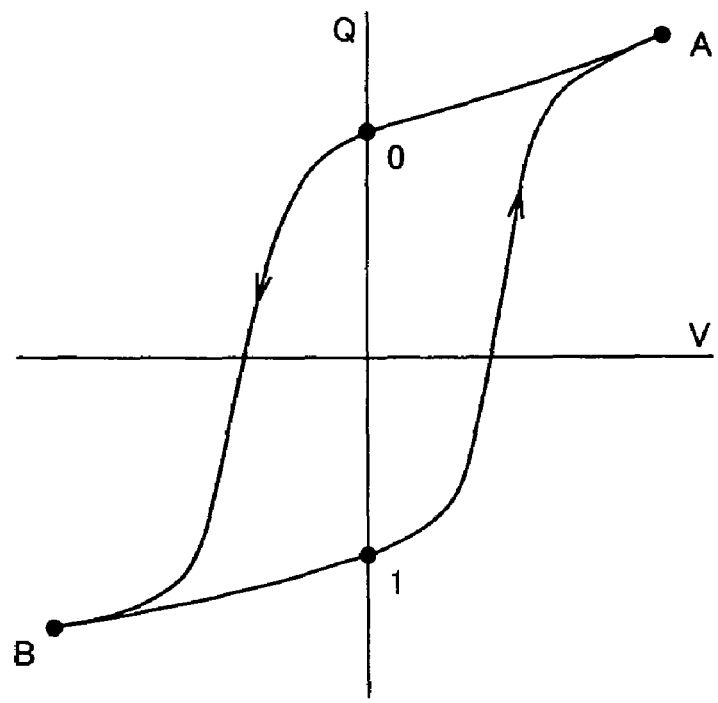
FIG. 62 is a hysteresis diagram for illustrating operations of the conventional simple matrix ferroelectric memory.
Figure 63:
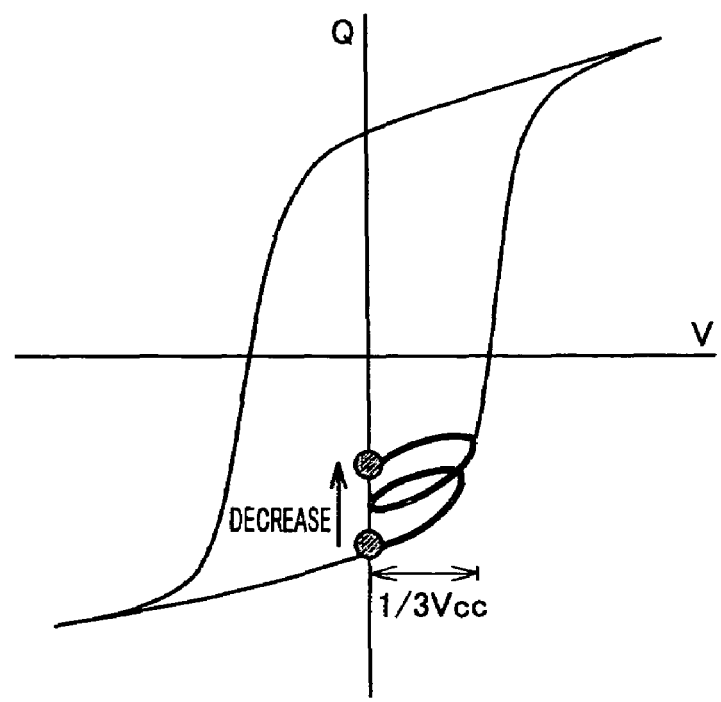
FIG. 63 is a hysteresis diagram for illustrating disturbance in the conventional simple matrix ferroelectric memory.
Figure 64:
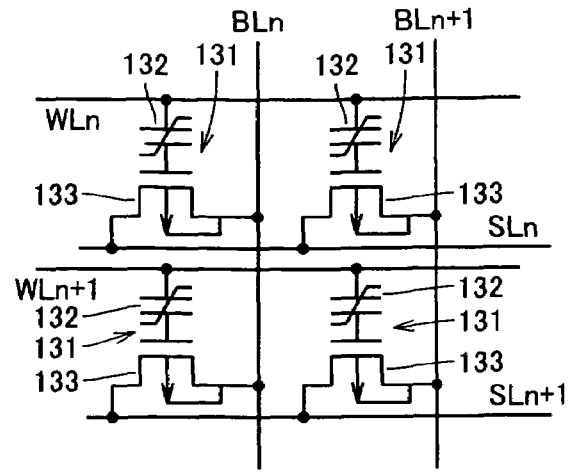
FIG. 64 is an equivalent circuit diagram showing a memory cell of a conventional one-transistor ferroelectric memory.
Figure 65:
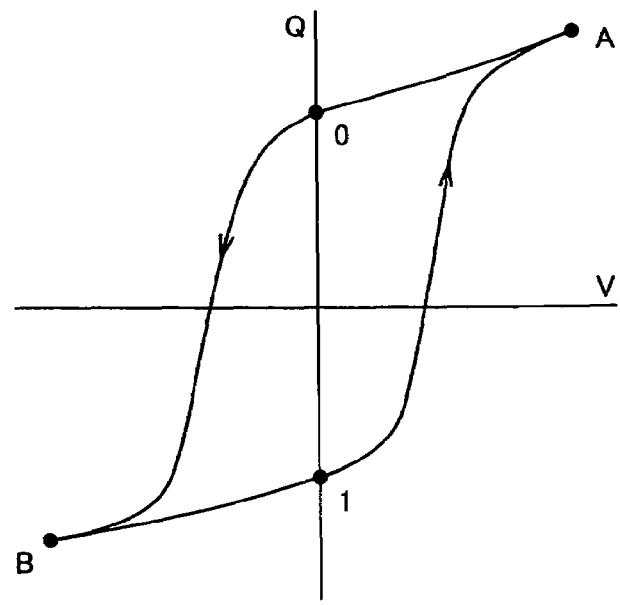
FIG. 65 is a hysteresis diagram for illustrating operations of the conventional one-transistor ferroelectric memory.
Figure 66:
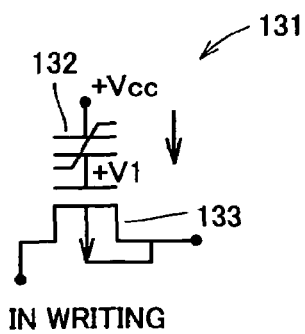
FIG. 66 is an equivalent circuit diagram for illustrating a voltage application state in writing of the conventional one-transistor ferroelectric memory shown in FIG. 64.
Figure 67:
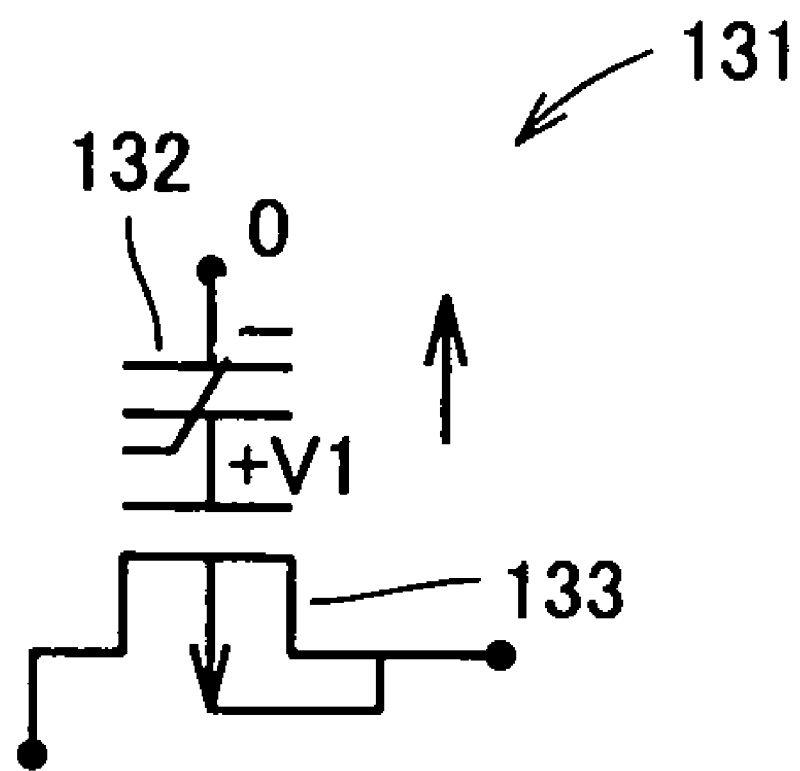
FIG. 67 is an equivalent circuit diagram for illustrating a voltage application state in a standby state of the conventional one-transistor ferroelectric memory shown in FIG. 64.

The memory cell array 1 includes a plurality of simple matrix memory cells each consisting of only a ferroelectric capacitor (not shown). In other words, the simple matrix memory cell according to the first embodiment is formed by a ferroelectric capacitor (not shown) consisting of a word line WL and a bit line BL formed to extend in directions intersecting with each other and a ferroelectric film (not shown) arranged between the word line WL and the bit line BL, similarly to the conventional simple matrix memory cell 121 shown in FIG. 61. This ferroelectric capacitor is an example of the "first storage means" in the present invention. The word line WL and the bit line BL of the memory cell array 1 are connected to the row decoder 2 and the column decoder 3 respectively. The ⅓Vcc·⅔Vcc generation circuit 10 is connected to the row and column decoders 2 and 3. Thus, the ferroelectric memory can apply voltages ⅓Vcc and ⅔Vcc to a non-selected word line WL (hereinafter also referred to as "non-selected WL") and a non-selected bit line BL (hereinafter also referred to as "non-selected BL"). The row and column decoders 2 and 3 are formed to be capable of applying Vcc (a power supply voltage or a voltage generated on the basis of the power supply voltage) and a voltage 0 V to a selected word line WL (hereinafter also referred to as "selected WL") and a selected bit line BL (hereinafter also referred to as "selected BL").

Figure 2:
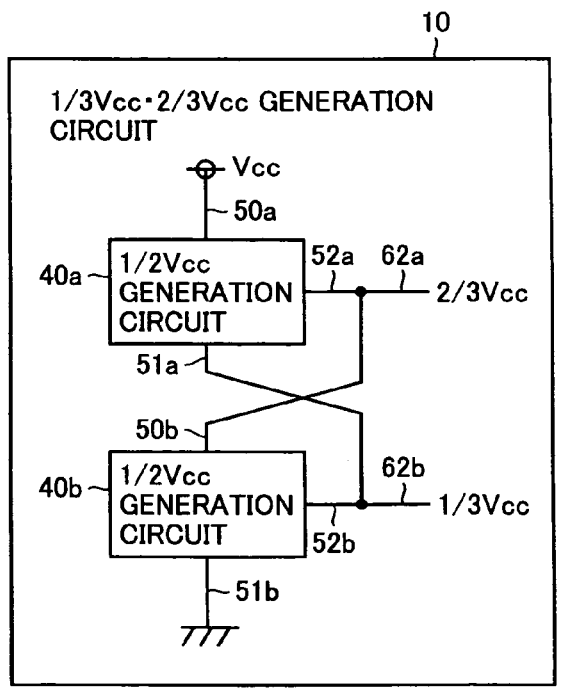
FIG. 2 is a circuit diagram showing the internal structure of a ⅓Vcc·⅔Vcc generation circuit of the ferroelectric memory according to the first embodiment shown in FIG. 1.

As shown in FIG. 2, the ⅓Vcc·⅔Vcc generation circuit 10 is formed by combining two ½ Vcc generation circuits 40a and 40b with each other. Each of the ½Vcc generation circuits 40a and 40b has two voltage input terminals 50a and 51a or 50b and 51b and a voltage output terminal 52a or 52b. Vcc is applied to the voltage input terminal 50a of the first ½Vcc generation circuit 40a, while the voltage input terminal 51a thereof is connected to the voltage output terminal 52b of the second ½Vcc generation circuit 40b. The voltage output terminal 52a of the first ½Vcc generation circuit 40a is connected to the voltage input terminal 50b of the second ½Vcc generation circuit 40b. The voltage 0 V is applied to the voltage input terminal 51b of the second ½Vcc generation circuit 40b.

According to this structure, an intermediate voltage ⅔Vcc between the voltages Vcc and ⅓Vcc is obtained from a first voltage output terminal 62a (the voltage output terminal 52a of the first ½Vcc generation circuit 40a) of the ⅓Vcc·⅔Vcc generation circuit 10. An intermediate voltage ⅓Vcc between the voltages ⅔Vcc and 0 V is obtained from a second voltage output terminal 62b (the voltage output terminal 52b of the second ½Vcc generation circuit 40b).

Figure 3:
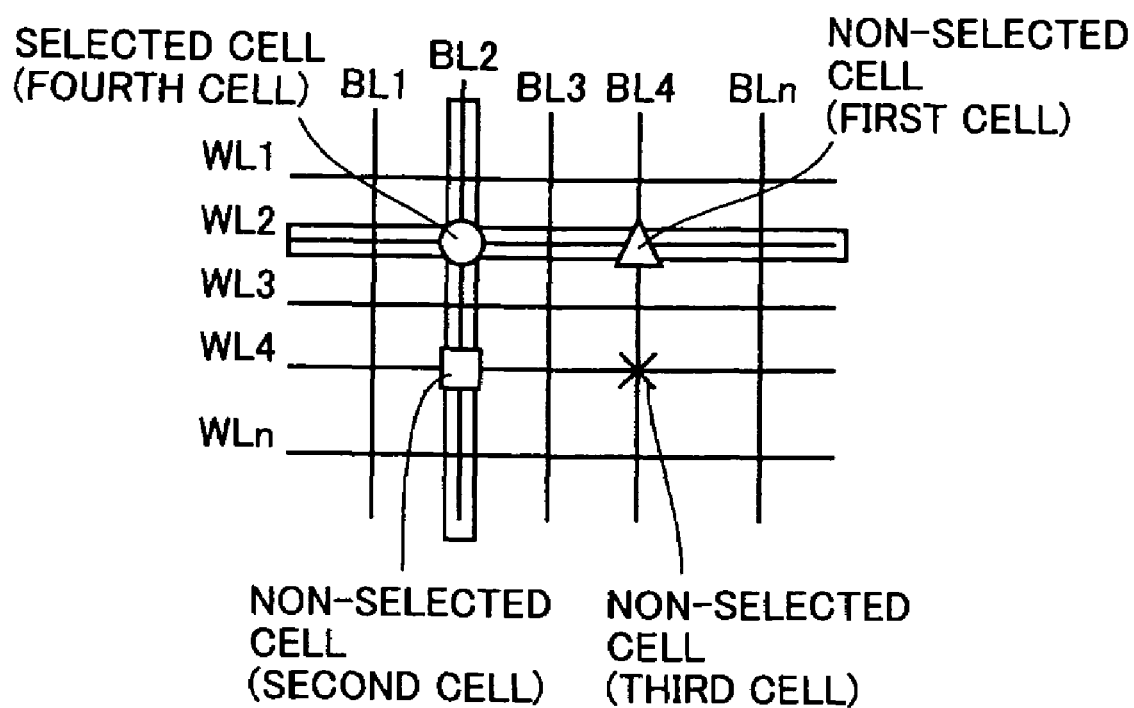
FIG. 3 is a schematic diagram for illustrating a selected cell and non-selected cells of a memory cell array according to the first embodiment.

A read operation and a rewrite operation of the simple matrix ferroelectric memory according to the first embodiment are now described with reference to FIGS. 3 to 6. These operations are described on the assumption that a fourth cell positioned on the intersection between a word line WL2 and a bit line BL2 shown in FIG. 3 is selected.

Figure 4:
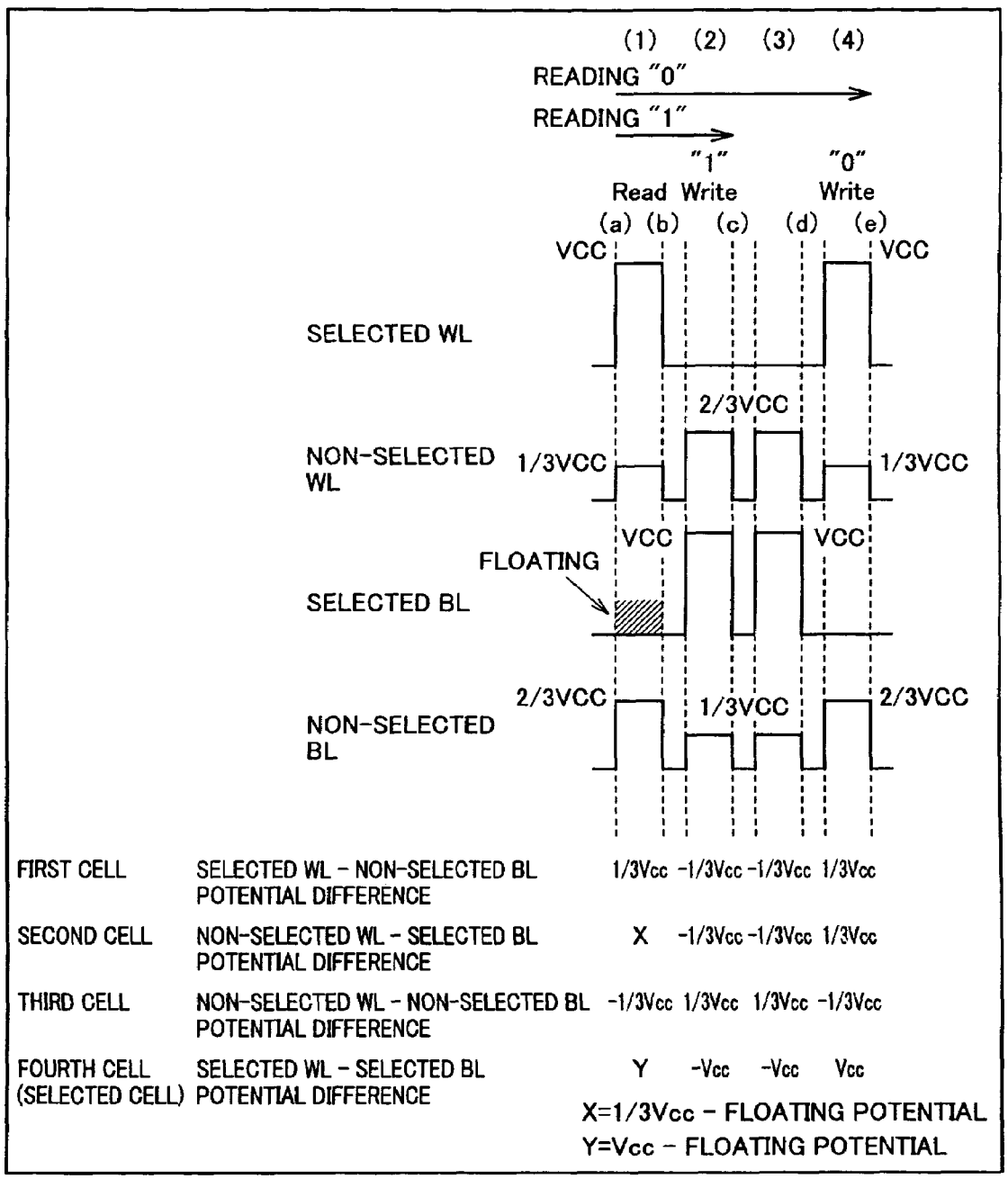
FIG. 4 is a voltage waveform diagram for illustrating a read operation and a rewrite operation of the simple matrix ferroelectric memory according to the first embodiment of the present invention.

FIG. 4 shows the waveforms of voltages applied to the word lines WL and the bit lines BL. It is assumed that operating times in periods (1), (2), (3) and (4) shown in FIG. 4 are identically T seconds. The simple matrix ferroelectric memory may perform the operations in the periods (1) to (4) continuously or independently of each other. The operations in the periods (1) to (4) are now described. In a standby state, the simple matrix ferroelectric memory sets the word lines WL and the bit lines BL to 0 V.

(1) Read Operation

The simple matrix ferroelectric memory performs the read operation in the period (1) shown in FIG. 4. From the standby state, the simple matrix ferroelectric memory brings the selected BL into a floating state. At the same timing, the simple matrix ferroelectric memory sets the selected WL, the non-selected WL and the non-selected BL to the voltages Vcc, ⅓Vcc and ⅔Vcc respectively. In this state, the simple matrix ferroelectric memory senses the voltage of the selected BL thereby determining data "0" or "1". The simple matrix ferroelectric memory determines the data "0" or "1" by comparing the potential of the selected BL with a separately generated reference potential and amplifying the same by the read amplifier 8 (see FIG. 1) formed by a voltage sense amplifier. In the read operation of the period (1), the simple matrix ferroelectric memory applies the following potential differences to first to third cells and the fourth cell (see FIG. 2) respectively for T seconds:

In the read operation of the period (1), the simple matrix ferroelectric memory applies a potential difference ⅓Vcc to the first cell, i.e., a non-selected cell positioned on the intersection between the selected WL and the non-selected BL shown in FIG. 2, for T seconds. The simple matrix ferroelectric memory applies the difference between the voltage ⅓Vcc and the potential (floating potential) of the selected BL to the second cell, i.e., a non-selected cell positioned on the intersection between the non-selected WL and the selected BL, for T seconds. The simple matrix ferroelectric memory applies a potential difference −⅓Vcc to the third cell, i.e., a non-selected cell positioned on the intersection between the non-selected WL and the non-selected BL, for T seconds. The simple matrix ferroelectric memory applies the difference between Vcc and the potential (floating potential) of the selected BL to the fourth cell, i.e., the selected cell positioned on the intersection between the selected WL and the selected BL, for T seconds. When the non-selected first to third cells hold subsequent data, polarization states are deteriorated and improved. The polarization states are deteriorated when the quantities of charges stored in the ferroelectric capacitors are decreased, and improved when the decreased quantities of the charges are increased.

In the non-selected first cell, the polarization state is deteriorated when holding data "1", and improved when holding data "0". In the non-selected second cell, the polarization state is deteriorated when holding data "1", and improved when holding data "0". In the non-selected third cell, the polarization state is improved when holding data "1", and deteriorated when holding data "0". In the selected fourth cell, the polarization state is deteriorated when holding data "1", while the simple ferroelectric memory rewrites data "0" when the fourth cell holds the data "0".

(2) Rewrite Operation for "1"

After the aforementioned read operation in the period (1), the simple matrix ferroelectric memory temporarily returns to the standby state. Thereafter the simple matrix ferroelectric memory sets the selected WL, the non-selected WL, the selected BL and the non-selected BL to the voltages 0 V, ⅔Vcc, Vcc and ⅓Vcc respectively. In this case, the simple matrix ferroelectric memory applies the following potential differences to the first to fourth cells in the operating period (2) of T seconds: The simple matrix ferroelectric memory applies the potential differences −⅓Vcc, −⅓Vcc and ⅓Vcc to the non-selected first, second and third cells respectively for T seconds. Thus, the polarization state is improved in the non-selected first cell when holding data "1", and deteriorated when holding data "0". In the non-selected second cell, the polarization state is improved when holding data "1", and deteriorated when holding data "0". In the non-selected third cell, the polarization state is deteriorated when holding data "1", and improved when holding data "0".

Figure 5:
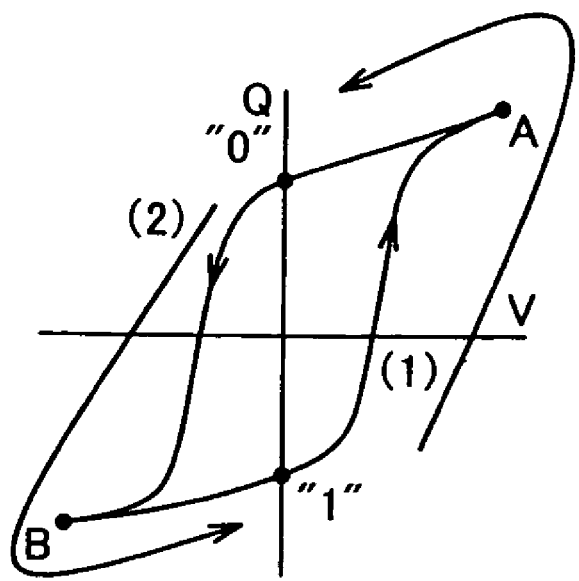
FIG. 5 is a hysteresis diagram showing change of a polarization state in a case where the selected cell holds data "1" in the read operation and the rewrite operation of the ferroelectric memory according to the first embodiment of the present invention.

The simple matrix ferroelectric memory applies a potential difference −Vcc to the selected fourth cell for T seconds. When the simple matrix ferroelectric memory reads data "1" in the period (1) for the read operation, therefore, the data "1" is completely rewritten in the operation in the period (2). FIG. 5 shows change of the polarization from the operation in the period (1) to the operation in the period (2) with reference to the selected fourth cell holding data "1". When reading the data "1" from the selected cell, the simple matrix ferroelectric memory terminates the read operation and the rewrite operation at this point of time.

(3) Compensatory Operation for Rewriting "0"

After the aforementioned operation for rewriting the data "1" in the period (2), the simple matrix ferroelectric memory temporarily returns to the standby state. Thereafter the simple matrix ferroelectric memory sets the selected WL, the non-selected WL, the selected BL and the non-selected BL to the voltages 0 V, ⅔Vcc, Vcc and ⅓Vcc respectively. In this case, the simple matrix ferroelectric memory applies the following potential differences to the first to fourth cells for T seconds: The simple matrix ferroelectric memory applies the potential differences −⅓Vcc, −⅓Vcc and ⅓Vcc to the non-selected first, second and third cells respectively for T seconds. The simple matrix ferroelectric memory further applies the potential difference −Vcc to the selected fourth cell. Thus, the polarization state is improved in the non-selected first cell when holding data "1", and deteriorated when holding data "0". In the non-selected second cell, the polarization state is improved when holding data "1", and deteriorated when holding data "0". In the non-selected third cell, the polarization state is deteriorated when holding data "1", and improved when holding data "0". While the selected fourth cell holds data "1" in the aforementioned period (2), the simple matrix ferroelectric memory rewrite the data "1" therein.

(4) Operation of Rewriting "0"

After the aforementioned compensatory operation for rewriting "0" in the period (3), the simple matrix ferroelectric memory temporarily returns to the standby state. Thereafter the simple matrix ferroelectric memory sets the selected WL, the non-selected WL, the selected BL and the non-selected BL to the voltages Vcc, ⅓Vcc, 0 V and ⅔Vcc respectively. Thus, the simple matrix ferroelectric memory applies the potential differences ⅓Vcc, ⅓Vcc and −⅓Vcc to the non-selected first, second and third cells respectively for T seconds. The simple matrix ferroelectric memory further applies the potential difference Vcc to the selected fourth cell. Thus, the polarization state is deteriorated in the non-selected first cell when holding data "1", and improved when holding data "0". In the non-selected second cell, the polarization state is deteriorated when holding data "1", and improved when holding data "0". In the non-selected third cell, the polarization state is improved when holding data "1", and deteriorated when holding data "0". The simple matrix ferroelectric memory applies the potential difference Vcc to and rewrites the data "0" in the selected fourth cell.

Figure 6:
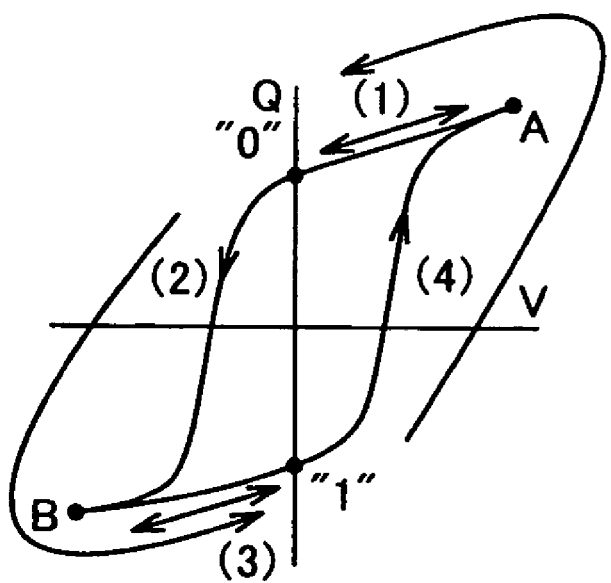
FIG. 6 is a hysteresis diagram showing change of a polarization state in a case where the selected cell holds data "0" in the read operation and the rewrite operation of the ferroelectric memory according to the first embodiment of the present invention.

FIG. 6 shows change of the polarization state in the selected fourth cell holding data "0" caused in the operations of the aforementioned periods (1) to (4). The simple matrix ferroelectric memory completes the series of read and rewrite operations through the operation in the period (4). Table 2 shows the situations of deterioration and improvement of the polarization states in the aforementioned operations in the periods (1) to (4).

TABLE 2

|  | (1) | | (2) | | (3) | | (4) | |
| --- | --- | --- | --- | --- | --- | --- | --- | --- |
|  | "0" | "1" | "0" | "1" | "0" | "1" | "0" | "1" |
| Selected WL - Non-Selected BL (First Cell) | o | x | x | o | x | o | o | x |
| Non-Selected WL - Selected BL (Second Cell) | o | x | x | o | x | o | o | x |
| Non-Selected WL - Non-Selected BL (Third Cell) | x | o | o | x | o | x | x | o | x: polarization state deteriorated
o: polarization state improved

According to the first embodiment, the simple matrix ferroelectric memory advances to the operation in the period (2) when reading data "1" while advancing to the operation in the period (4) when reading data "0" in the read and rewrite operations. Thereafter the simple matrix ferroelectric memory shifts to subsequent read and rewrite operations. According to the first embodiment, the numbers of times of deterioration and improvement of the polarization states are equal to each other in both cases of reading the data "1" and "0". Also when the simple matrix ferroelectric memory repeats the read and rewrite operations, therefore, none of the non-selected cells stores deterioration of the polarization state, whereby finally held data is not destroyed.

The simple matrix ferroelectric memory according to the first embodiment can effectively inhibit the non-selected cells from data destruction by alternately applying the potential difference ±⅓Vcc to the non-selected first and cells and alternately applying the potential difference between the voltage ⅓Vcc and the potential of the selected bit line BL and the potential differences ⅓Vcc and −⅓Vcc to the non-selected second cell for canceling deterioration of the polarization states of the non-selected cells resulting from disturbance throughout the read operation and the rewrite operation.

The simple matrix ferroelectric memory according to the first embodiment sets Vcc so that the voltage difference ⅓Vcc applied to the non-selected cells is not more than a coercive voltage (polarization-inverted voltage) conceivable from hysteresis characteristics of the memory cells forming the ferroelectric memories. Thus, the quantities of polarization states finally caused in the non-selected cells can be reduced. This also applies to second to eighth embodiments described later.

Second Embodiment

Figure 7:
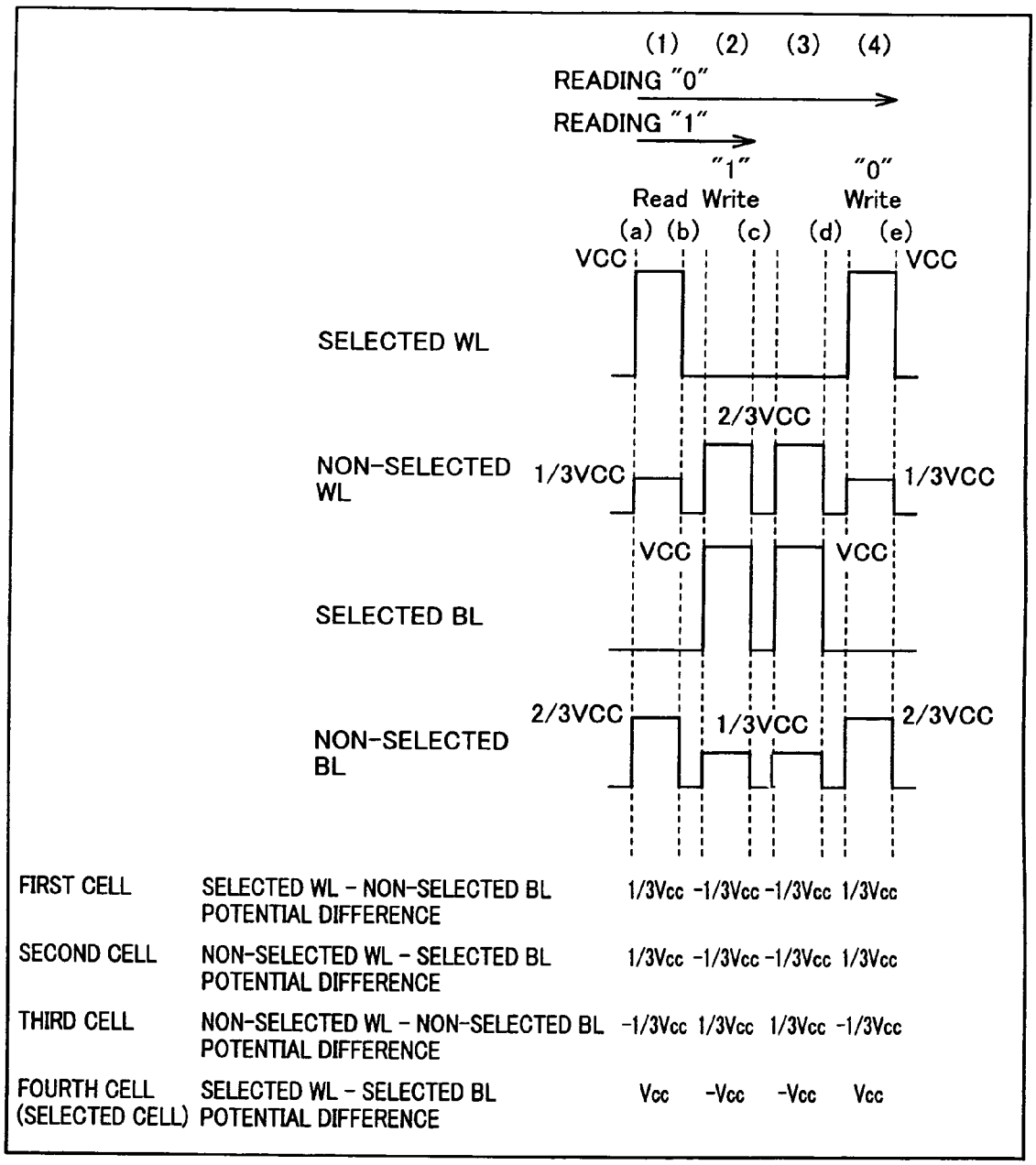
FIG. 7 is a voltage waveform diagram for illustrating a read operation and a rewrite operation of a simple matrix ferroelectric memory according to a second embodiment of the present invention.

Referring to FIG. 7, a simple matrix ferroelectric memory according to a second embodiment of the present invention performs operations in periods (2) to (4) similarly to the simple matrix ferroelectric memory according to the aforementioned first embodiment, and only an operation of the former in a period (1) is different from that of the latter. The operations of the simple matrix ferroelectric memory according to the second embodiment are now described. It is assumed that operating times in the periods (1), (2), (3) and (4) are identically T seconds in the second embodiment, similarly to the aforementioned first embodiment. The simple matrix ferroelectric memory may carry out the operations in the periods (1) to (4) continuously or independently of each other. In a standby state, the simple matrix ferroelectric memory sets word lines WL and bit lines BL to 0 V.

(1) Read Operation

In the period (1) for the read operation, the simple matrix ferroelectric memory according to the second embodiment sets a selected WL, a non-selected WL, a selected BL and a non-selected BL to voltages Vcc, ⅓Vcc, 0 V and ⅔Vcc respectively from the standby state. From this state, the simple matrix ferroelectric memory according to the second embodiment senses a current flowing through the selected WL thereby determining data "0" or "1". In other words, the simple matrix ferroelectric memory according to the second embodiment determines the data by sensing the current flowing through the selected WL, while the ferroelectric memory according to the first embodiment determines the data by sensing the voltage of the selected BL. More specifically, the simple matrix ferroelectric memory determines the data "0" or "1" by comparing the current of the selected WL with a separately generated reference current and amplifying the same. In this case, the simple matrix ferroelectric memory employs a read amplifier (not shown) consisting of a current sense amplifier in place of the read amplifier 8 (see FIG. 1) consisting of a voltage sense amplifier employed in the first embodiment. The value of the current flowing through the selected WL transiently changes. Therefore, the simple matrix ferroelectric memory preferably compares the value of the current flowing through the selected WL with the value of the reference current when the same reaches a peak and amplifies the same thereby determining the data "0" or "1".

In the period (1) for the read operation, the simple matrix ferroelectric memory applies voltage differences ⅓Vcc, ⅓Vcc and −⅓Vcc to non-selected first, second and third cells respectively for T seconds. The simple matrix ferroelectric memory further applies a potential difference Vcc to a selected fourth cell for T seconds. Thus, the polarization state is deteriorated n the non-selected first cell when holding data "1", and improved when holding data "0". In the non-selected second cell, the polarization state is deteriorated when holding data "1", and improved when holding data "0". In the non-selected third cell, the polarization state is improved when holding data "1", and deteriorated when holding data "0". In the selected fourth cell, the polarization state is deteriorated when holding data "1", while the simple matrix ferroelectric memory rewrites data "0" when the fourth cell holds the data "0".

The simple matrix ferroelectric memory according to the second embodiment fixes the potential of the selected BL to 0 V in the period (1) for the read operation dissimilarly to the aforementioned first embodiment, thereby reliably applying the potential difference ⅓Vcc to the second cell located on the intersection between the non-selected WL and the selected BL. In the first embodiment, the potential difference between the voltage ⅓Vcc and the potential of the selected BL applied to the second cell located on the intersection between the non-selected WL and the selected BL can take any value from around 0 V (or not more than 0 V) to ⅓Vcc due to change of the potential of the selected BL. In the first embodiment, therefore, there is a possibility that the simple matrix ferroelectric memory cannot reliably deteriorate or improve the polarization state in the second cell located on the intersection between the non-selected WL and the selected BL when the same holds data "1" or "0".

On the other hand, the simple matrix ferroelectric memory according to the second embodiment, fixing the potential of the selected BL to 0 V, can reliably deteriorate or improve the polarization state in the second cell connected to the selected BL when the same holds data "1" or "0". Thus, the simple matrix ferroelectric memory according to the second embodiment can reliably inhibit the non-selected second cell connected to the selected BL from storing deterioration of the polarization state, thereby inhibiting the second cell from destruction of finally held data.

The simple matrix ferroelectric memory according to the second embodiment carries out the operations in the periods (2) to (4) similarly to the simple matrix ferroelectric memory according to the aforementioned first embodiment.

Third Embodiment

Figure 8:
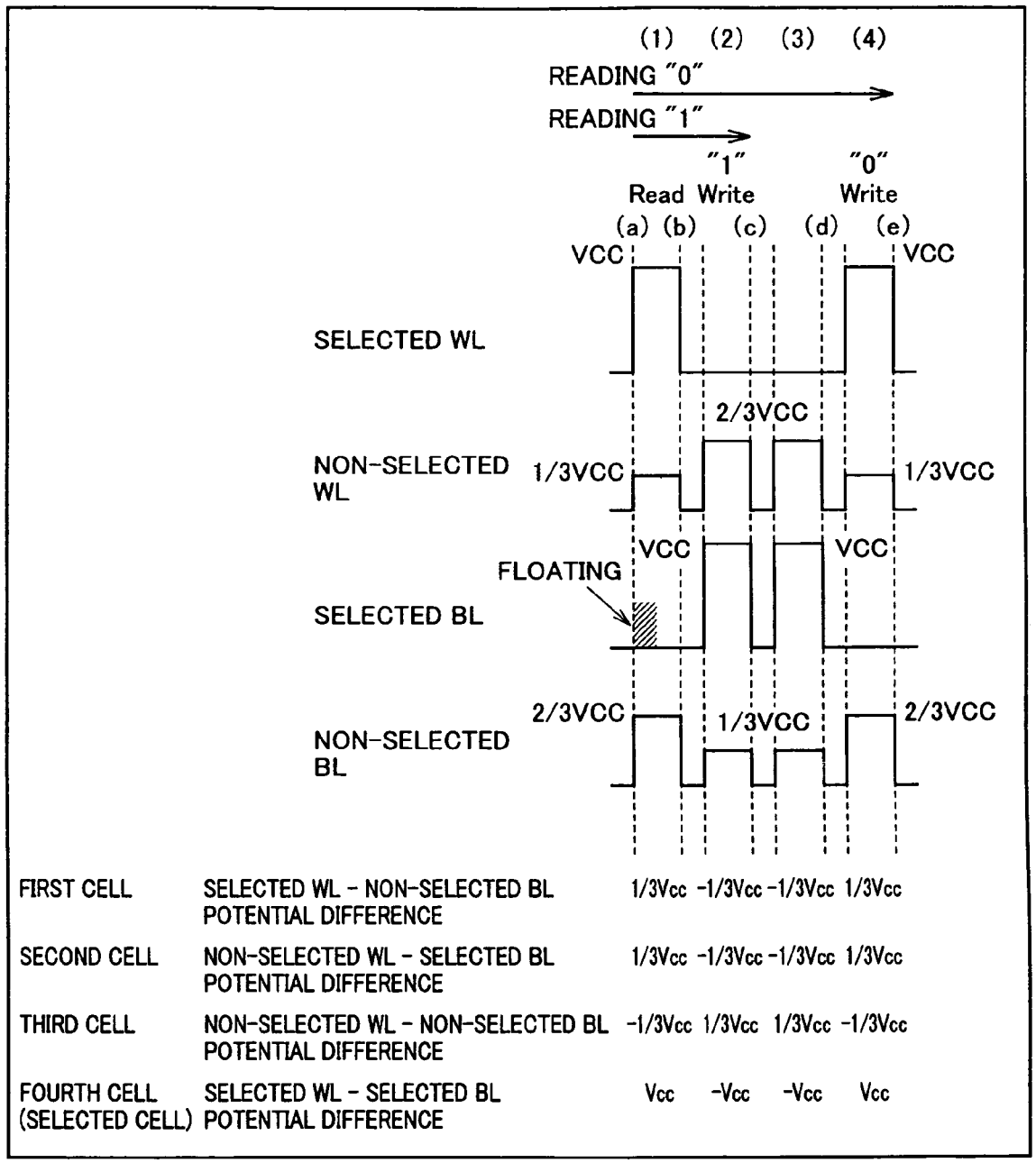
FIG. 8 is a voltage waveform diagram for illustrating a read operation and a rewrite operation of a simple matrix ferroelectric memory according to a third embodiment of the present invention.

Referring to FIG. 8, a simple matrix ferroelectric memory according to a third embodiment of the present invention performs operations in periods (2) to (4) similarly to the simple matrix ferroelectric memory according to the aforementioned first embodiment, and only an operation of the former in a period (1) is different from that of the latter. The operations of the simple matrix ferroelectric memory according to the third embodiment are now described. Also in the third embodiment, operating times in the periods (1), (2), (3) and (4) are identically T seconds, similarly to the aforementioned first embodiment. The simple matrix ferroelectric memory may carry out the operations in the periods (1) to (4) continuously or independently of each other. In a standby state, the simple matrix ferroelectric memory sets word lines WL and bit lines BL to 0 V.

(1) Read Operation

In the period (1) for the read operation, the simple matrix ferroelectric memory according to the third embodiment brings a selected BL into a floating state from the standby state. At the same timing, the simple matrix ferroelectric memory sets a selected WL, a non-selected WL and a non-selected BL to voltages Vcc, ⅓Vcc and ⅔Vcc respectively. In this state, the simple matrix ferroelectric memory senses the voltage of the selected BL thereby determining data "0" or "1". The simple matrix ferroelectric memory determines the data "0" or "1" by comparing the potential of the selected BL with a separately generated reference potential and amplifying the same with a read amplifier 8 (see FIG. 1) consisting of a voltage sense amplifier. Further, the simple matrix ferroelectric memory according to the third embodiment returns the selected BL to 0 V again after completely determining the data "0" or "1". It is assumed that the operating time in the period (1) is T seconds, and the selected BL remains in the floating state for t1 seconds.

In this case, the simple matrix ferroelectric memory applies a potential difference ⅓Vcc to a non-selected first cell for T seconds. The simple matrix ferroelectric memory further applies the potential difference between the voltage ⅓Vcc and the potential of the selected BL to a non-selected second cell located between the non-selected WL and the selected BL for t1 seconds, while applying the potential difference ⅓Vcc thereto for (T−t1) seconds. The simple matrix ferroelectric memory applies the potential difference −⅓Vcc to a non-selected third cell located on the intersection between the non-selected WL and the non-selected BL for T seconds. On the other hand, the simple matrix ferroelectric memory applies the potential difference between the voltage Vcc and the potential of the selected BL to a selected fourth cell for t1 seconds and thereafter applies the potential difference Vcc thereto for (T−t1) seconds.

It is assumed that the simple matrix ferroelectric memory sets the aforementioned time t1 sufficiently short so that change of the quantity of polarization resulting from the potential difference between the voltage ⅓Vcc and the potential of the selected BL applied for t1 seconds is sufficiently smaller than change of the quantity of polarization resulting from the potential difference ⅓Vcc applied for (T−t1) seconds and change of the quantity of polarization in the period (1) is substantially identical to change of the quantity of polarization caused in the subsequent periods (2) to (4) due to application of the potential difference ⅓Vcc for (T−t1) seconds in the non-selected second cell located on the intersection between the non-selected WL and the selected BL. Thus, the simple matrix ferroelectric memory can change polarization states in the period (1) for the read operation as follows:

In the non-selected first cell, the polarization state is deteriorated when holding data "1", and improved when holding data "0". In the non-selected second cell, the polarization state is deteriorated when holding data "1", and improved when holding data "0". In the non-selected third cell, the polarization state is deteriorated when holding data "1", and improved when holding data "1". In the selected fourth cell, the polarization state is deteriorated when holding data "1", and improved when holding data "0".

The simple matrix ferroelectric memory according to the third embodiment carries out the operations in the periods (2) to (4) similarly to the first embodiment.

The simple matrix ferroelectric memory according to the third embodiment senses the potential of the selected BL and thereafter sets the same to 0 V in the period (1) for the read operation as hereinabove described, whereby the second cell located on the intersection between the non-selected WL and the selected BL reaches the voltage ⅓Vcc in a period in the read operation in the period (1). Thus, the simple matrix ferroelectric memory according to the third embodiment can reliably deteriorate or improve the polarization state of the second cell connected to the selected BL when the same holds data "1" or "0" in the period (1) for the read operation.

Fourth Embodiment

A simple matrix ferroelectric memory according to a fourth embodiment of the present invention carries out a read operation similar to that of the simple matrix ferroelectric memory according to the aforementioned second embodiment carried out in the period (1) in periods (1) and (2). The operations of the simple matrix ferroelectric memory according to the fourth embodiment in the periods (1) and (2) are now described. The simple matrix ferroelectric memory according to the fourth embodiment applies voltages having waveforms identical to those in the second embodiment shown in FIG. 7. Further, the simple matrix ferroelectric memory according to the fourth embodiment carries out operations in periods (3) and (4) similarly to the simple matrix ferroelectric memory according to the aforementioned first embodiment. The operations of the simple matrix ferroelectric memory according to the fourth embodiment are now described.

(1) Operation of Holding Current Value of Selected WL

The simple matrix ferroelectric memory according to the fourth embodiment sets a selected WL, a non-selected WL, a selected BL and a non-selected BL to voltages Vcc, ⅓Vcc, 0 V and ⅔Vcc from a standby state. In this case, the simple matrix ferroelectric memory holds the current flowing through the selected WL in a current value holding circuit (not shown). The current flowing through the selected WL transiently changes and hence the simple matrix ferroelectric memory preferably holds the value of the current when reaching the peak. In the operation of holding the current value of the selected WL in the period (1), the simple matrix ferroelectric memory applies potential differences ⅓Vcc, ⅓Vcc and −⅓Vcc to non-selected first, second and third cells respectively for T seconds. The simple matrix ferroelectric memory further applies a potential difference Vcc to a selected fourth cell for T seconds.

Thus, the polarization state is deteriorated in the non-selected first cell connected to the selected WL when holding data "1", and improved when holding data "0". In the non-selected second cell connected to the selected BL, the polarization state is deteriorated when holding data "1", and improved when holding data "0". In the non-selected third cell connected to the non-selected WL and the non-selected BL, the polarization state is improved when holding data "1", and deteriorated when holding data non. The simple matrix ferroelectric memory writes data "0" in the selected fourth cell.

(2) Operations of Holding Current Value of Selected BL, Reading and Rewriting "1"

The simple matrix ferroelectric memory sets the selected WL, the non-selected WL, the selected BL and the non-selected BL to the voltages 0 V, ⅔Vcc, Vcc and ⅓Vcc respectively from the standby state. In this state, the simple matrix ferroelectric memory holds the value of the current flowing through the selected BL in the current value holding circuit (not shown). The current flowing through the selected BL transiently changes and hence the simple matrix ferroelectric memory preferably holds the value of the current when reaching the peak. The simple matrix ferroelectric memory compares the current value of the selected BL held by the operation in the period (2) with the current value of the selected WL held by the operation in the aforementioned period (1) thereby determining data "0" or "1". In this case, the simple matrix ferroelectric memory employs a read amplifier (not shown) consisting of a current sense amplifier in place of the read amplifier 8 (see FIG. 1) consisting of a voltage sense amplifier employed in the first embodiment.

When the selected fourth cell holds data "1", the polarization state is inverted in the operations in the periods (1) and (2), and hence the same current flows to the selected WL and the selected BL in the operations in the periods (1) and (2). When the selected cell holds data "0", the polarization state is inverted only in the operation in the period (2) and hence currents having different values flow to the selected WL and the selected BL respectively in the operations in the periods (1) and (2). Therefore, the simple matrix ferroelectric memory determines the data as "1" when the same current flows to the selected WL and the selected BL in the operations in the periods (1) and (2) respectively while determining the data as "0" when currents of different values flow to the selected WL and the selected BL in the operations in the periods (1) and (2) respectively.

In the operation in the period (2), the simple matrix ferroelectric memory applies the potential differences −⅓Vcc, −⅓Vcc and ⅓Vcc to the non-selected first, second and third cells respectively for T seconds. The simple matrix ferroelectric memory further applies the potential difference −Vcc to the selected fourth cell. Thus, the polarization is improved in the non-selected first cell when holding data "1", and deteriorated when holding data "0". In the non-selected second cell, the polarization is improved when holding data "1", and deteriorated when holding data "0". In the non-selected third cell, the polarization state is deteriorated when holding data "1", and improved when holding data "0".

The simple matrix ferroelectric memory applies the potential difference −Vcc to the selected fourth cell for rewriting data "1" therein at this point of time when reading the data "1". When reading the data "1", the simple matrix ferroelectric memory completes the read and rewrite operations at this point of time.

The simple matrix ferroelectric memory according to the fourth embodiment carries out the operations in the periods (3) and (4) similarly to the simple matrix ferroelectric memory according to the aforementioned first embodiment.

The simple matrix ferroelectric memory according to the fourth embodiment, holding the current value in the current value holding circuit as hereinabove described, requires no reference cell or the like for generating a reference current to be compared with the current value of the selected WL, dissimilarly to the simple matrix ferroelectric memory according to the second embodiment.

Fifth Embodiment

Figure 9:
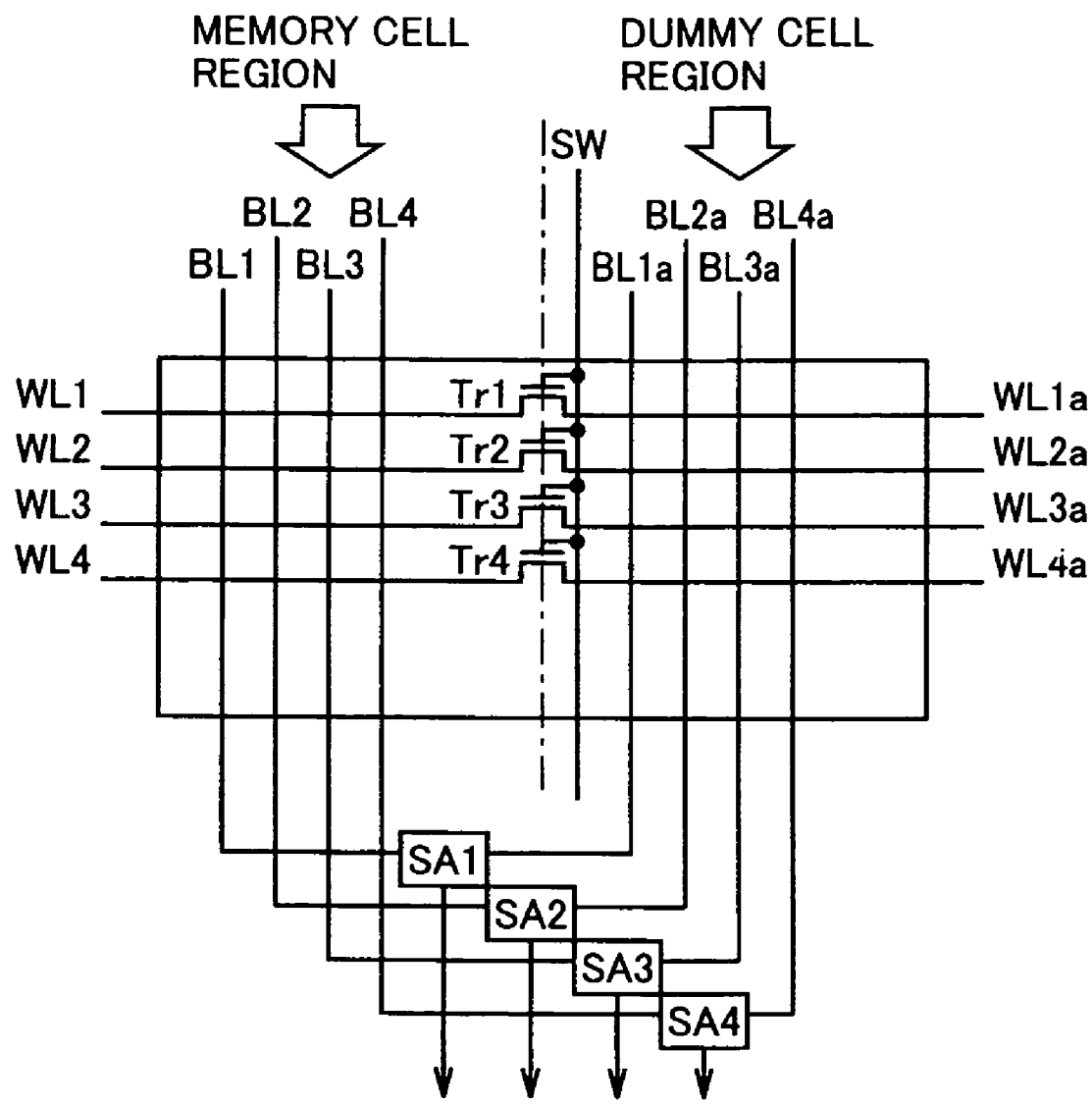
FIG. 9 is a schematic diagram showing the structure of a memory cell array region of a simple matrix ferroelectric memory according to a fifth embodiment of the present invention.

Referring to FIG. 9, a ferroelectric memory according to a fifth embodiment of the present invention employs a first half of a memory cell region as an ordinary memory cell region while employing the remaining half as a dummy cell region. Referring to FIG. 9, dummy cells located on intersections between word lines WLma and bit lines BLna correspond to memory cells located on intersections between word lines WLm and BLn respectively. The memory cells and the dummy cells consist of only ferroelectric capacitors (not shown). In this case, the ferroelectric capacitors forming the memory cells are examples of the "first storage means" in the present invention, and the ferroelectric capacitors forming the dummy cells are examples of the "second storage means" in the present invention.

In a write operation, the simple matrix ferroelectric memory brings transistors Trm into OFF states with a signal SW thereby dividing word lines into the word lines WLm and WLma from the center. The simple matrix ferroelectric memory writes reverse data in the memory cells and the dummy cells corresponding thereto respectively.

In a read operation, the simple matrix ferroelectric memory brings the transistors Trm into ON states with the signal SW, compares the potentials of a bit line BLn connected with a selected cell and a bit line BLna connected with a dummy cell corresponding thereto with each other and amplifies the same with a sense amplifier SAn. Thus, the simple matrix ferroelectric memory determines data "0" or "1".

Table 3 shows voltage arrangement in writing.

TABLE 3

| | Memory Cell | | | |
|---|---|---|---|---|
| | Selected WL | Non-Selected WL | Selected BL | Non-Selected BL |
| Writing "0" | Vcc | ⅓ Vcc | 0 | ⅔ Vcc |
| Writing "1" | 0 | ⅔ Vcc | Vcc | ⅓ Vcc |
| | Dummy Cell | | | |
| | Selected WLa | Non-Selected WLa | Selected BLa | Non-Selected BLa |
| Writing "1" | 0 | ⅔ Vcc | Vcc | ⅓ Vcc |
| Writing "0" | Vcc | ⅓ Vcc | 0 | ⅔ Vcc |

As shown in Table 3, the simple matrix ferroelectric memory write data "1" after writing data "0", in order to write the data "1". Further, the simple matrix ferroelectric writes data "0" after writing data "1", in order to write the data "0". Thus, the simple matrix ferroelectric memory previously writes reverse data thereby applying the potential difference ±⅓Vcc to non-selected cells, whereby disturbance can be suppressed. The transistors Trm are in OFF states in the write operation.

Figure 10:
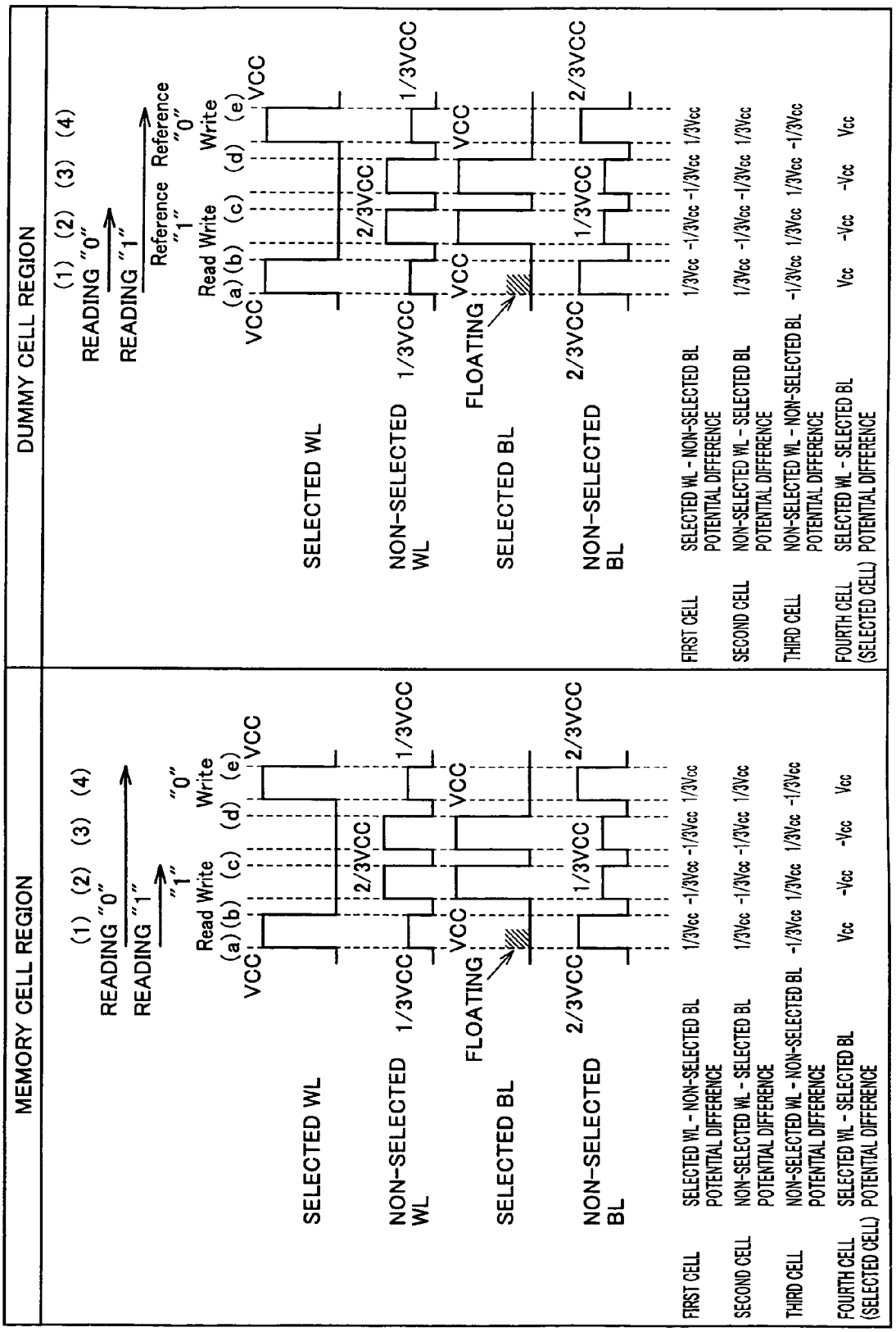
FIG. 10 is a voltage waveform diagram for illustrating a read operation and a rewrite operation of the simple matrix ferroelectric memory according to the fifth embodiment of the present invention.

FIG. 10 shows voltage waveforms in read and rewrite operations. The waveforms of the voltages applied to the memory cell region and the dummy cell region in the read and write operations shown in FIG. 10 are similar to those of the third embodiment shown in FIG. 8 respectively. In the read and rewrite operations of the simple matrix ferroelectric memory according to the fifth embodiment, the transistors Trm shown in FIG. 9 are in ON states in periods (1) and (2) shown in FIG. 10 and in OFF states in periods (3) and (4).

The simple matrix ferroelectric memory writing reverse data in the selected cell and a selected dummy cell must individually perform operations from the period (3) in the memory cell region and the dummy cell region. When the selected cell holds data non and reads data "0", the simple matrix ferroelectric memory carries out operations up to that in the period (4) and writes data "0" in the memory cell region while performing operations up to that in the period (2) and writing reference data "1" reverse to the data written in the memory cell in the dummy cell region. When the selected cell holds data "1" and reads data "1", the simple matrix ferroelectric memory carries out operations up to that in the period (2) and writes data "1" in the memory cell region while performing operations up to that in the period (4) and writing reference data "0" reverse to the data written in the memory cell in the dummy cell region.

The simple matrix ferroelectric memory, alternately applying the potential difference ±⅓Vcc also in the aforementioned read and rewrite operations, can effectively inhibit non-selected cells and non-selected dummy cells from disturbance. Thus, the simple matrix ferroelectric memory can correctly read data.

Figure 11:
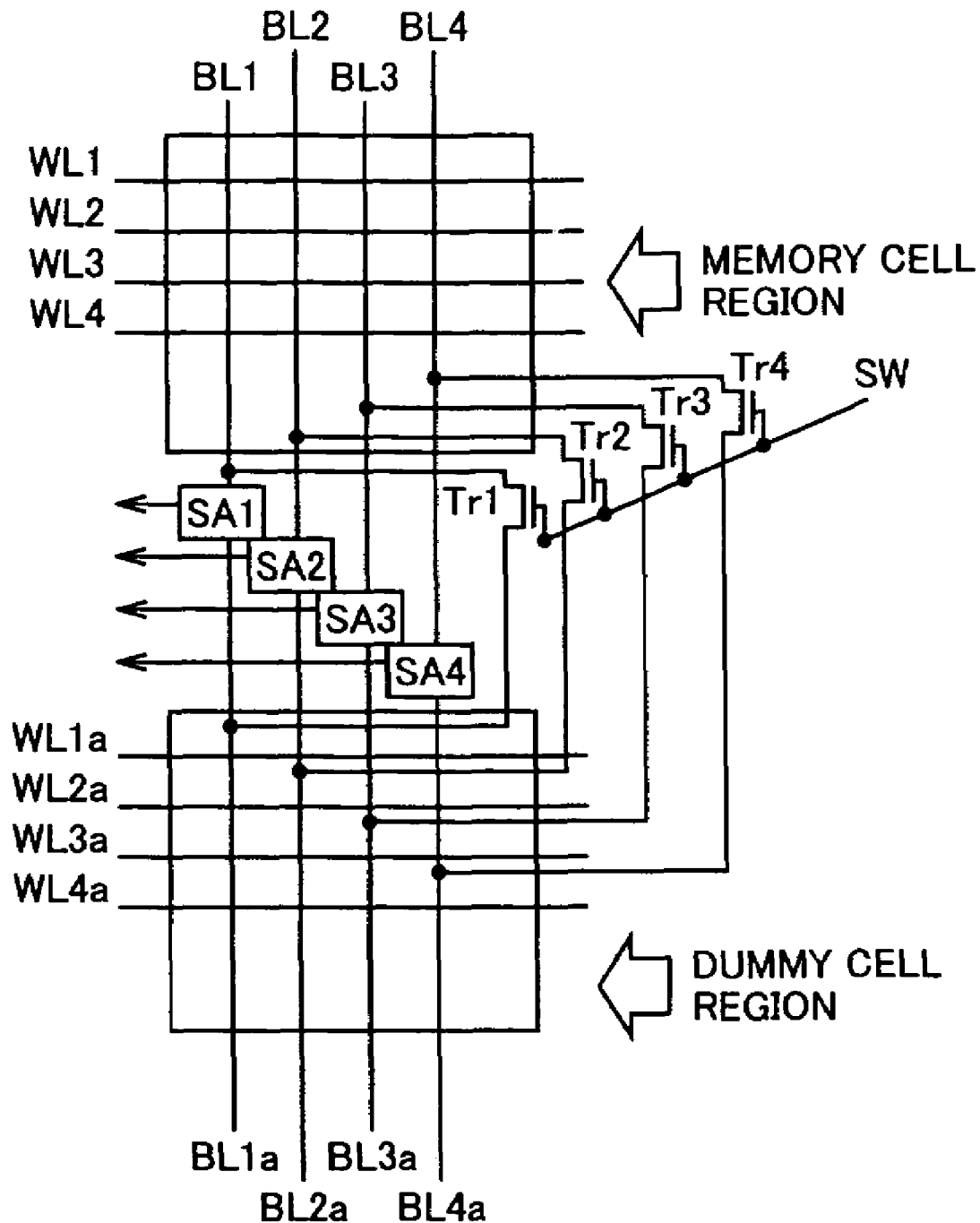
FIG. 11 is a schematic diagram showing a memory cell array region of a simple matrix ferroelectric memory according to a modification of the fifth embodiment of the present invention.

While the simple matrix ferroelectric memory according to the fifth embodiment divides the word lines WL from the center thereby dividing the memory cell region into the memory cell region and the dummy cell region, the present invention is not restricted to this but the simple matrix ferroelectric memory may alternatively divide bit lines BL from the center thereby dividing the memory cell region into the memory cell region and the dummy cell region as shown in FIG. 11, for example.

Sixth Embodiment

Figure 12:
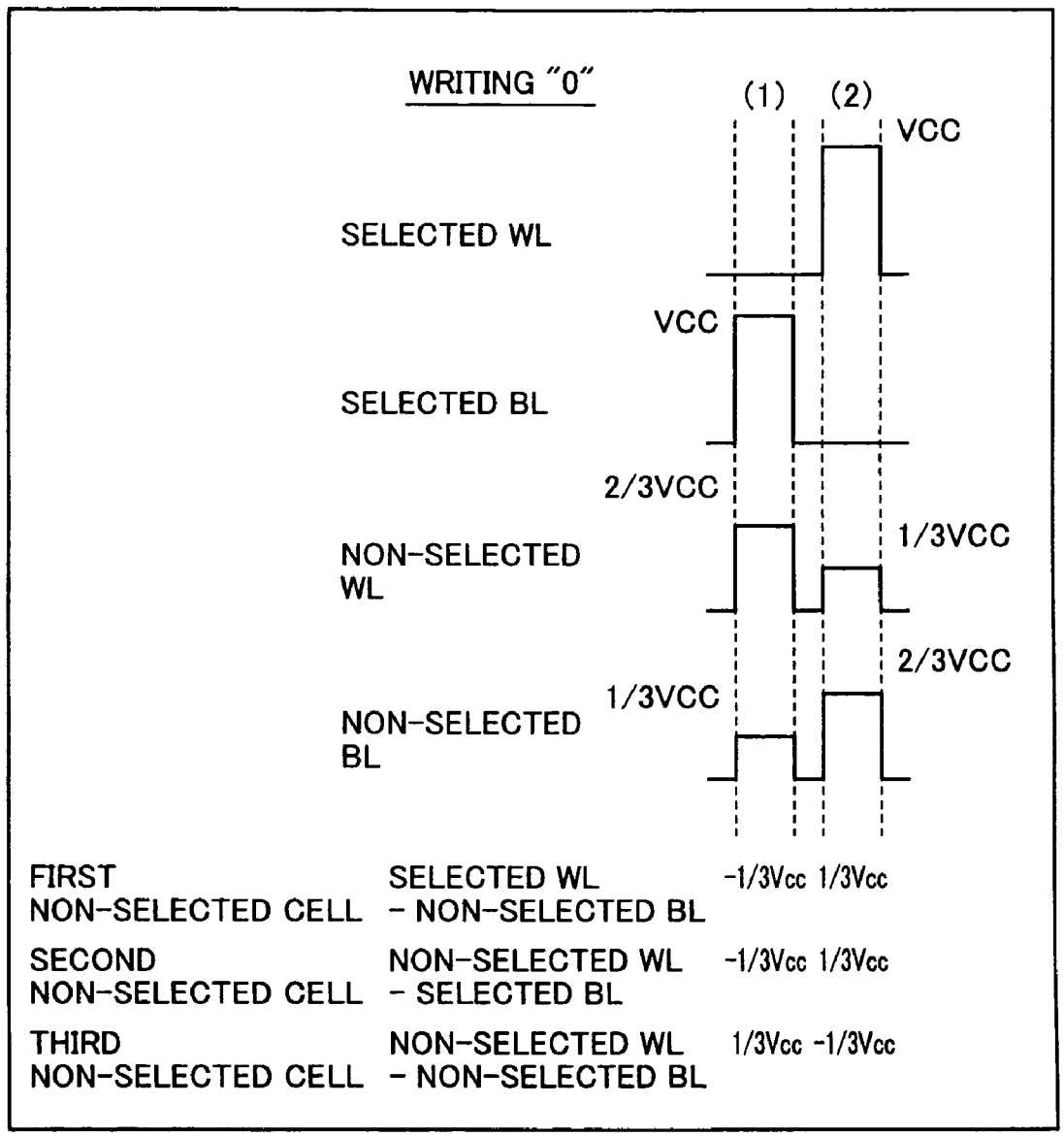
FIG. 12 is a voltage waveform diagram for illustrating an operation of writing data "0" according to a sixth embodiment of the present invention.
Figure 13:
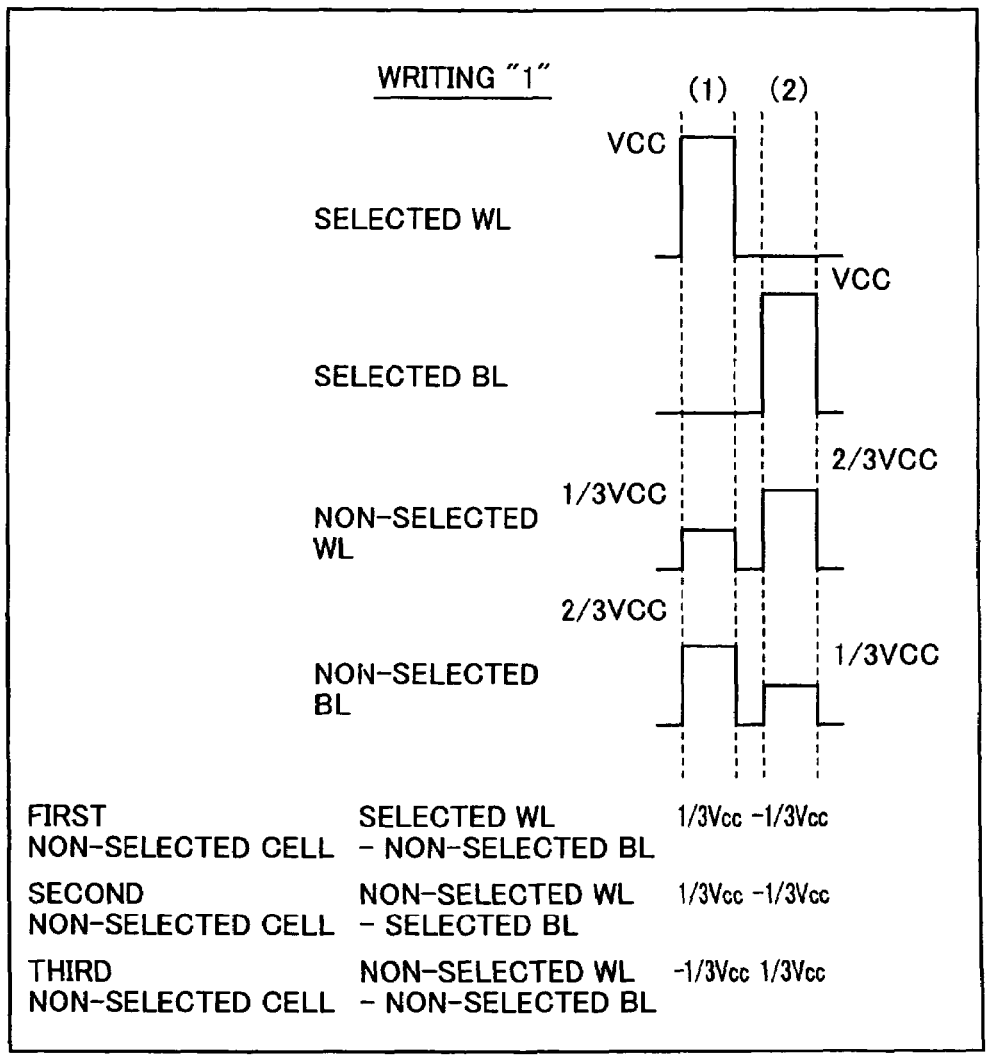
FIG. 13 is a voltage waveform diagram for illustrating an operation of writing data "1" according to the sixth embodiment of the present invention.
Figure 14:
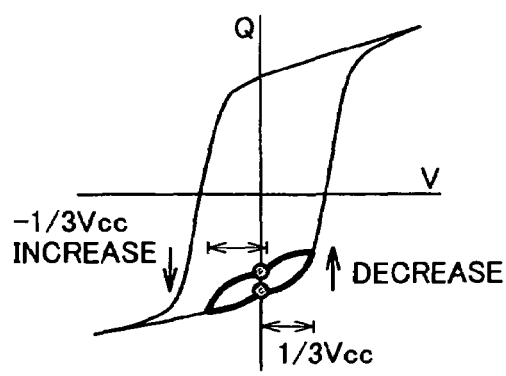
FIG. 14 is a hysteresis diagram for illustrating effects of the write operations according to the sixth embodiment shown in FIGS. 12 and 13.

Referring to FIGS. 12 to 14, a simple matrix ferroelectric memory according to a sixth embodiment of the present invention is described with reference to a write operation for inhibiting non-selected cells from disturbance when performing a write/rewrite operation similar to that in any of the aforementioned first to fourth embodiments.

Before writing arbitrary data in a selected cell by the ⅓Vcc method in the write operation, the simple matrix ferroelectric memory according to the sixth embodiment previously writes data reverse to the arbitrary data in the selected cell when performing the write/rewrite operation similar to that in any of the aforementioned first to fourth embodiments. The sixth embodiment is now described in detail.

In order to write data "0", the simple matrix ferroelectric memory writes data "1" reverse to the data "0" in a period (1), as shown in FIG. 12. In a subsequent period (2), the simple matrix ferroelectric memory writes the data "0". As to specific voltage arrangement, the simple matrix ferroelectric memory sets a selected WL and a selected BL to voltages 0 V and Vcc respectively in the period (1). The simple matrix ferroelectric memory further sets a non-selected WL and a non-selected BL to voltages ⅔Vcc and ⅓Vcc respectively. Thus, the simple matrix ferroelectric memory writes the reverse data "1" in the selected cell in the period (1). At this time, the simple matrix ferroelectric memory applies the potential difference −⅓Vcc to a first non-selected cell connected to the selected WL and the non-selected BL. The simple matrix ferroelectric memory also applies the potential difference −⅓Vcc to a second non-selected cell connected to the non-selected WL and the selected BL. The simple matrix ferroelectric memory applies the potential difference ⅓Vcc to a third non-selected cell connected to the non-selected WL and the non-selected BL.

After writing the reverse data "1" in the period (1), the simple matrix ferroelectric memory writes the data "0" to be originally written in the period (2). In the period (2), the simple matrix ferroelectric memory sets the selected WL and the selected BL to voltages Vcc and 0 V respectively. The simple matrix ferroelectric memory further sets the non-selected WL and the non-selected BL to the voltages ⅓Vcc and ⅔Vcc respectively. In this case, the simple matrix ferroelectric memory applies the potential difference ⅓Vcc to the first and second non-selected cells, while applying the potential difference −⅓Vcc to the third non-selected cell.

FIG. 13 shows voltage arrangement in a case of writing data "1". More specifically, the simple matrix ferroelectric memory writes reverse data "0" in the period (1). The simple matrix ferroelectric memory writes the data "1" to be originally written in the period (2). Therefore, the voltage arrangement in the period (1) shown in FIG. 13 is identical to that in the period (2) shown in FIG. 12, and the voltage arrangement in the period (2) shown in FIG. 13 is identical to that in the period (1) shown in FIG. 12. In the voltage arrangement shown in FIG. 13, the simple matrix ferroelectric memory applies the potential differences ⅓Vcc and −⅓Vcc to the first and second non-selected cells and the third non-selected cell respectively in the period (1). Further, the simple matrix ferroelectric memory applies the potential differences −⅓Vcc and ⅓Vcc to the first and second non-selected cells and the third non-selected cell respectively in the period (2).

In the write operation shown in FIGS. 12 and 13, the simple matrix ferroelectric memory applies the potential difference ±⅓Vcc to all non-selected cells (first to third non-selected cells) by the same number of times respectively. In other words, the number of times of deterioration of polarization states is equal to that of improvement of the polarization states in both of the cases of writing data "0" and "1" according to the sixth embodiment. Also when the simple matrix ferroelectric memory repeats the write operation, therefore, none of the non-selected cells stores deterioration of the polarization state, whereby finally held data is not destroyed.

In other word, the simple matrix ferroelectric memory according to the aforementioned sixth embodiment can effectively inhibit the non-selected cells from data destruction resulting from deterioration of polarization states by alternately applying the potential difference ±⅓Vcc to the non-selected cells (first to third non-selected cells) for canceling deterioration of the polarization states resulting from disturbance, as shown in FIG. 13.

When performing the write and rewrite operations similar to those according to any of the aforementioned first to fourth embodiments in addition to the write operation according to the sixth embodiment, the simple matrix ferroelectric memory can further effectively inhibit the non-selected cells from data destruction.

Seventh Embodiment

Figure 15:
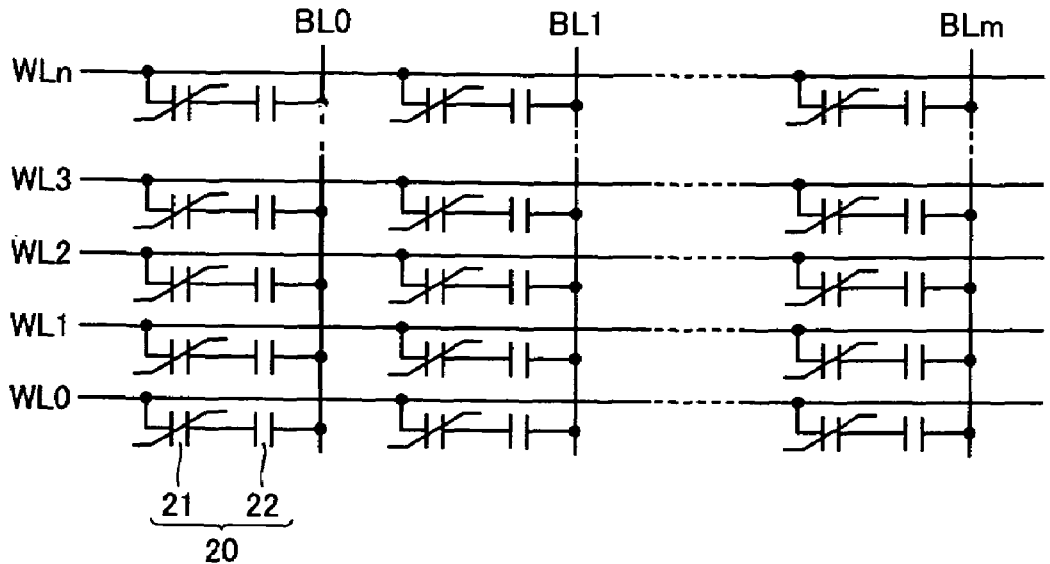
FIG. 15 is an equivalent circuit diagram showing the structure of a memory cell array to which an operating method for a ferroelectric memory according to a seventh embodiment of the present invention is applied.

Referring to FIG. 15, a simple matrix ferroelectric memory according to a seventh embodiment of the present invention is described with reference to an operating method for memory cells 20 constituted by ferroelectric capacitors 21 and load capacitances 22 consisting of ferroelectric or paraelectric capacitors.

Assuming that Va represents a potential difference applied to each memory cell 20, a potential difference Vf applied to the ferroelectric capacitor 21 in the memory cell 20 is expressed as follows:

$$Vf = CeVa/(Cf+Ce) \quad (3)$$

where Cf represents the capacitance of the ferroelectric capacitor 21, and Ce represents the load capacitance 22.

As expressed in the above equation (3), the simple matrix ferroelectric memory applies the potential difference divided by the ratio between the capacitance of the ferroelectric capacitor 21 and the load capacitance 22 to the ferroelectric capacitor 21 of each memory cell 20. Assuming that each memory cell is formed by only a ferroelectric capacitor identical to the ferroelectric capacitor 21 according to the seventh embodiment in each of the aforementioned first to sixth embodiments, therefore, the voltages described with reference to each of the first to sixth embodiments may be entirely multiplied by (Cf+Ce)/Ce and applied to each memory cell 20 shown in FIG. 15. Thus, the simple matrix ferroelectric memory can apply potential differences similar to those in the aforementioned first to sixth embodiments to the ferroelectric capacitor 21. Consequently, the operating method in any of the aforementioned first to sixth embodiments can be easily applied to the simple matrix ferroelectric memory having the memory cells 20 shown in FIG. 15. Thus, the simple matrix ferroelectric memory can alternately apply the potential difference ±⅓Vcc to non-selected cells for canceling deterioration of polarization states resulting from disturbance of the non-selected cells in read and rewrite operations and a write operation, whereby the non-selected cells can be effectively inhibited from data destruction resulting from deterioration of the polarization states.

Eighth Embodiment

Figure 16:
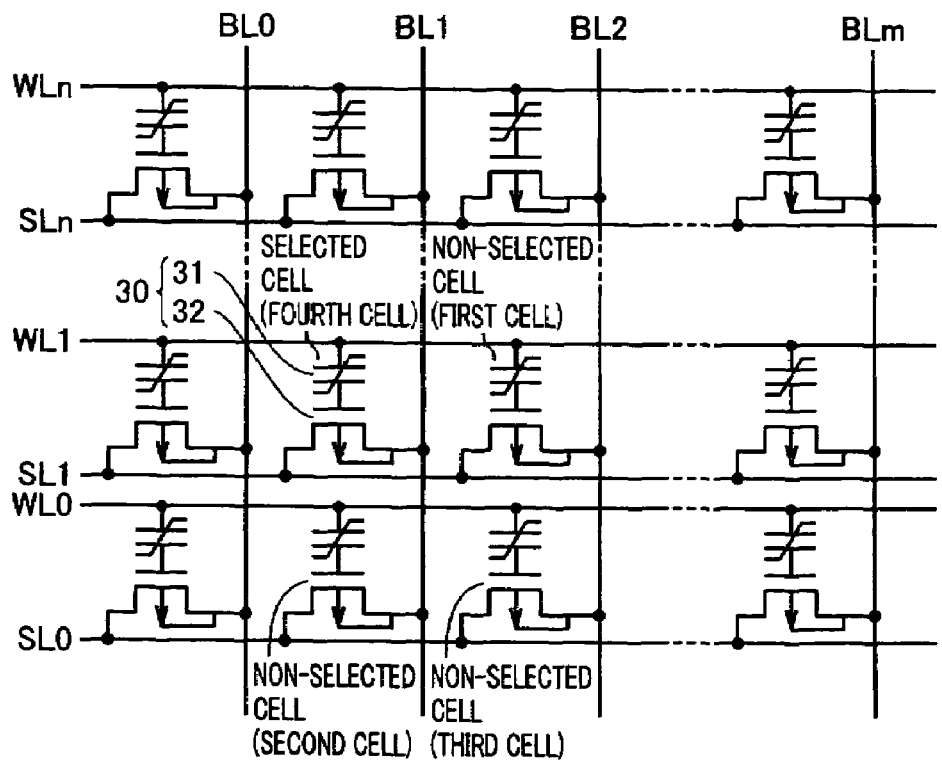
FIG. 16 is an equivalent circuit diagram showing a memory cell array to which an operating method for a ferroelectric memory according to an eighth embodiment of the present invention is applied.

Referring to FIG. 16, memory cells 30 are formed by ferroelectric capacitors 31 and cell transistors 32 in an FET-type ferroelectric memory according to an eighth embodiment of the present invention. First ends of the ferroelectric capacitors 31 are connected to word lines WL, and second ends thereof are connected to gate electrodes of the cell transistors 32. The FET-type ferroelectric memory has an MFMIS (M: metal or conductor, F: ferroelectric substance, I: paraelectric substance, S: semiconductor) obtained by inserting conductive layers and paraelectric capacitors hardly forming interfacial levels between the same and a semiconductor such as silicon dioxide ($SiO_2$) between the ferroelectric capacitors 31 and a semiconductor substrate (not shown).

Figure 17:
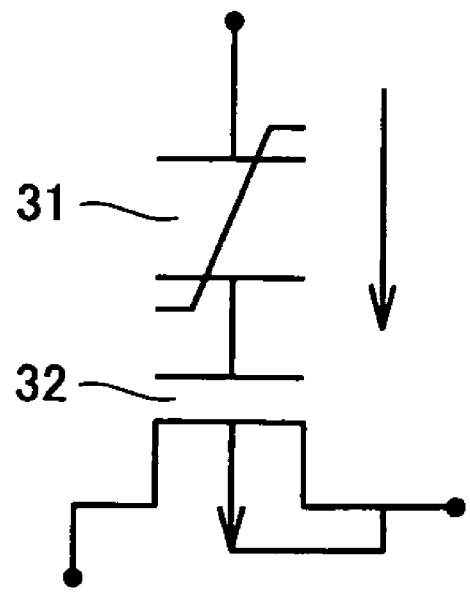
FIG. 17 is an equivalent circuit diagram showing a state of data "0" in the operating method for the ferroelectric memory according to the eighth embodiment of the present invention.
Figure 18:
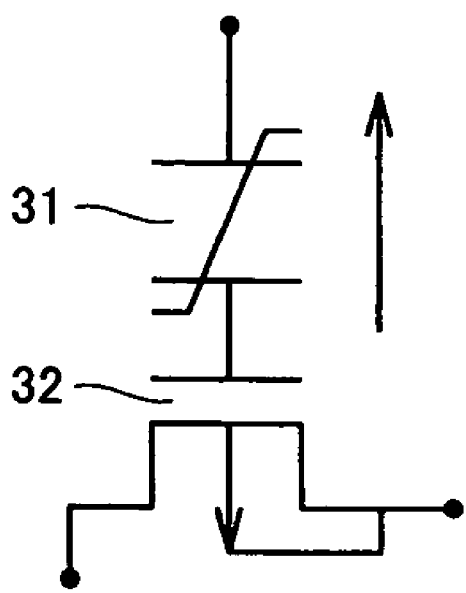
FIG. 18 is an equivalent circuit diagram showing a state of data "1" in the operating method for the ferroelectric memory according to the eighth embodiment of the present invention.

The FET-type ferroelectric memory according to the eighth embodiment shown in FIG. 16 is described on the assumption that a fourth cell is selected and first to third cells are non-selected. In this case, it is assumed that such a state that the FET-type ferroelectric memory applies a potential difference Vpp between a selected word line WL1 and a selected bit line BL1 so that the direction of polarization of the ferroelectric capacitor 31 is downward as shown in FIG. 17 corresponds to data "0". It is also assumed that such a state that the FET-type ferroelectric memory applies a potential difference (−Vpp) between the selected word line WL1 and the selected bit line BL1 so that the direction of polarization of the ferroelectric capacitor 31 is upward as shown in FIG. 18 corresponds to data "1".

The FET-type ferroelectric memory applies a voltage capacitively divided with a gate capacitance to the ferroelectric capacitor 31, and hence the potential difference Vpp must be set so large that the polarization state of the ferroelectric capacitor 31 can be sufficiently inverted.

An operating method of preventing data held in the non-selected cells from destruction in the ferroelectric memory shown in FIG. 16 is now described. The ferroelectric memory applying the voltage capacitively divided with the gate capacitance to the ferroelectric capacitors 31 employs a high voltage Vpp in consideration of this. The following description is made with no consideration of the capacitances of depletion layers of the cell transistor 32, for convenience of illustration. In a case of considering the capacitances of the depletion layers, voltage arrangement may be adjusted in consideration of capacitive division of the voltages by gate capacitances and the capacitances of the depletion layers.

(Write Operation)

A write operation for writing data "0" is described with reference to FIG. 19.

(1) Operation of Writing Reverse Data

Figure 19:
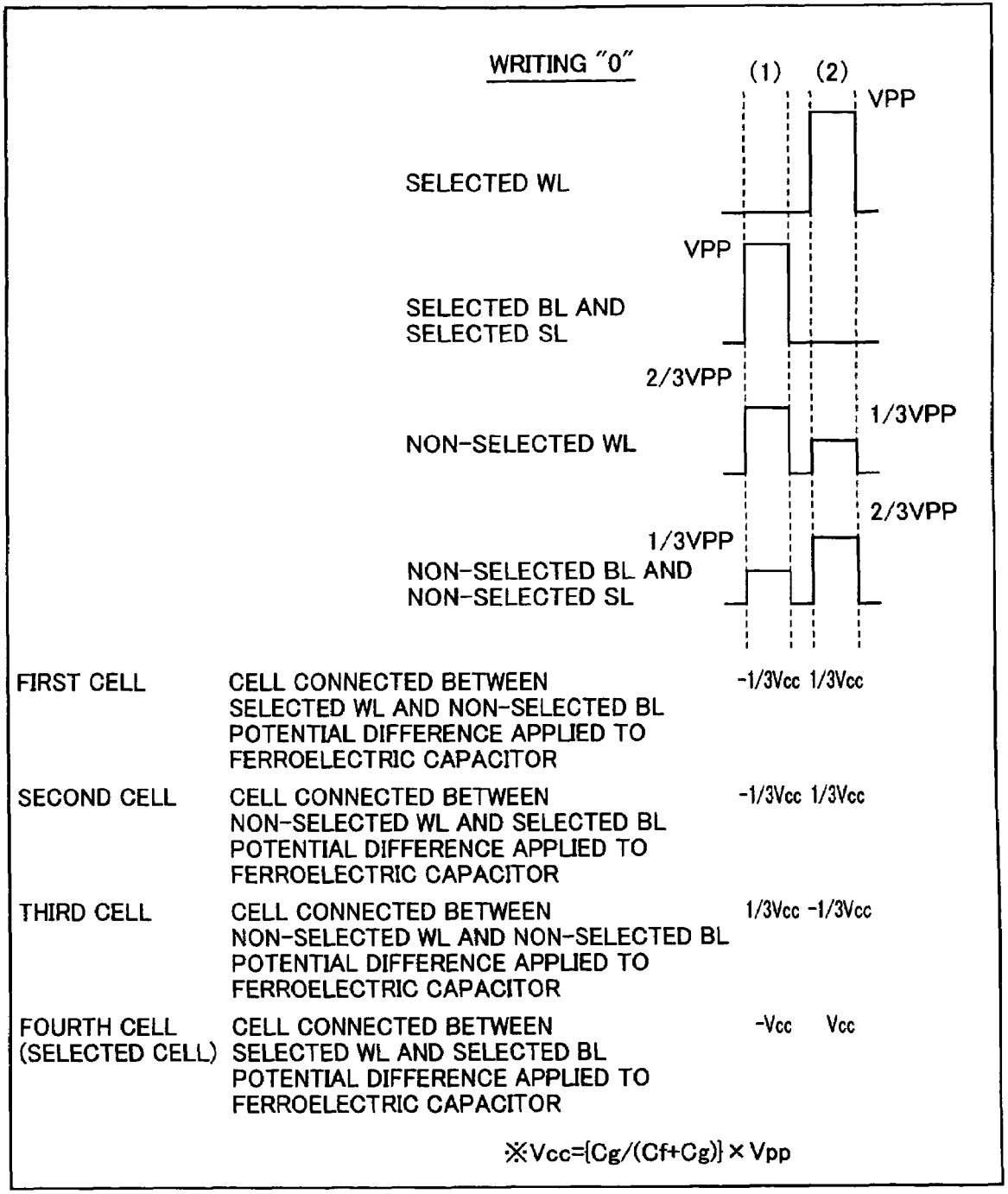
FIG. 19 is a voltage waveform diagram for illustrating an operation of writing data "0" according to the eighth embodiment of the present invention.

As shown in FIG. 19, the word line WL1 (selected WL) at 0 V while both of the bit line BL1 (selected BL) and a source line SL1 (selected SL) are at the voltage Vpp in the selected cell (fourth cell) in a period (1). The substrate and the bit line BL1 are connected with each other, and hence the substrate potential of the cell transistor 32 and the potential around a semiconductor surface reach the level Vpp. The ferroelectric memory applies a voltage −Vcc capacitively divided with the gate capacitance to the ferroelectric capacitor 31 of the selected cell (fourth cell) for writing reverse data "1". A voltage Vcc applied to the ferroelectric capacitor 31 is expressed with the gate capacitance Cg, the capacitance Cf of the ferroelectric capacitor 31 and the voltage Vpp as follows:

$$Vcc = \{Cg/(Cf+Cg)\}Vpp \quad (4)$$

Therefore, the ferroelectric memory may apply the voltage Vpp (Cf+Cg)Cg times the voltage Vcc to the memory cell. The ferroelectric memory applies voltages 0 V, ⅓Vpp and Vpp to the word line WL1 (selected WL), a bit line BL2 (non-selected BL) and the source line SL1 (selected SL) in the non-selected first cell. The substrate potential of the cell transistor 32 of the first cell and the potential around the semiconductor surface reach the level ⅓Vpp, and the ferroelectric memory applies the potential difference −⅓Vcc to the ferroelectric capacitor 31 of the first cell. The threshold voltage of each cell transistor 32 shown in FIG. 16 is so adjusted as to form no channel when the potential difference between the word line WL and the bit line BL is ⅓Vpp.

With reference to the non-selected second cell, the ferroelectric memory applies potential differences ⅔Vpp, Vpp and ⅓Vpp to a word line WL0 (non-selected WL), the bit line BL1 (selected BL) and a source line SL0 (non-selected SL) respectively. The substrate potential of the second cell and the potential around the semiconductor surface reach the level Vpp, and the ferroelectric memory applies the potential difference −⅓Vcc to the ferroelectric capacitor 31 of the second cell.

With reference to the non-selected third cell, the ferroelectric memory applies the potential differences ⅔Vpp, ⅓Vpp and ⅓Vpp to the word line WL0 (non-selected WL), the bit line BL2 (non-selected BL) and the source line SL0 (non-selected SL) respectively. The substrate potential of the third cell and the potential around the semiconductor surface reach the level ⅓Vpp, and the ferroelectric memory applies the potential difference ⅓Vcc to the ferroelectric capacitor 31 of the third cell.

(2) Data Write Operation

With reference to the selected fourth cell, the word line WL1 (selected WL) is at the voltage Vpp, and the bit line BL1 (selected BL) and the source line SL1 (selected SL) are at 0 V. The substrate and the bit line BL1 are connected with each other, and hence the substrate potential of the cell transistor 32 of the fourth cell (selected cell) and the potential around a semiconductor surface reach 0 V. The ferroelectric memory applies the voltage Vcc (see the above equation (4)) capacitively divided with the gate capacitance to the ferroelectric capacitor 31 of the fourth cell (selected cell) for writing data "0".

With reference to the non-selected first cell, the ferroelectric memory applies the voltages Vpp, ⅔Vpp and 0 V to the word line WL1 (selected WL), the bit line BL2 (non-selected BL) and the source line SL1 (selected SL) respectively. The substrate potential of the cell transistor 32 of the first cell and the potential around the semiconductor surface reach the level ⅔Vpp, and the ferroelectric memory applies the potential difference ⅓Vcc to the ferroelectric capacitor 31 of the first cell.

With reference to the non-selected second cell, the ferroelectric memory applies the potential differences ⅓Vpp, 0 V and ⅔Vpp to the word line WL0 (non-selected WL), the bit line BL1 (selected BL) and the source line SL0 (non-selected SL) respectively. The substrate potential of the second cell and the potential around the semiconductor surface reach 0 V, and the ferroelectric memory applies the potential difference ⅓Vcc to the ferroelectric capacitor 31 of the second cell. With reference to the non-selected third cell, the ferroelectric memory applies the potential differences ⅓Vpp, ⅔Vpp and ⅔Vpp to the word line WL0 (non-selected WL), the bit line BL2 (non-selected BL) and the source line SL0 (non-selected SL) respectively. The substrate potential of the third cell and the potential around the semiconductor surface reach the level ⅔Vpp, and the ferroelectric memory applies the potential difference −⅓Vcc to the ferroelectric capacitor 31 of the third cell.

Throughout the reverse data write operation and the data write operation in the periods (1) and (2) shown in FIG. 19, the ferroelectric memory applies the potential difference ±⅓Vcc to the ferroelectric capacitors 31 of the non-selected cells (first to third cells). Therefore, the ferroelectric memory can inhibit the non-selected cells from data destruction resulting from disturbance in the write operation by employing the voltage arrangement show in FIG. 19.

Figure 20:
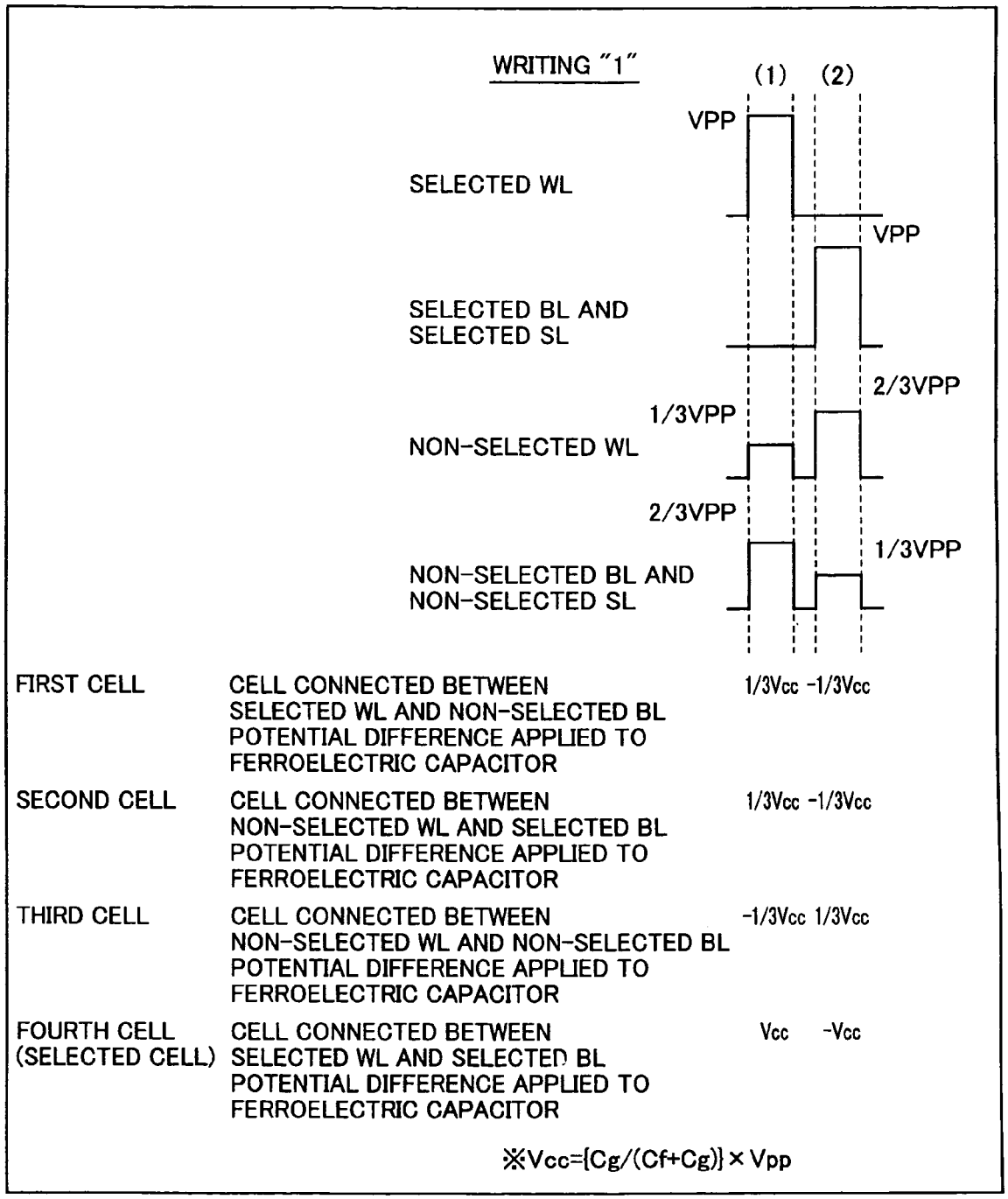
FIG. 20 is a voltage waveform diagram for illustrating an operation of writing data "1" according to the eighth embodiment of the present invention.

In order to write data n1' shown in FIG. 20, the ferroelectric memory simply exchanges the operations in the periods (1) and (2) in the case of writing the data "0" shown in FIG. 19, and the remaining operations are similar to those in the case of writing the data "0".

(Read/Rewrite Operation)

Figure 21:
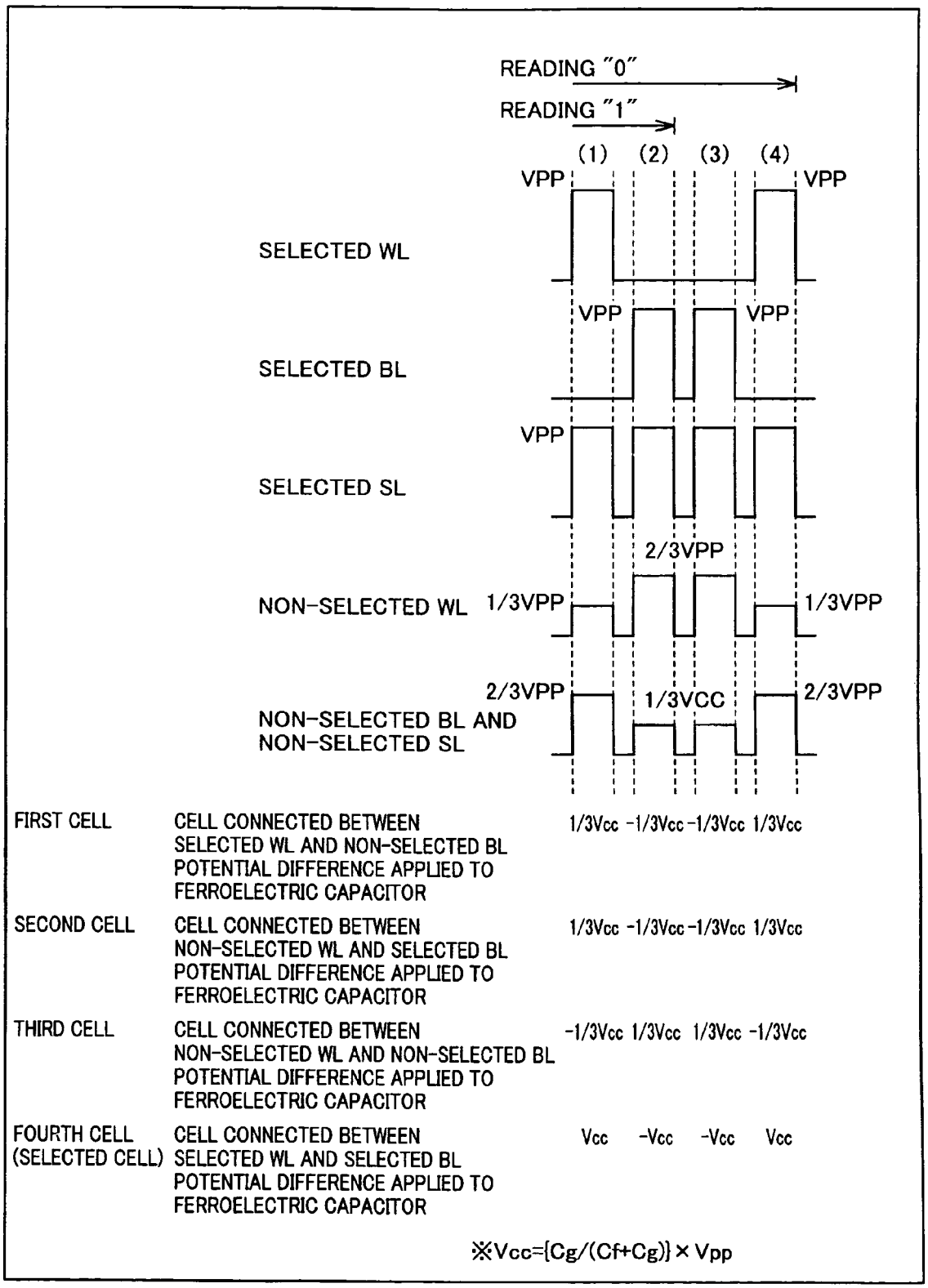
FIG. 21 is a voltage waveform diagram for illustrating a read/rewrite operation according to the eighth embodiment of the present invention.

Voltage arrangement in reading/rewriting is divided into four periods (1), (2), (3) and (4) for reading, rewriting "1", writing "1" and rewriting (rereading) "0" respectively, as shown in FIG. 21. The ferroelectric memory completes the operation in the period (2) when the memory cell holds data "1" while performing the operation up to the period (4) when the memory cell holds data "0".

(1) Read Operation

The ferroelectric memory reads data by applying the potential difference Vpp between the selected word line WL1 (selected WL) and the selected bit line BL1 (selected BL) while applying a proper voltage to the selected source line SL1 (selected SL) thereby measuring the drain current of the cell transistor 32. The ferroelectric memory can determine the data by measuring the drain current for the following reason: When the selected cell holds data "1", the polarization state of the ferroelectric capacitor 31 is inverted in reading and hence the gate electrode of the cell transistor 32 generates a sufficiently large quantity Qg of charges. Consequently, a quantity −Qg of charges are generated in the vicinity of the semiconductor surface located immediately under the gate of the transistor 32. Thus, a source and a drain are rendered conductive due to inverted electrons, to feed the drain current.

When the selected cell holds data "0", on the other hand, the polarization state of the ferroelectric capacitor 31 is not inverted in reading and hence the gate electrode of the cell transistor 32 hardly generates charges also when the potential difference Vpp between the selected WL and the selected BL is sufficiently large. Therefore, negative charges are hardly induced in the vicinity of the semiconductor surface located immediately under the gate, and hence the source and the drain of the cell transistor 32 are not rendered conductive. Thus, no drain current flows. Therefore, the ferroelectric memory can determine the data by measuring the drain current.

More specifically, the ferroelectric memory applies the potential differences Vpp, 0 V and Vpp to the word line WL1 (selected WL), the bit line BL1 (selected BL) and the source line SL1 (selected SL) respectively in the selected fourth cell. The bit line BL1 is connected with the substrate and hence the substrate potential of the cell transistor 32 of the fourth cell reaches 0 V. When holding data "1", the polarization state is inverted in the ferroelectric capacitor 31 of the fourth cell (selected cell). Thus, the gate electrode generates large charges, thereby forming a channel. Therefore, a drain current flows through the cell transistor 32 of the fourth cell (selected cell). When holding data "0", on the other hand, the polarization state is not inverted in the ferroelectric capacitor 31 of the fourth cell (selected cell). Therefore, the cell transistor 32 of the fourth cell (selected cell) forms no channel, and hence no drain current flows through the cell transistor 32. The ferroelectric memory determines data "0" or "1" by measuring this drain current.

With reference to the non-selected first cell, the ferroelectric memory applies the voltages Vpp, ⅔Vpp and Vpp to the word line WL1 (selected WL), the bit line BL2 (non-selected BL) and the source line SL1 (selected SL) respectively. The substrate potential of the cell transistor 32 of the first cell and the potential around the semiconductor surface reach the level ⅔Vpp, and the ferroelectric memory applies the potential difference ⅓Vcc to the ferroelectric capacitor 31 of the first cell.

With reference to the non-selected second cell, the ferroelectric memory applies the potential differences ⅓Vpp, 0 V and ⅔ Vpp to the word line WL0 (non-selected WL), the bit line BL1 (selected BL) and the source line SL0 (non-selected SL) respectively. The substrate potential of the second cell and the potential around the semiconductor surface reach 0 V, and the ferroelectric memory applies the potential difference ⅓Vcc to the ferroelectric capacitor 31 of the second cell. With reference to the non-selected third cell, the ferroelectric memory applies the potential differences ⅓Vpp, ⅔Vpp and ⅔Vpp to the word line WL0 (non-selected WL), the bit line BL2 (non-selected BL) and the source line SL0 (non-selected SL) respectively. The substrate potential of the third cell and the potential around the semiconductor surface reach the level $\frac{2}{3}$Vpp, and the ferroelectric memory applies the potential difference $-\frac{1}{3}$Vcc to the ferroelectric capacitor 31 of the third cell.

(2) Operation of Rewriting Data "1"

The voltage arrangement in this period is identical to that in the operation of writing reverse data performed in the period (1) for writing the data "0" shown in FIG. 19. When the selected fourth cell holds data "1", the ferroelectric memory terminates the read/rewrite operation.

(3) Operation of Writing Data "1"

The voltage arrangement in this period is identical to that in the operation of writing reverse data performed in the period (1) for writing the data "0" shown in FIG. 19.

(4) Operation of Rewriting (Rereading) Data "1"

The voltage arrangement in this period is identical to reading performed in the period (1) of the read/rewrite operation shown in FIG. 21. In other words, the ferroelectric memory applies the potential differences Vpp, 0 V and Vpp to the selected WL, the selected BL and the selected SL respectively.

In this case, the ferroelectric memory may alternatively apply the potential difference 0 V to the selected SL in place of the potential difference Vpp. More specifically, the state of rewriting data "0" in the period (4) corresponds to the state of writing data "1" in the operation of writing data "1" in the period (3), and hence the ferroelectric memory applies a voltage to the ferroelectric capacitor 31 of the selected fourth cell in a direction necessarily causing polarization inversion. Therefore, a channel is formed immediately under the gate of the cell transistor 32. When applying the potential difference Vpp to the selected cell SL as described above in this case, the potential around the semiconductor surface located immediately under the gate of the fourth cell is not necessarily equalized with the potential (0 V) of the selected bit line BL1, and hence the potential difference Vcc is not necessarily applied to the ferroelectric capacitor 31. When setting the selected source line SL1 to 0 V, on the other hand, the potential in the vicinity of the semiconductor surface reaches 0 V also when forming a channel, and the ferroelectric memory can reliably write data "0". When setting the selected source line SL1 to 0 V, the non-selected first to third cells operate identically to those in the data write operation performed in the period (2) for writing data "0" shown in FIG. 19.

Also in the eight embodiment, the ferroelectric memory applies the potential difference $\pm\frac{1}{3}$Vcc to the ferroelectric capacitors 31 of the non-selected cells (first to third cells) throughout the read/rewrite operation in the periods (1) to (4), whereby the non-selected cells can be inhibited from data destruction resulting from disturbance in the write operation.

Ninth Embodiment

Figure 22:
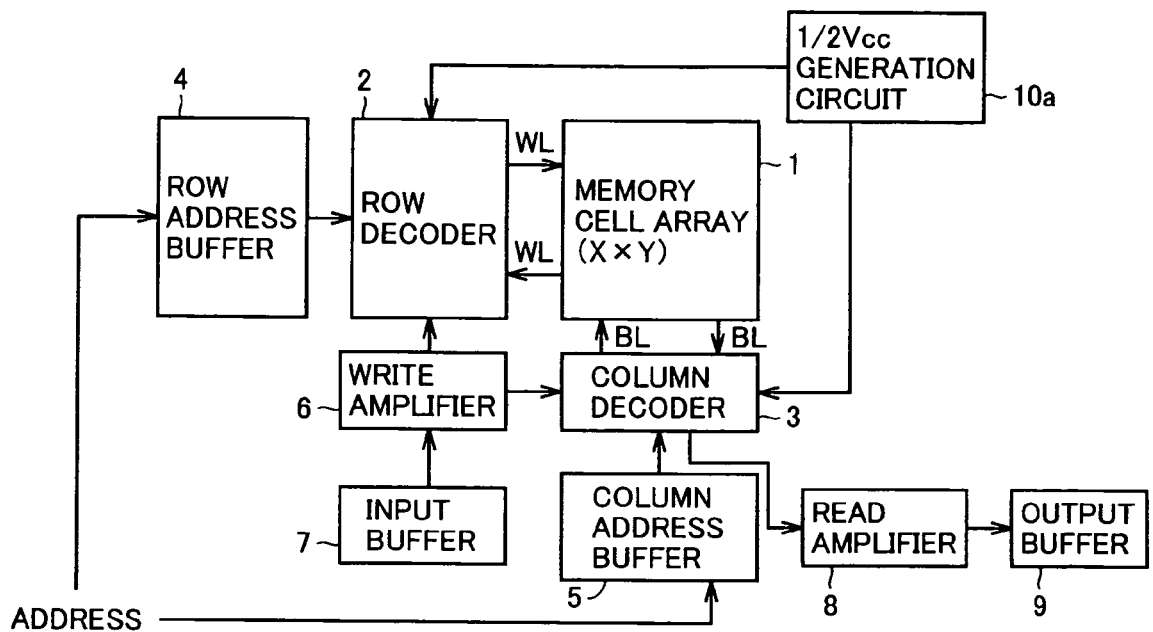
FIG. 22 is a block diagram showing the overall structure of a simple matrix ferroelectric memory according to a ninth embodiment of the present invention.

Referring to FIG. 22, a simple matrix ferroelectric memory according to a ninth embodiment of the present invention is described with reference to a case of applying a voltage ½Vcc to non-selected cells dissimilarly to the aforementioned first to eighth embodiments.

More specifically, the simple matrix ferroelectric memory according to the ninth embodiment is identical in structure to the simple matrix ferroelectric memory according to the first embodiment shown in FIG. 1, except that the ⅓Vcc·⅔Vcc generation circuit 10 is replaced with a ½Vcc generation circuit 10a as shown in FIG. 22.

Figure 23:
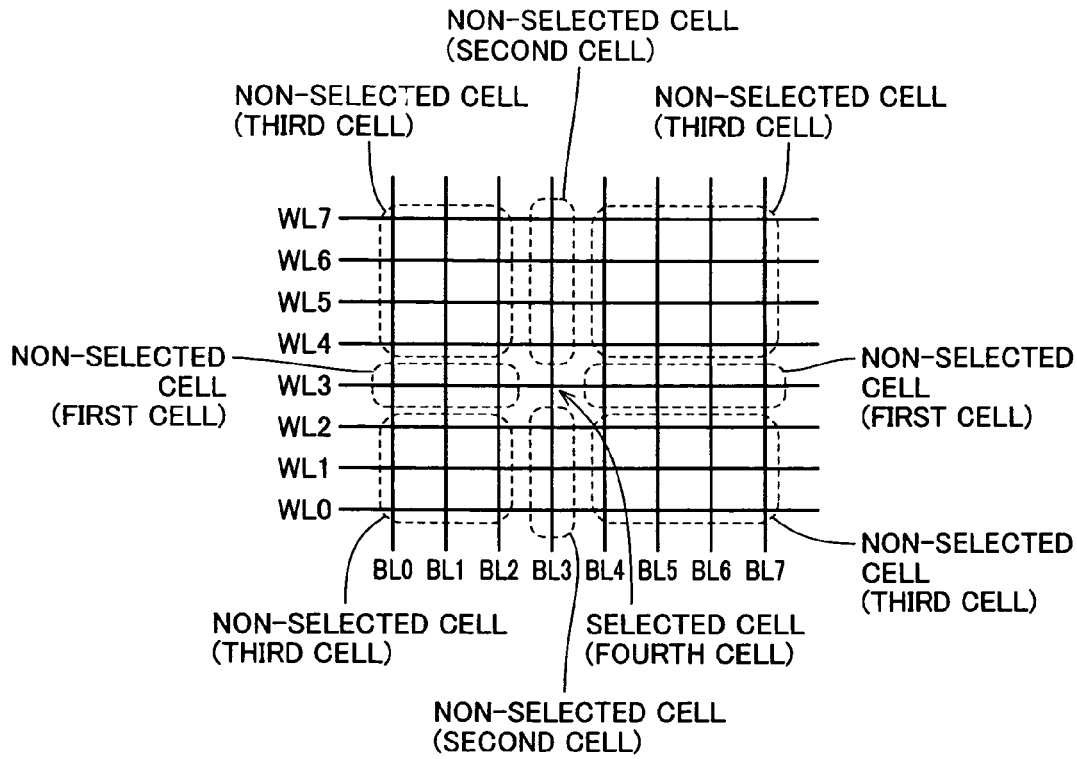
FIG. 23 is a schematic diagram for illustrating a selected cell and non-selected cells of a memory cell array according to the ninth embodiment of the present invention.
Figure 24:
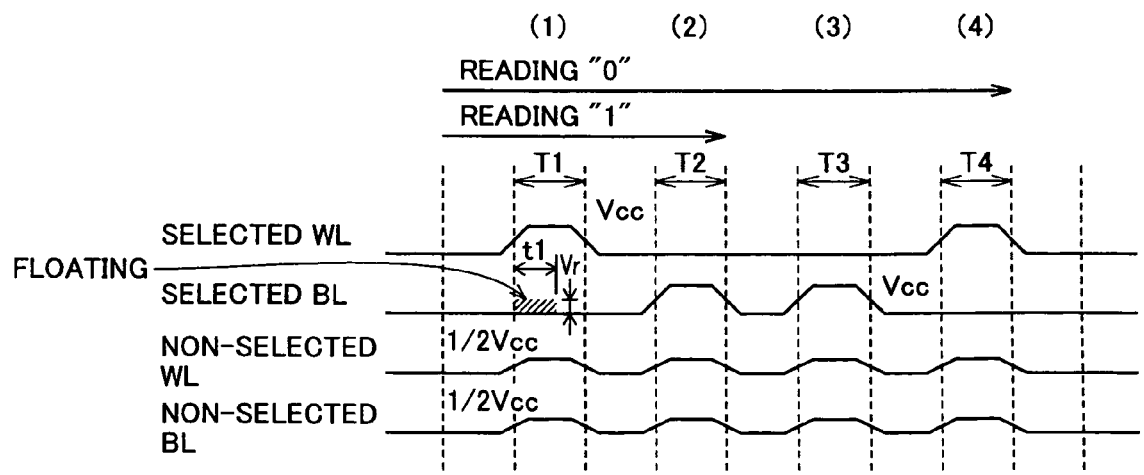
FIG. 24 is a voltage waveform diagram for illustrating a read operation and a rewrite operation of the simple matrix ferroelectric memory according to the ninth embodiment of the present invention.
Figure 25:
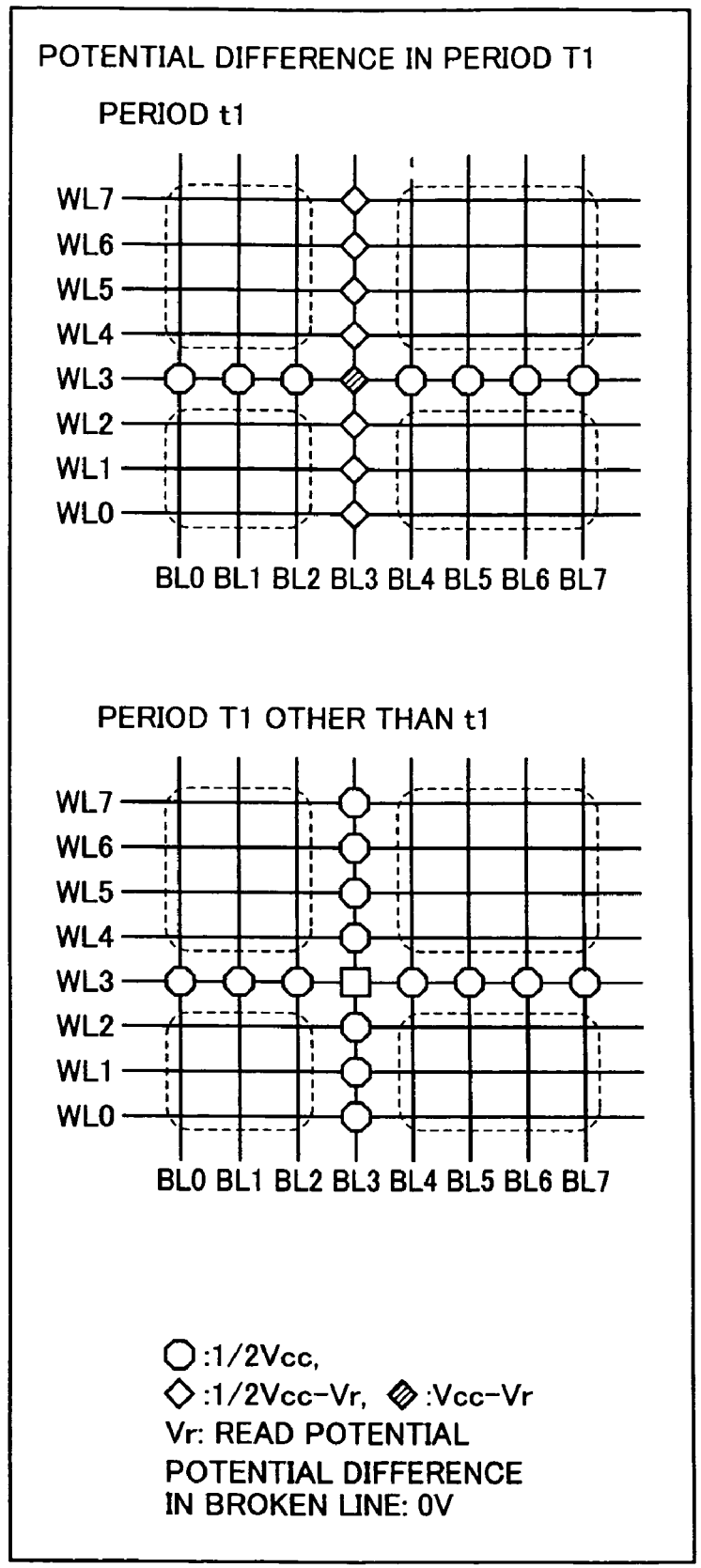
FIG. 25 is a diagram for illustrating potential differences applied to the respective memory cells in a period T1 for the read operation and the rewrite operation according to the ninth embodiment.

Referring to FIGS. 23 and 24, the simple matrix ferroelectric memory according to the ninth embodiment is described on the assumption that a fourth cell located on the intersection between a word line WL3 and a bit line BL3 shown in FIG. 23 is selected. FIG. 24 shows the waveforms of voltages applied to word lines WL and bit lines BL. It is assumed that operating times in periods T1 (1), T2 (2), T3 (3) and T4 (4) shown in FIG. 24 are identical to each other (T seconds: identical pulse width). The simple matrix ferroelectric memory may perform the operations in the periods (1) to (4) continuously or independently of each other. The operations in the periods (1) to (4) are now described. In a standby state, the simple matrix ferroelectric memory sets the word lines WL and the bit lines BL to 0 V.

(1) Read Operation in Period T1

The simple matrix ferroelectric memory performs a read operation in the period T1 shown in FIG. 24. From the standby state, the simple matrix ferroelectric memory brings a selected BL into a floating state (high impedance state). The simple matrix ferroelectric memory sets a selected WL and a non-selected WL to the voltages Vcc and ½Vcc respectively at the same timing or in a delay by several nsec to several 10 nsec. Thereafter the simple matrix ferroelectric memory sets the selected BL to 0 V. When the selected BL is in the floating state, the simple matrix ferroelectric memory senses the voltage of the selected BL thereby determining data "0" or "1". The simple matrix ferroelectric memory determines the data "0" or "1" by comparing the potential of the selected BL with a separately generated reference potential and amplifying the same by a read amplifier 8 (se FIG. 22) formed by a voltage sense amplifier.

In the period T1 for the read operation, the simple matrix ferroelectric memory applies a potential difference (½Vcc−Vr) to a non-selected second cell connected to the selected WL for a period t1 (<T1) and thereafter applies a potential difference ½Vcc thereto for a period (T1−t1). The simple matrix ferroelectric memory applies a potential difference ½Vcc to a non-selected first cell connected to the selected WL for the period T1. The simple matrix ferroelectric memory further applies a voltage difference 0 V to a non-selected third cell not connected to the selected WL and the selected BL for the period T1. On the other hand, the simple matrix ferroelectric memory further applies a voltage difference (Vcc−Vr) to the selected fourth cell for the period t1 and thereafter applies a voltage Vcc for the period (T1−t1).

It is assumed that the simple matrix ferroelectric memory according to the ninth embodiment sets the period t1 sufficiently short so that change $\Delta Pr_a$ of the quantity of polarization resulting from the potential difference (½Vcc−Vr) applied to the non-selected second cell connected to the selected BL for the period t1 is sufficiently small as compared with change $\Delta P_r$ of the quantity of polarization resulting from the potential difference ½Vcc applied for the period (T1−t1) and the change ΔPr is substantially identical to change of the quantity of polarization caused in the periods T2 to T4 subsequent to the period T1.

Figure 26:
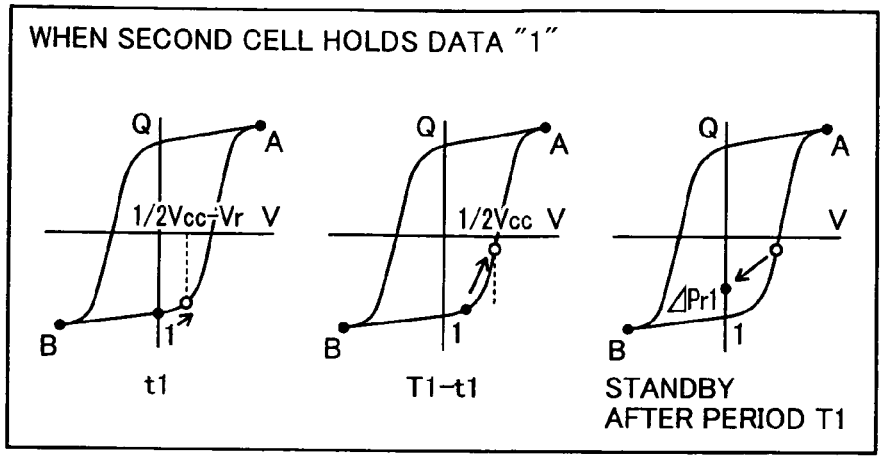
FIG. 26 is a hysteresis diagram showing change of a polarization state in the period T1 when a second cell holds data "1" in the read operation and the rewrite operation according to the ninth embodiment.
Figure 27:
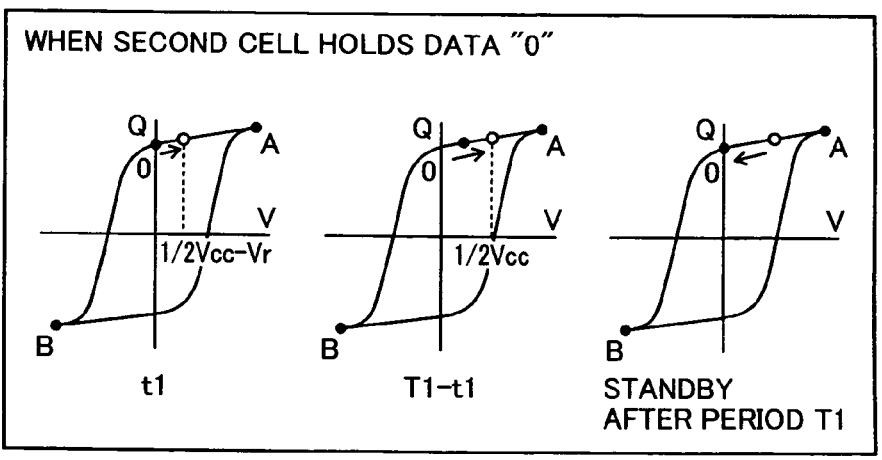
FIG. 27 is a hysteresis diagram showing change of the polarization state in the period T1 when the second cell holds data "0" in the read operation and the rewrite operation according to the ninth embodiment.
Figure 28:
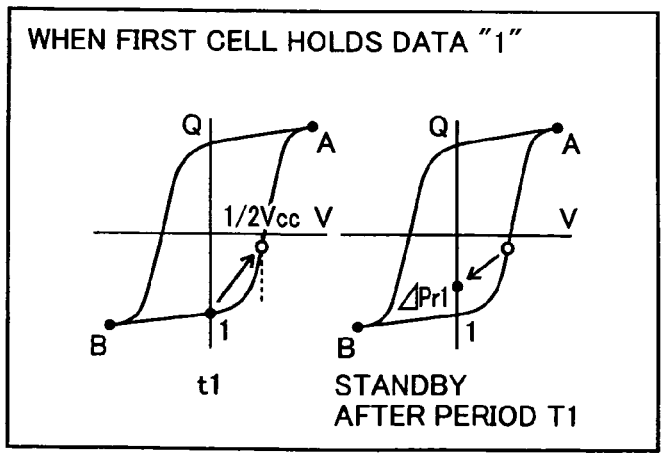
FIG. 28 is a hysteresis diagram showing change of a polarization state in the period T1 when a first cell holds data "1" in the read operation and the rewrite operation according to the ninth embodiment.
Figure 29:
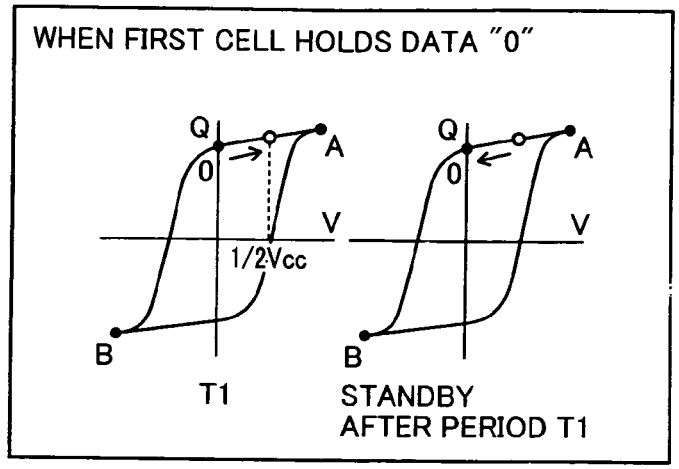
FIG. 29 is a hysteresis diagram showing change of the polarization state in the period T1 when the first cell holds data "0" in the read operation and the rewrite operation according to the ninth embodiment.
Figure 30:
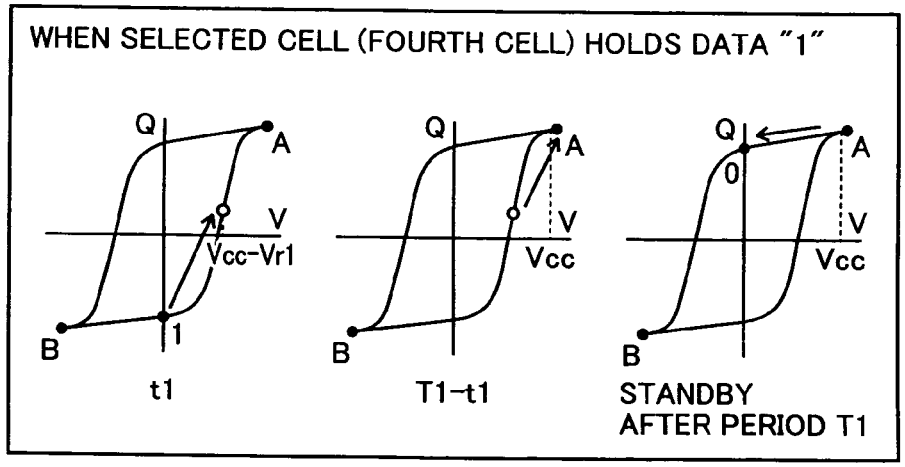
FIG. 30 is a hysteresis diagram showing change of a polarization state in the period T1 when a selected cell (fourth cell) holds data "1" in the read operation and the rewrite operation according to the ninth embodiment.
Figure 31:
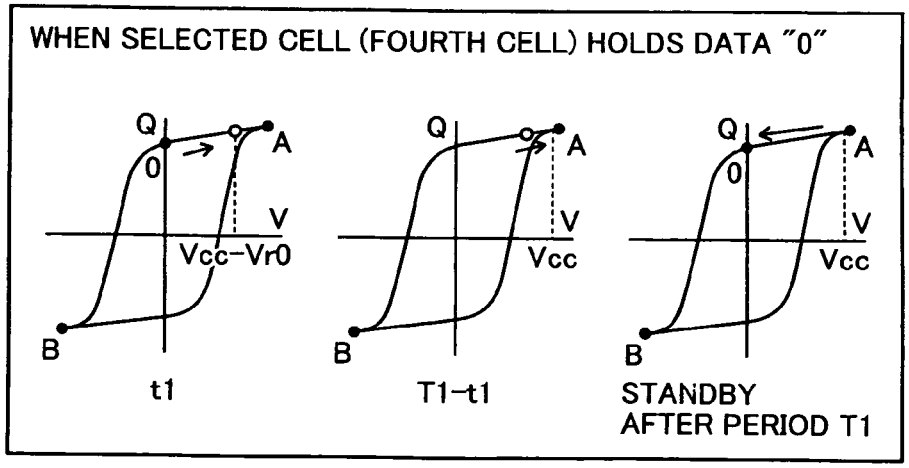
FIG. 31 is a hysteresis diagram showing change of the polarization state in the period T1 when the selected cell (fourth cell) holds data "0" in the read operation and the rewrite operation according to the ninth embodiment.

Consequently, the polarization state is deteriorated in the non-selected second cell connected to the selected BL when holding data "1" as shown in FIG. 26, and improved when holding data "0" as shown in FIG. 27. In the non-selected first cell connected to the selected WL, the polarization state is deteriorated when holding data "1" as shown in FIG. 28, and improved when holding data "1" as shown in FIG. 29. In the non-selected third cell connected to a non-selected WL and a non-selected BL, the potential state remains unchanged (not shown) regardless of held data since the potential difference is 0 V for the period T1. In the selected fourth cell, data "1" is destroyed so that data "0" is written when holding the data "1", as shown in FIG. 30. When the selected fourth cell holds data non, the data is not destroyed as shown in FIG. 31.

(2) Rewrite Operation in Period T2

After the aforementioned read operation in the period (1), the simple matrix ferroelectric memory temporarily returns to the standby state as shown in FIG. 24. Thereafter the simple matrix ferroelectric memory sets the selected WL, the non-selected WL, the selected BL and the non-selected BL to the voltages 0 V, ½Vcc, Vcc and ½Vcc respectively. In the period T2 for the write operation, the simple matrix ferroelectric memory applies the potential difference −½Vcc to the non-selected first and second cells receiving the potential difference ½Vcc in the period T1 for the read operation. The simple matrix ferroelectric memory re-applies the potential difference 0 V to the non-selected third cell receiving the potential difference 0 V in the period T1.

Figure 33:
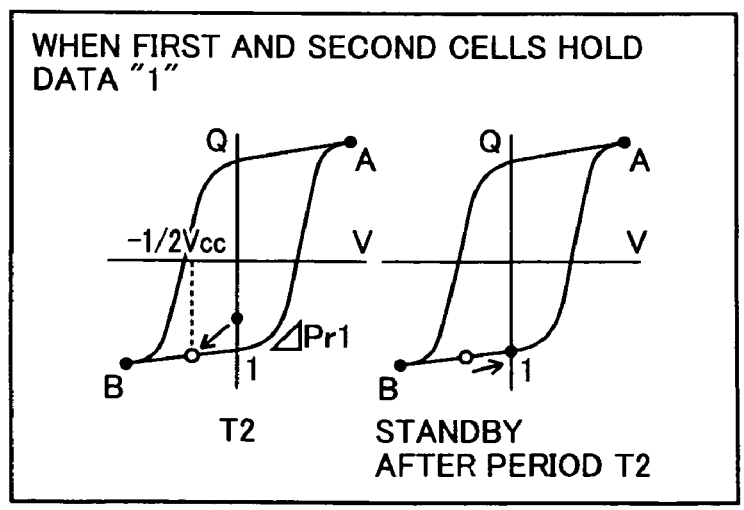
FIG. 33 is a hysteresis diagram showing change of the polarization state in the period T2 when non-selected first and second cells hold data "1" in the read operation and the rewrite operation according to the ninth embodiment.
Figure 34:
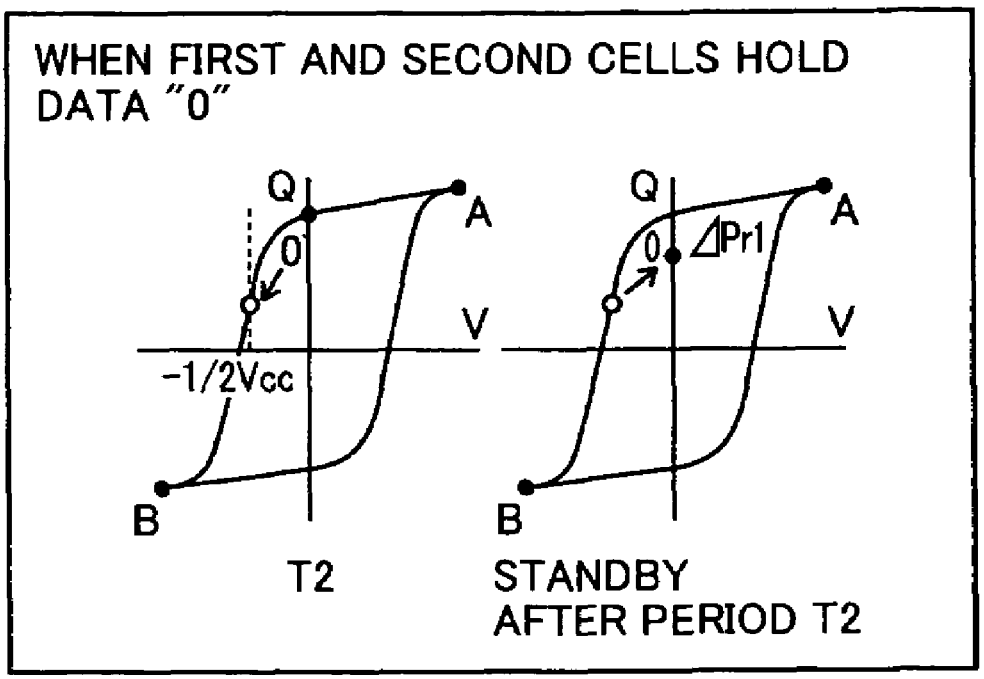
FIG. 34 is a hysteresis diagram showing change of the polarization state in the period T2 when the non-selected first and second cells hold data "0" in the read operation and the rewrite operation according to the ninth embodiment.
Figure 35:
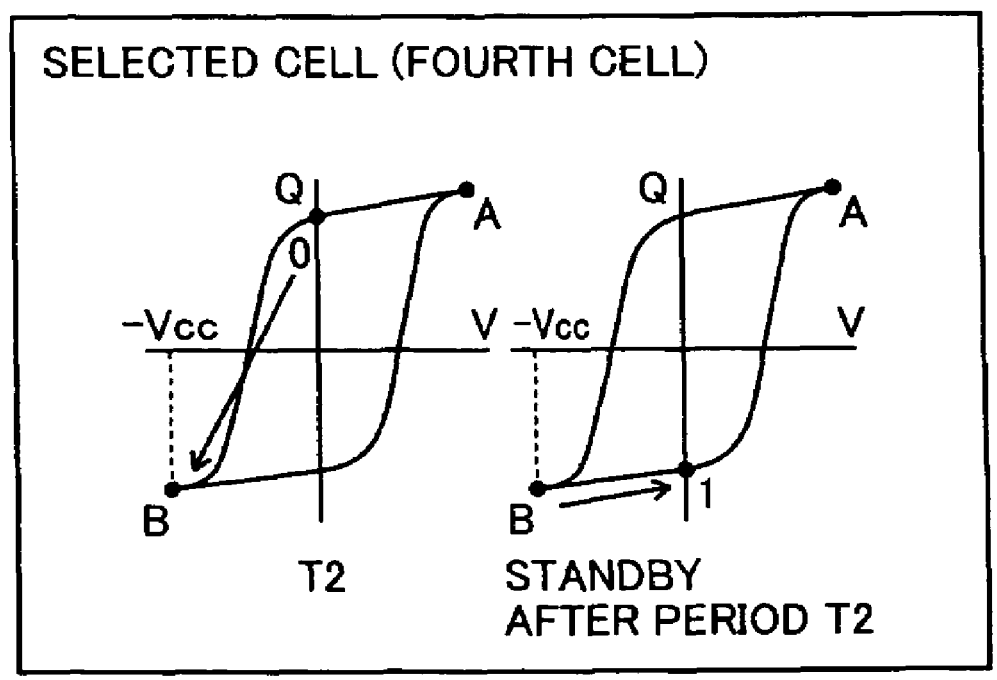
FIG. 35 is a hysteresis diagram showing change of the polarization state of the selected cell (fourth cell) in the period T2 in the read operation and the rewrite operation according to the ninth embodiment.

Consequently, the polarization states are improved in the non-selected first and second cells when holding data "1", as shown in FIG. 33. The polarization states are deteriorated when the first and second cells hold data "0", as shown in FIG. 34. In the non-selected third cell connected to the non-selected WL and the non-selected BL, the polarization state remains unchanged (not shown) regardless of held data since the potential difference 0 V is applied in the period T2. The simple matrix ferroelectric memory writes data "1" in the selected fourth cell, as shown in FIG. 35. When reading data "1" in the period T1 (1) for the read operation, the simple matrix ferroelectric memory according to the ninth embodiment terminates the read operation and the rewrite operation in the period T2.

(3) Compensatory Operation in Period T3

Figure 36:
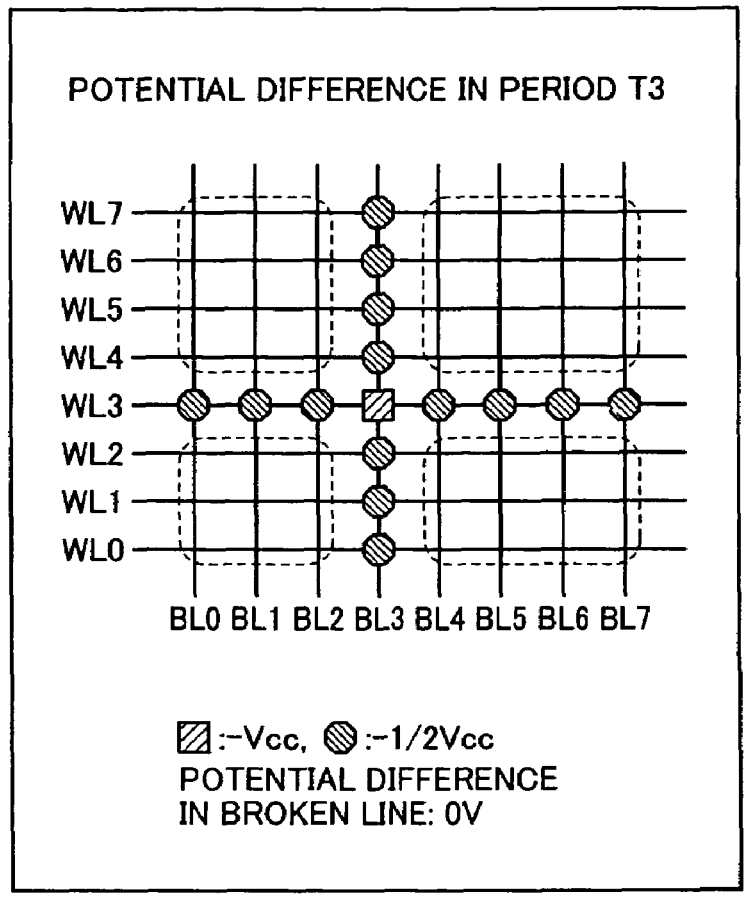
FIG. 36 is a diagram for illustrating potential differences applied to the respective memory cells in a period T3 for the read operation and the rewrite operation according to the ninth embodiment.

After the rewrite operation in the aforementioned period T2 (2), the simple matrix ferroelectric memory temporarily returns to the standby state, as shown in FIG. 24. Thereafter the simple matrix ferroelectric memory sets the selected WL, the non-selected WL, the selected BL and the non-selected BL to the voltages 0 V, ½Vcc, Vcc and ½Vcc respectively again. The simple matrix ferroelectric memory re-applies the potential difference −½Vcc to the non-selected first and second cells receiving the potential difference −½Vcc in the period T2 for the rewrite operation, as shown in FIG. 36. The non-selected third cell receiving the potential difference 0 V in the period T2 for the rewrite operation remains at 0 V.

Figure 37:
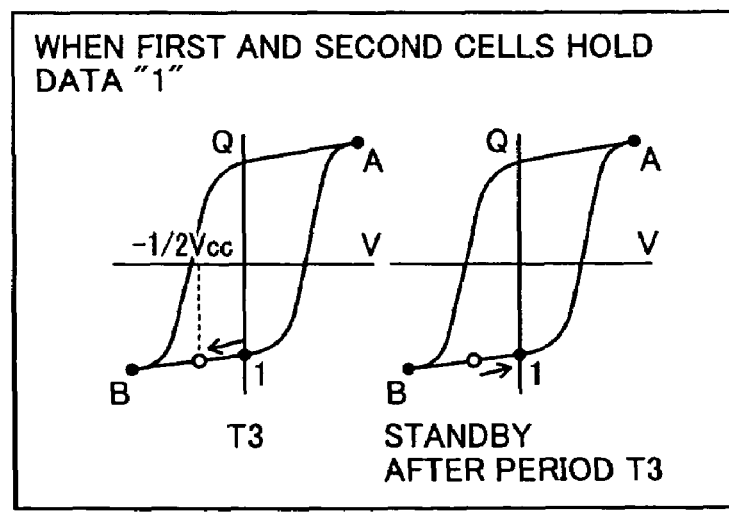
FIG. 37 is a hysteresis diagram showing change of the polarization state in the period T3 when the non-selected first and second cells hold data "1" in the read operation and the rewrite operation according to the ninth embodiment.
Figure 38:
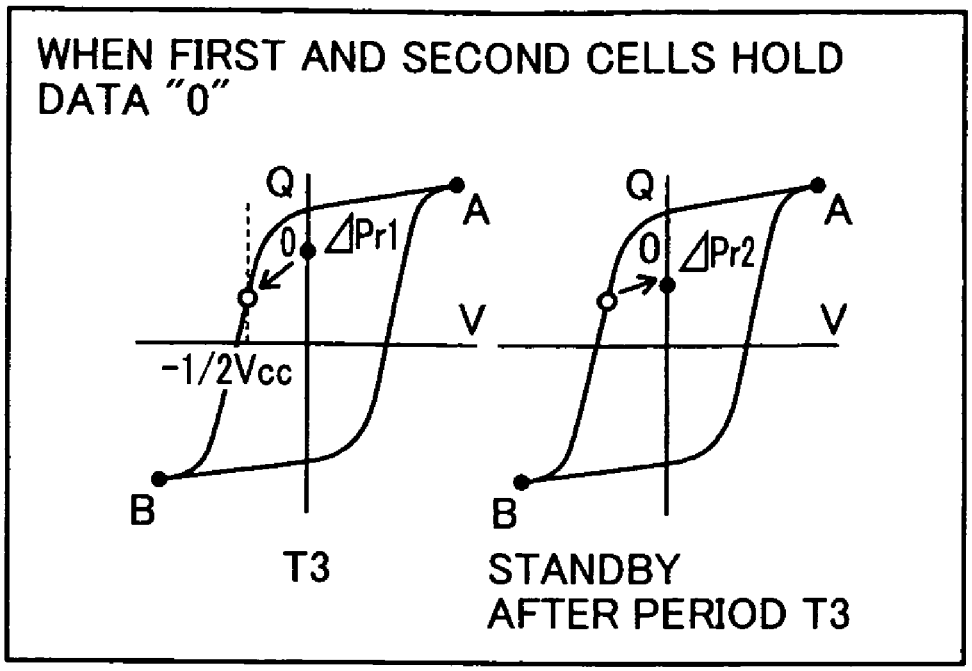
FIG. 38 is a hysteresis diagram showing change of the polarization state in the period T3 when the non-selected first and second cells hold data "0" in the read operation and the rewrite operation according to the ninth embodiment.
Figure 39:
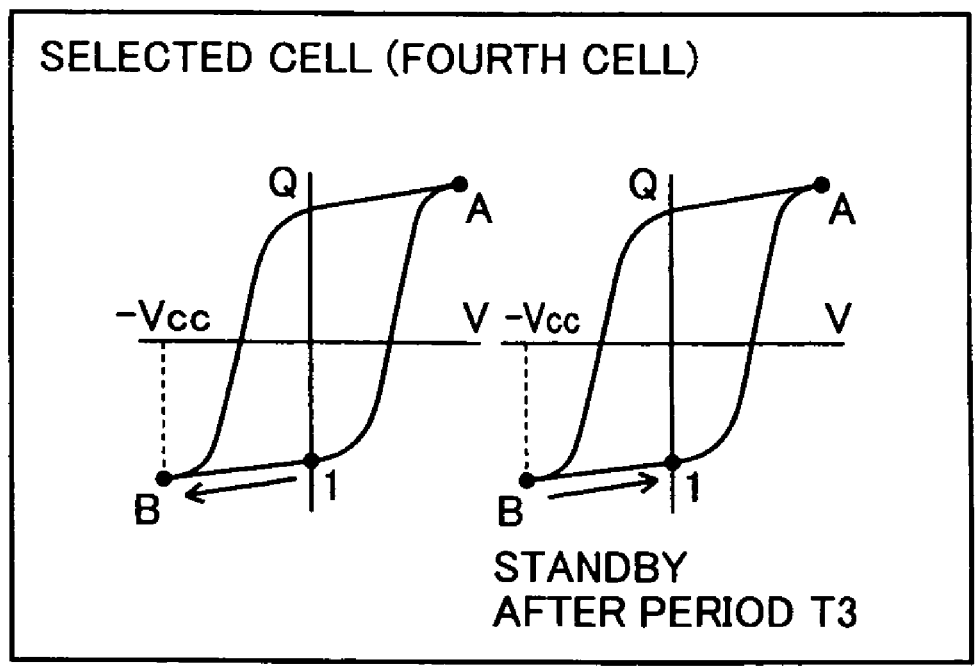
FIG. 39 is a hysteresis diagram showing change of the polarization state of the selected cell (fourth cell) in the period T3 for the read operation and the rewrite operation according to the ninth embodiment.

Consequently, the polarization states are improved in the first and second cells when holding data "1", as shown in FIG. 37. On the other hand, the polarization states are deteriorated when the first and second cells hold data "0", as shown in FIG. 38. Referring to FIG. 38, ΔPr2 denotes decrease of the quantity of polarization when the polarization state is deteriorated twice. In the non-selected third cell, the polarization state remains unchanged (not shown) due to the applied potential difference 0 V. The simple matrix ferroelectric memory rewrites the data "1" in the selected fourth cell, as shown in FIG. 39.

(4) Rewrite Operation in Period T4

Figure 40:
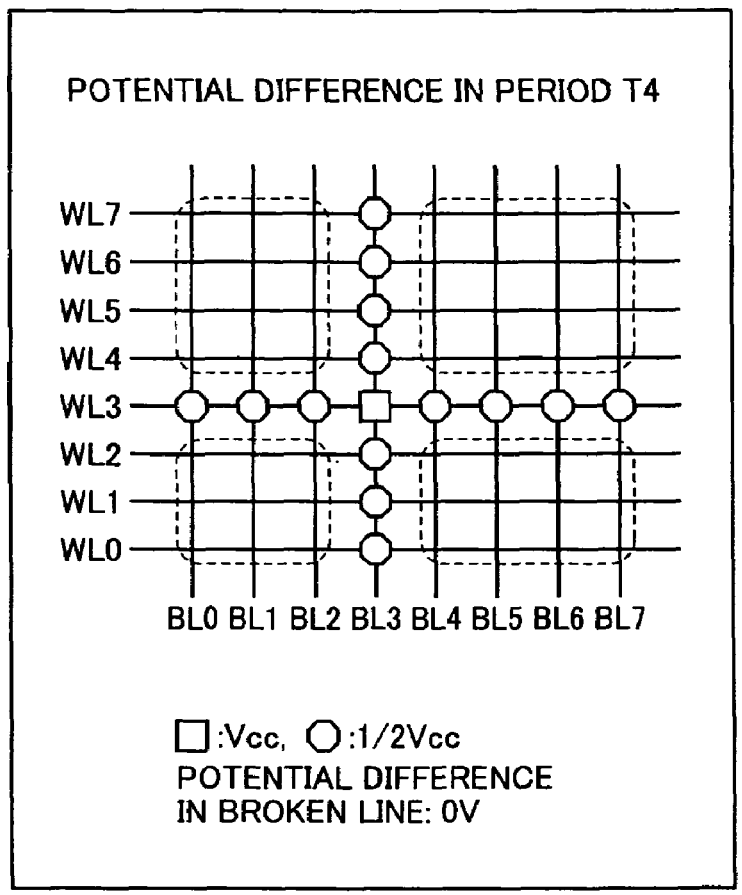
FIG. 40 is a diagram for illustrating potential differences applied to the respective memory cells in a period T4 for the read operation and the rewrite operation according to the first embodiment.

After the compensatory operation in the aforementioned period T3 (3), the simple matrix ferroelectric memory temporarily returns to the standby state as shown in FIG. 24. Thereafter the simple matrix ferroelectric memory sets the selected WL, the non-selected WL, the selected BL and the non-selected BL to the voltages Vcc, ½Vcc, 0 V and ½Vcc respectively. In this period T4 for the rewrite operation, the simple matrix ferroelectric memory applies the potential difference ½Vcc to the non-selected first and second cells receiving the potential difference −½Vcc in the period T3 for the compensatory operation, as shown in FIG. 40. On the other hand, the non-selected third cell receiving the potential difference 0 V in the period T3 for the compensatory operation remains at 0 V.

Figure 41:
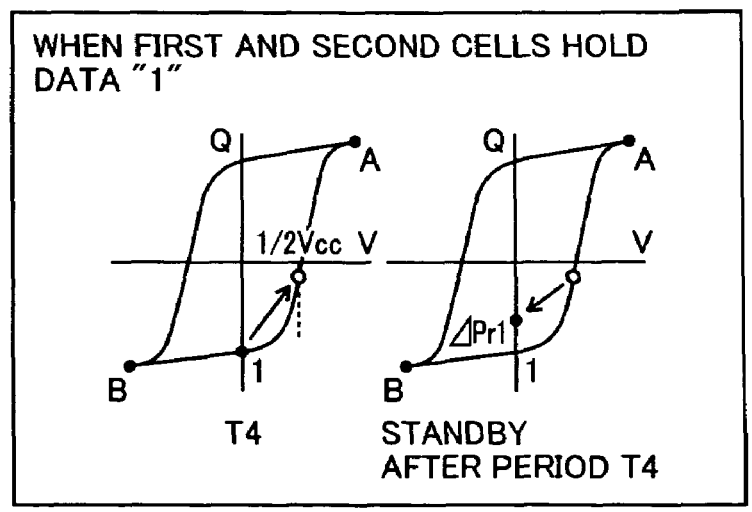
FIG. 41 is a hysteresis diagram showing change of the polarization state in the period T4 when the non-selected first and second cells hold data "1" in the read operation and the rewrite operation according to the ninth embodiment.
Figure 42:
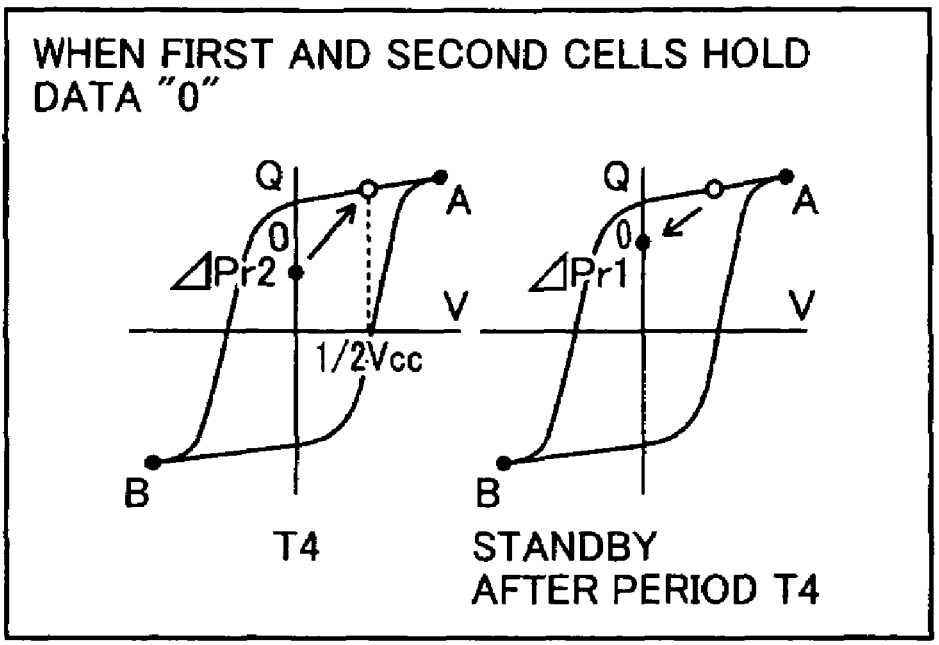
FIG. 42 is a hysteresis diagram showing change of the polarization state in the period T4 when the non-selected first and second cells hold data "0" in the read operation and the rewrite operation according to the ninth embodiment.
Figure 43:
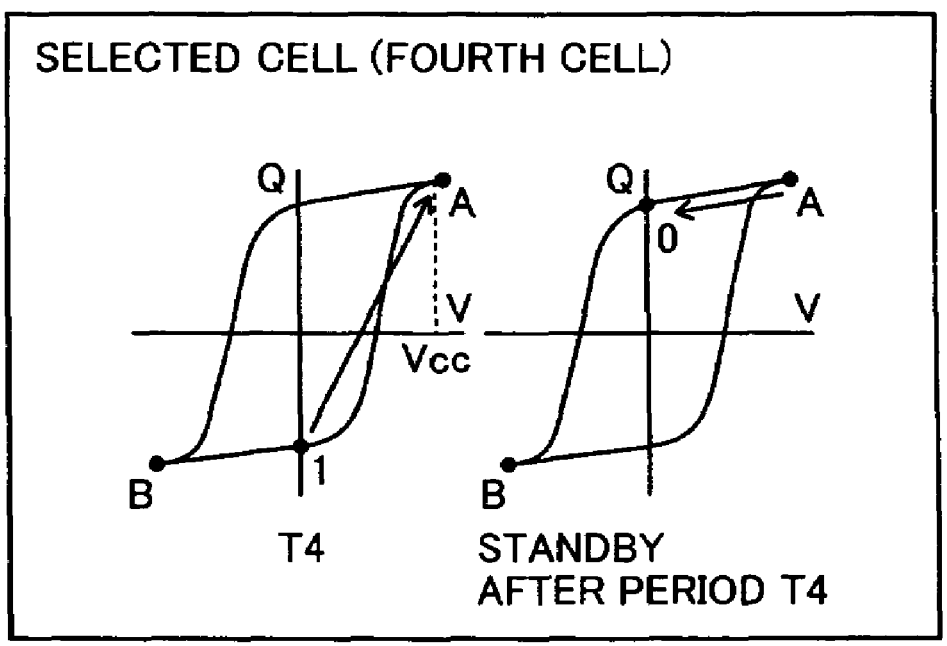
FIG. 43 is a hysteresis diagram showing change of the polarization state of the selected cell (fourth cell) in the period T4 for the read operation and the rewrite operation according to the ninth embodiment.

Consequently, the polarization states are deteriorated in the first and second cells when holding data "1", as shown in FIG. 41. The polarization states are improved when the first and second cells hold data "0", as shown in FIG. 42. On the other hand, the polarization state remains unchanged (not shown) in the non-selected third cell due to the potential difference 0 V. The simple matrix ferroelectric memory writes data "0" in the selected fourth cell, as shown in FIG. 43.

Figure 32:
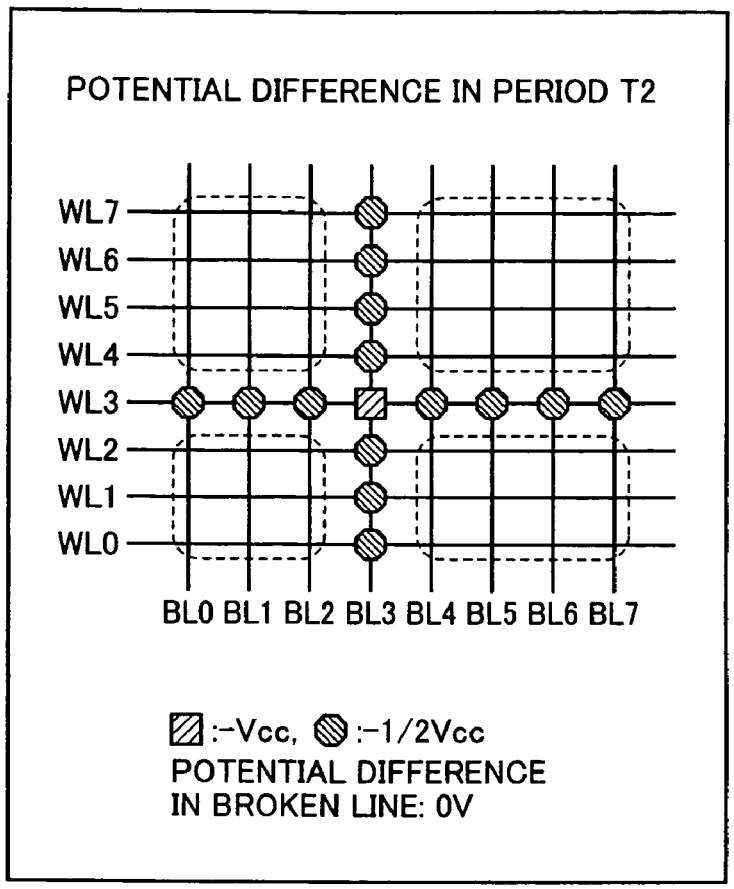
FIG. 32 is a diagram for illustrating potential differences applied to the respective memory cells in a period T2 for the read operation and the rewrite operation according to the ninth embodiment.

In the standby state after the rewrite operation in the period T2 shown in FIG. 32 or the rewrite operation in the period T4 shown in FIG. 40, the memory cells exhibit polarization states after a series of read and rewrite operations in the simple matrix ferroelectric memory according to the ninth embodiment. The polarization states are deteriorated in partial memory cells due to single disturbance. However, this deterioration of the polarization states is not increased also when the simple matrix ferroelectric memory repeats the read and rewrite operations.

Figure 44:
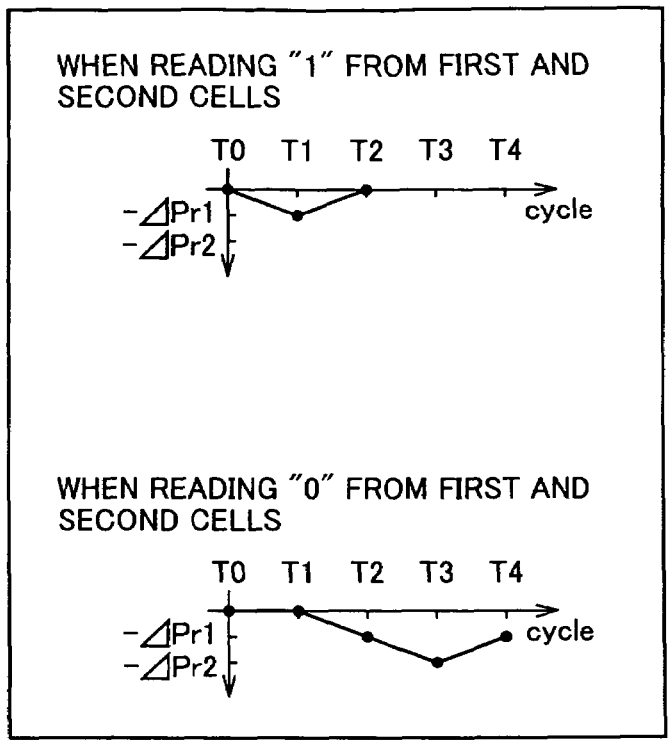
FIG. 44 illustrates change of the quantity of polarization of the non-selected first and second cells when performing the read operation and the rewrite operation according to the ninth embodiment from an initial state (T0) exhibiting no deterioration of the polarization state resulting from disturbance.
Figure 45:
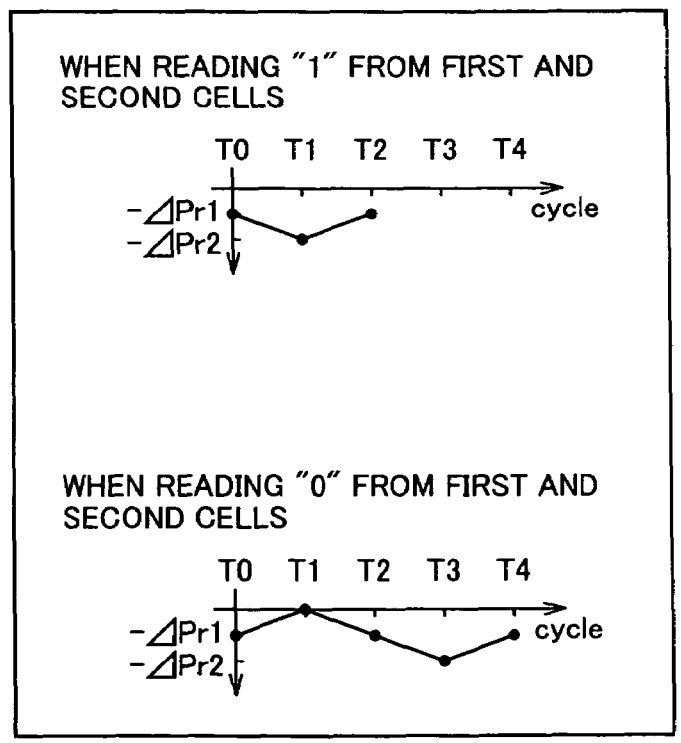
FIG. 45 illustrates change of the polarization states of the non-selected first and second cells when performing the read operation and the rewrite operation according to the ninth embodiment from the initial state (T0) exhibiting single deterioration of the polarization states resulting from disturbance.

FIG. 44 shows change of the quantities of polarization of the first and second cells when the simple matrix ferroelectric memory according to the ninth embodiment performs the read and rewrite operations from an initial state (T0) presenting no deterioration of the polarization states resulting from disturbance. FIG. 45 shows change of the quantities of polarization of the first and second cells when the simple matrix ferroelectric memory according to the ninth embodiment performs the read and rewrite operations from an initial state (T0) presenting deterioration of the polarization states resulting from single disturbance. The non-selected third cell exhibiting no change of the polarization state (no disturbance) due to the potential difference 0 V regularly applied in the series of read and rewrite operations is not shown in FIGS. 44 and 45. It is understood from FIGS. 44 and 45 that deterioration of the polarization states is not increased also when the simple matrix ferroelectric memory repeats the read and rewrite operations.

As hereinabove described, the simple matrix ferroelectric memory according to the ninth embodiment alternately applies the potential difference ±½Vcc to the non-selected first and second cells throughout the read and rewrite operations, thereby effectively inhibiting the non-selected first and second cells from data destruction resulting from deterioration of the polarization states. Further, the simple matrix ferroelectric memory regularly applies the potential difference 0 V to the non-selected third cell throughout the read and rewrite operations, thereby causing no data destruction resulting from deterioration of the polarization state.

(Write Operation)

An operation of writing data "1" in the simple matrix ferroelectric memory according to the ninth embodiment is now described with reference to FIGS. 46 to 54.

(1) Compensatory Operation in Period T1

Figure 46:
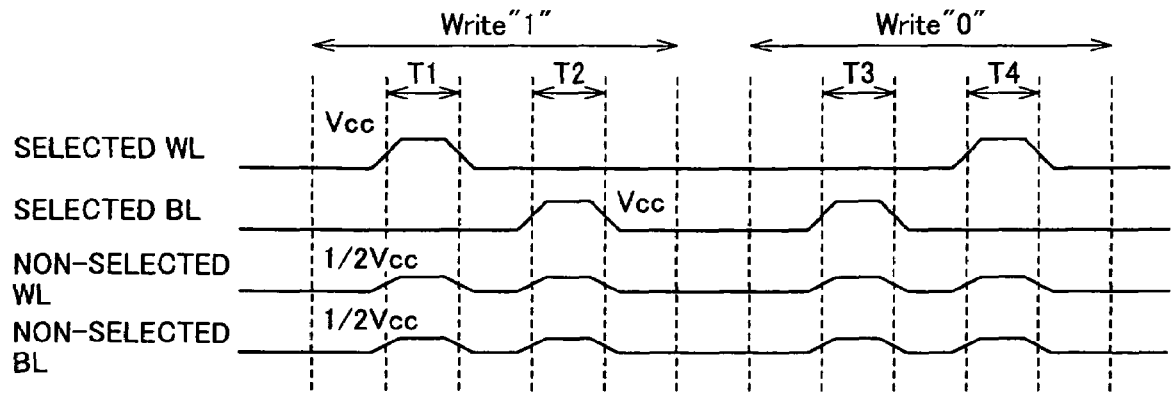
FIG. 46 is a waveform diagram for illustrating a write operation of the simple matrix ferroelectric memory according to the ninth embodiment of the present invention.
Figure 47:
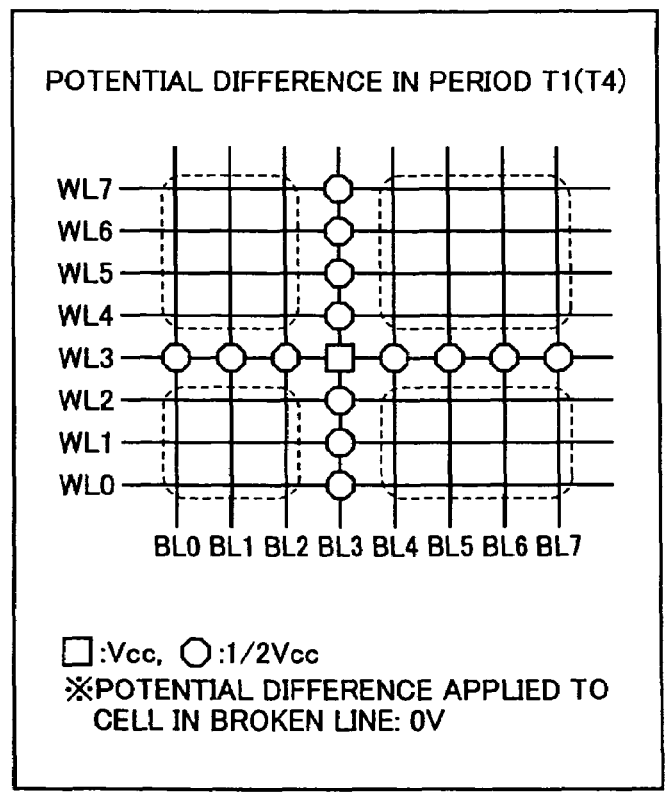
FIG. 47 is a diagram for illustrating potential differences applied to the respective memory cells in a period T1 (T4) for the write operation according to the ninth embodiment.

First, the simple matrix ferroelectric memory sets the selected WL, the non-selected WL, the selected BL and the non-selected BL to the voltages Vcc, ½Vcc, 0 V and ½Vcc from a standby state, as shown in FIG. 46. FIG. 47 shows potential differences applied to the respective memory cells in this case. In other words, the simple matrix ferroelectric memory applies the potential difference ½Vcc to the non-selected first and second cells for the period T1, while applying the potential difference 0 V to the non-selected third cell for the period T1. On the other hand, the simple matrix ferroelectric memory applies the potential difference Vcc to the selected fourth cell for the period T1.

Figure 48:
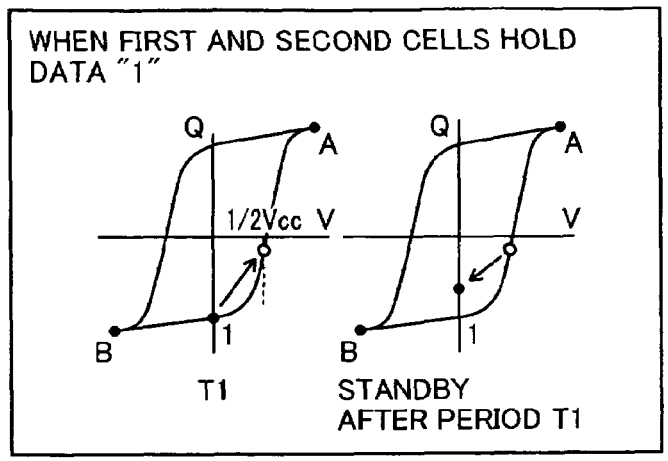
FIG. 48 is a hysteresis diagram showing change of the polarization state in the period T1 (T4) when the non-selected first and second cells hold data "1" in the write operation according to the ninth embodiment.
Figure 49:
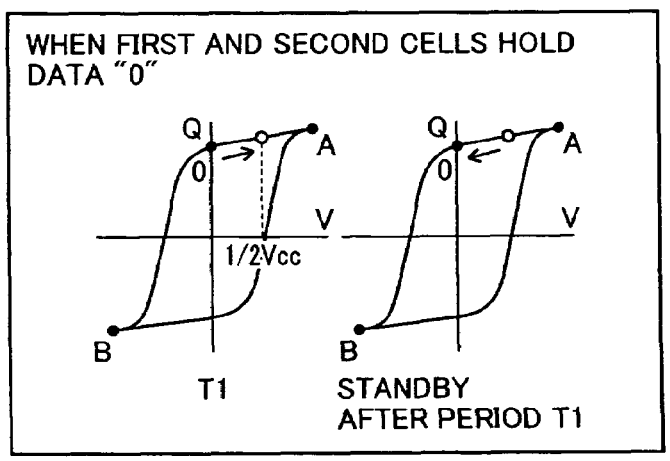
FIG. 49 is a hysteresis diagram showing change of the polarization state in the period T1 (T4) when the non-selected first and second cells hold data "0" in the write operation according to the ninth embodiment.
Figure 50:
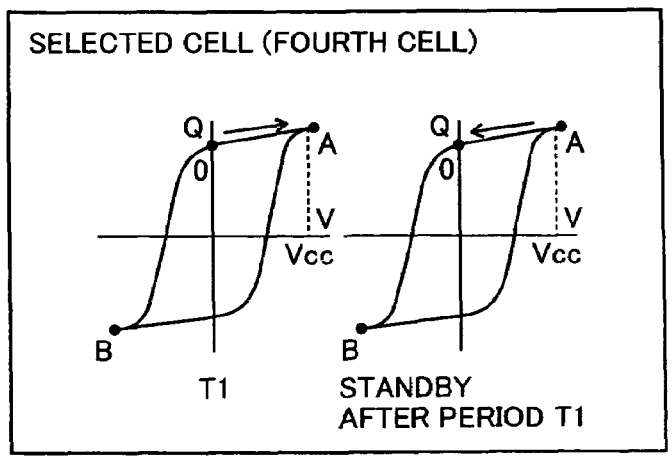
FIG. 50 is a hysteresis diagram showing change of the polarization state of the selected cell (fourth cell) in the period T1 (T4) for the write operation according to the ninth embodiment.

Consequently, the polarization states are deteriorated in the first and second cells when holding data "1", as shown in FIG. 48. The polarization states are improved in the non-selected first and second cells when holding data "0", as shown in FIG. 49. In the non-selected third cell, the polarization state remains unchanged (not shown) due to the potential difference 0 V. The simple matrix ferroelectric memory writes data "0" in the selected fourth cell, as shown in FIG. 50.

(2) Write Operation in Period T2

Figure 51:
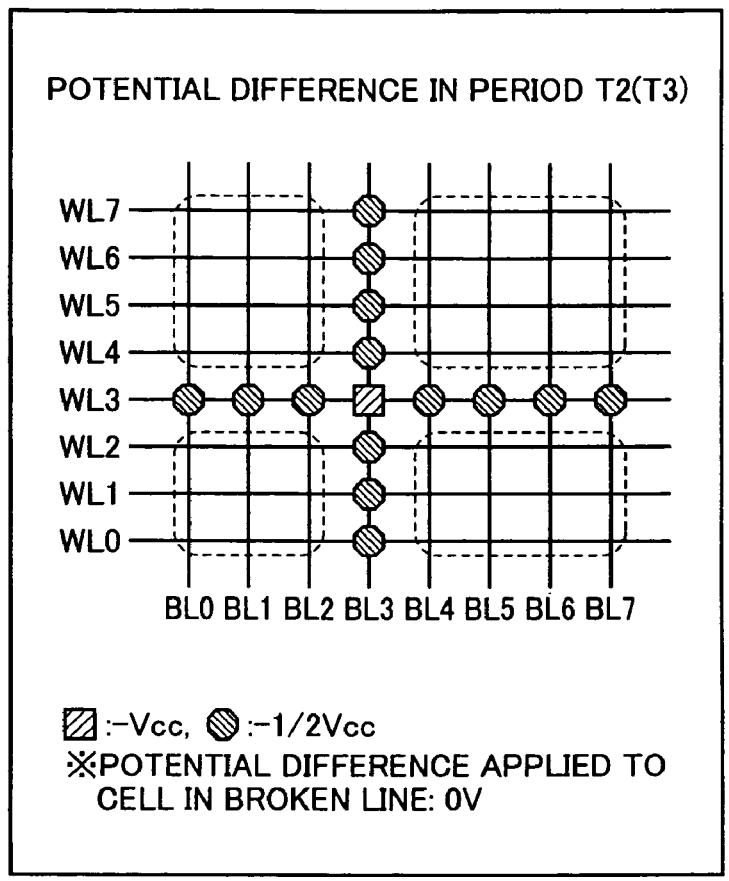
FIG. 51 is a diagram for illustrating potential differences applied to the respective memory cells in a period T2 (T3) for the write operation according to the ninth embodiment.

In the period T2 for the write operation, the simple matrix ferroelectric memory sets the selected WL, the non-selected WL, the selected BL and the non-selected BL to the voltages 0 V, ½Vcc, Vcc and ½Vcc respectively from a standby state, as shown in FIG. 46. FIG. 51 shows potential differences applied to the respective memory cells in this case. In other words, the simple matrix ferroelectric memory applies the potential difference −½Vcc to the non-selected first and second cells for the period T2. The simple matrix ferroelectric memory further applies the potential difference 0 V to the non-selected third cell for the period T2. On the other hand, the simple matrix ferroelectric memory applies the potential difference −Vcc to the selected fourth cell for the period T2.

Figure 52:
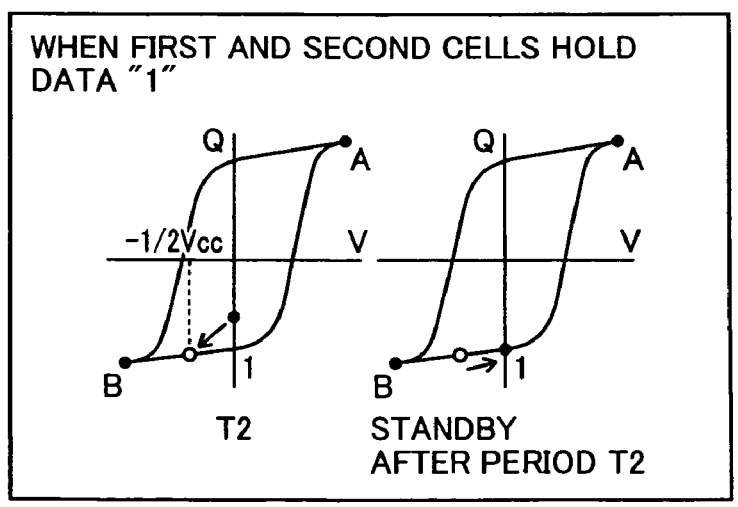
FIG. 52 is a hysteresis diagram showing change of the polarization state in the period T2 (T3) when the non-selected first and second cells hold data "1" in the write operation according to the ninth embodiment.

Consequently, the polarization states are improved in the non-selected first and second cells when holding data "1", as shown in FIG. 52. The polarization states are deteriorated in the non-selected first and second cells when holding data "0". In the non-selected third cell, the polarization state remains unchanged (not shown) due to the potential difference 0 V. The simple matrix ferroelectric memory writes data "1" in the selected fourth cell, as shown in FIG. 54.

Figure 53:
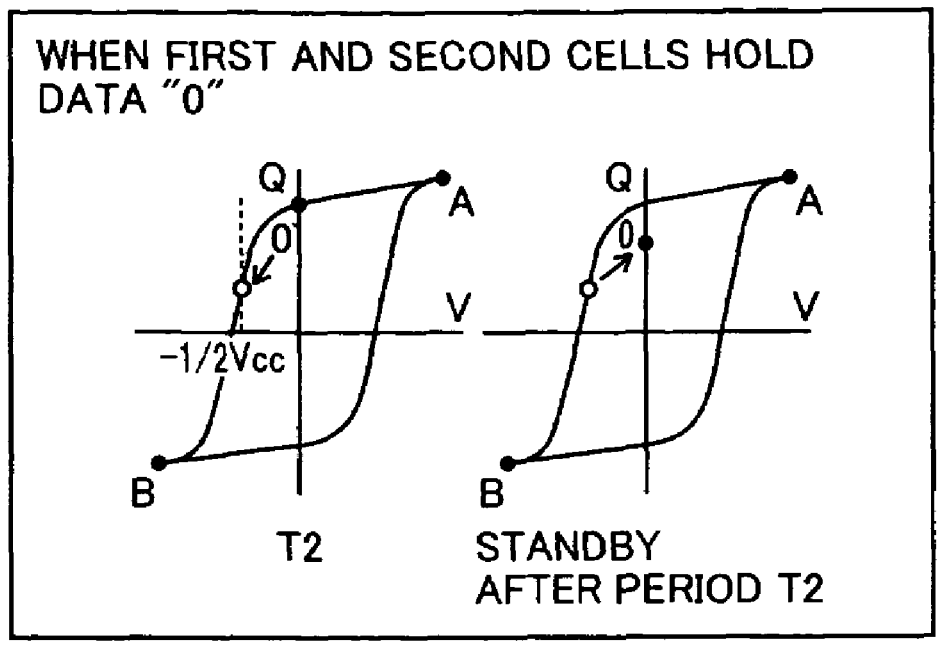
FIG. 53 is a hysteresis diagram showing change of the polarization state in the period T2 (T3) when the non-selected first and second cells hold data "0" in the write operation according to the ninth embodiment.
Figure 54:
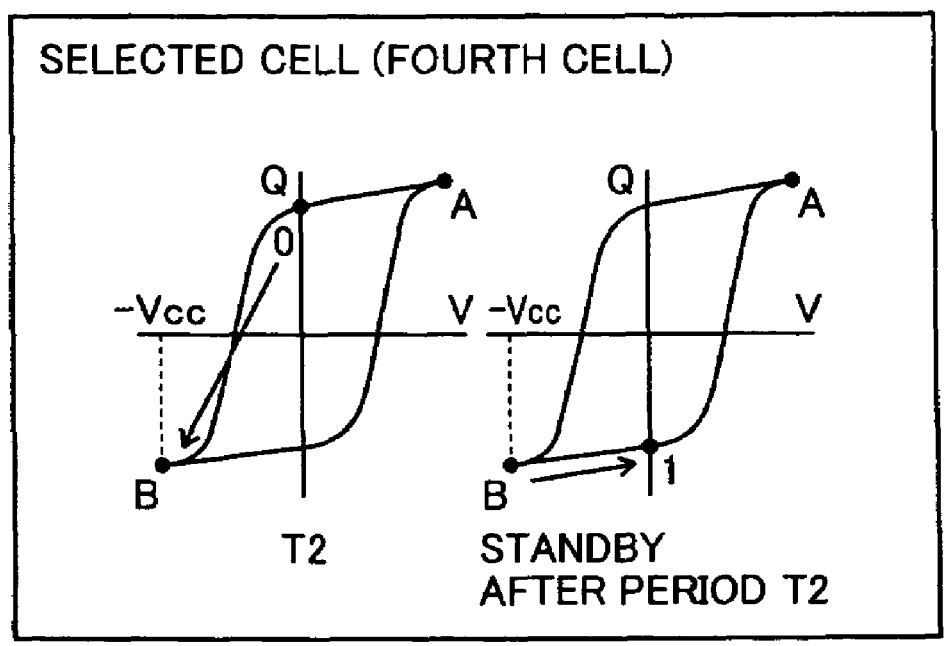
FIG. 54 is a hysteresis diagram showing change of the polarization state of the selected cell (fourth cell) in the period T2 (T3) for the write operation according to the ninth embodiment.

In the standby state after the period T2 shown in FIGS. 52 to 54, the memory cells exhibit polarization states after a series of write operations. The polarization states are deteriorated in partial memory cells due to single disturbance. However, this deterioration of the polarization states is not increased also when the simple matrix ferroelectric memory repeats the write operation. The simple matrix ferroelectric memory according to the ninth embodiment causes single deterioration and single improvement of the polarization states in the series of write operations respectively, whereby the quantity of deterioration is not increased after completing the write operation also when the simple matrix ferroelectric memory starts a series of write operations from the initial state presenting deterioration of the polarization states resulting from single disturbance.

Also in an operation of writing data "0", the simple matrix ferroelectric memory writes the data to be written after previously writing reverse data, similarly to the aforementioned operation of writing the data "1". Also in this case, the simple matrix ferroelectric memory attains an effect similar to that in the aforementioned operation of writing the data "1".

According to the ninth embodiment, the simple matrix ferroelectric memory drives the word lines WL and the bit lines BL with the three types of voltages Vcc, ½Vcc and 0 V as hereinabove described, whereby the number of types of the voltages can be reduced as compared with the aforementioned first to eighth embodiments driving the word lines WL and the bit lines BL with the four types of voltages Vcc, ⅔Vcc, ⅓Vcc and 0 V. Thus, a control circuit can be simplified and power consumption can be reduced while a voltage generation circuit can also be simplified in the ninth embodiment as compared with the first to eighth embodiments.

The simple matrix ferroelectric memory according to the ninth embodiment sets the voltage Vcc so that the voltage ⅓Vcc applied to the non-selected cells is not more than a coercive voltage (polarization-inverted voltage) conceivable from hysteresis characteristics of the memory cells forming ferroelectric memories. Thus, the quantities of polarization states finally caused in the non-selected cells can be reduced.

Although the present invention has been described and illustrated in detail, it is clearly understood that the same is by way of illustration and example only and is not to be taken by way of limitation, the spirit and scope of the present invention being limited only by the terms of the appended claims.

For example, while the standby states are arranged between the periods (1) to (4) for the respective operations in the aforementioned embodiments, the present invention is not restricted to this but the operations in the periods (1) to (4) may alternatively be continuously performed with no standby states.

While each of the above embodiments has been described with reference to a ferroelectric memory including ferroelectric films serving as storage means, the present invention is not restricted to this but is also applicable to another type of memory so far as the same includes storage means connected between bit lines and word lines. For example, the present invention is also applicable to a memory having storage means formed by resistive elements.

While the above eighth embodiment has been described with reference to an FET-type ferroelectric memory having an MFMIS structure, the present invention is not restricted to this but is also applicable to an FET-type ferroelectric memory having an MFIS or MFS structure.

While the ferroelectric memory according to the aforementioned eighth embodiment applies the voltage Vpp to the source line SL1 (selected SL) connected with the selected fourth cell in the read operation performed in the period (1) for the read/rewrite operation, the present invention is not restricted to this but the ferroelectric memory may alternatively apply the voltage ⅔Vpp to the selected SL identically to the non-selected BL, for example.

While the ferroelectric memory according to each of the aforementioned embodiments performs the operations in the periods (1) to (4) for identical times (T seconds), the present invention is not restricted to this but the ferroelectric memory may alternatively perform the operations in the periods (1) and (2) for T1 seconds and T2 seconds (T1≠T2) respectively, so far as the polarization states are not substantially deteriorated in the non-selected cells when the ferroelectric memory repeats the operations in the periods (1) and (2).

While the ferroelectric memory according to each of the aforementioned embodiments sets the word lines WL and the bit lines BL to 0 V in the standby state, the present invention is not restricted to this but the ferroelectric memory may alternatively set the word lines WL and the bit lines BL identically to a prescribed potential other than 0 V in the standby state. In this case, however, the ferroelectric memory must set the selected BL to the potential in the standby state before bringing the same into the floating state so that the selected BL makes a transition to the floating state from a voltage 1 V in the read operation assuming that the word lines WL and the bit lines BL are at the voltage 1 V in the standby state, for example.

While the ferroelectric memory according to each of the aforementioned embodiments sets the selected WL, the non-selected WL and the non-selected BL to the prescribed voltages at the same timing as that for bringing the selected BL into the floating state from the standby state when reading data, the present invention is not restricted to this but the ferroelectric memory may alternatively set the selected WL, the non-selected WL and the non-selected BL to the prescribed voltages in a delay by about several 10 nsec. from the timing for bringing the selected BL into the floating state from the standby state.

Figure 55:
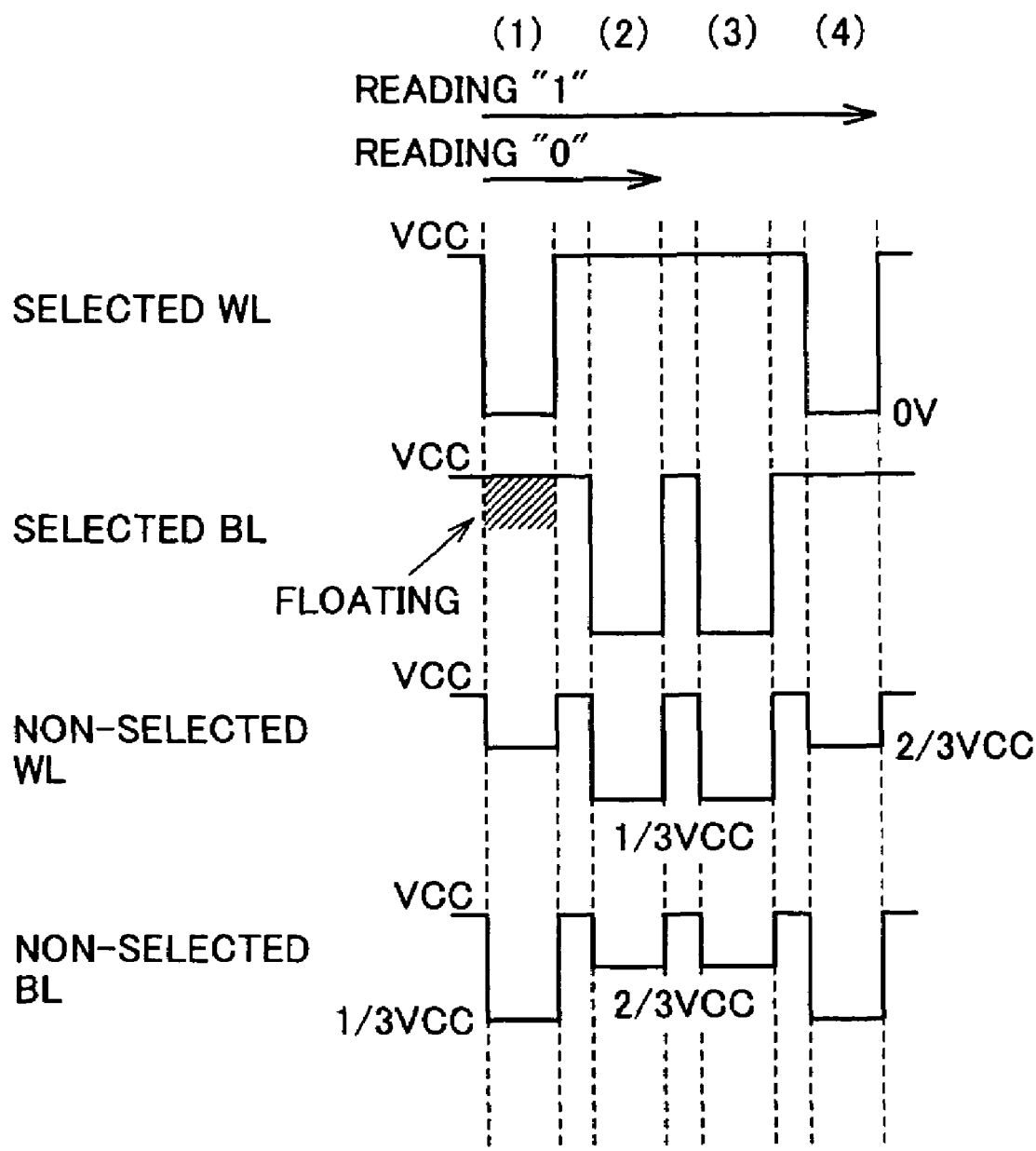
FIG. 55 is a voltage waveform diagram for illustrating a read operation and a rewrite operation of a simple matrix ferroelectric memory according to a first modification of the first embodiment of the present invention.

While the ferroelectric memory according to the first embodiment shown in FIG. 4 sets the word lines WL and the bit lines BL to 0 V in the standby state, the present invention is not restricted to this but the ferroelectric memory may alternatively set the word lines WL and the bit lines BL to the voltage Vcc in the standby state, as in a ferroelectric memory according to a first modification of the first embodiment shown in FIG. 55. FIG. 55 shows voltage arrangement in this case. In this case, the ferroelectric memory stops operating in a period (2) when reading data "0" in a period (1) for a read operation, while keeping its operation up to a period (4) when reading data "1" in the period (1) for the read operation. Also in the first modification of the first embodiment, the numbers of times of deterioration and improvement of polarization states are equal to each other in both cases of reading the data "1" and "0", similarly to the aforementioned first embodiment. Also when the ferroelectric memory repeats the read operation and a rewrite operation, therefore, deterioration of the polarization states is not accumulated in non-selected cells, whereby finally held data are not destroyed. The sequence according to the first modification of the first embodiment shown in FIG. 55 is preferable when the ferroelectric memory sets the word lines WL and the bit liens BL to a voltage greater than or equal to the voltage ½Vcc in the standby state, while the sequence according to the first embodiment shown in FIG. 4 is preferable when the ferroelectric memory sets the word lines WL and the bit liens BL to a voltage less than the voltage ½Vcc.

Figure 56:
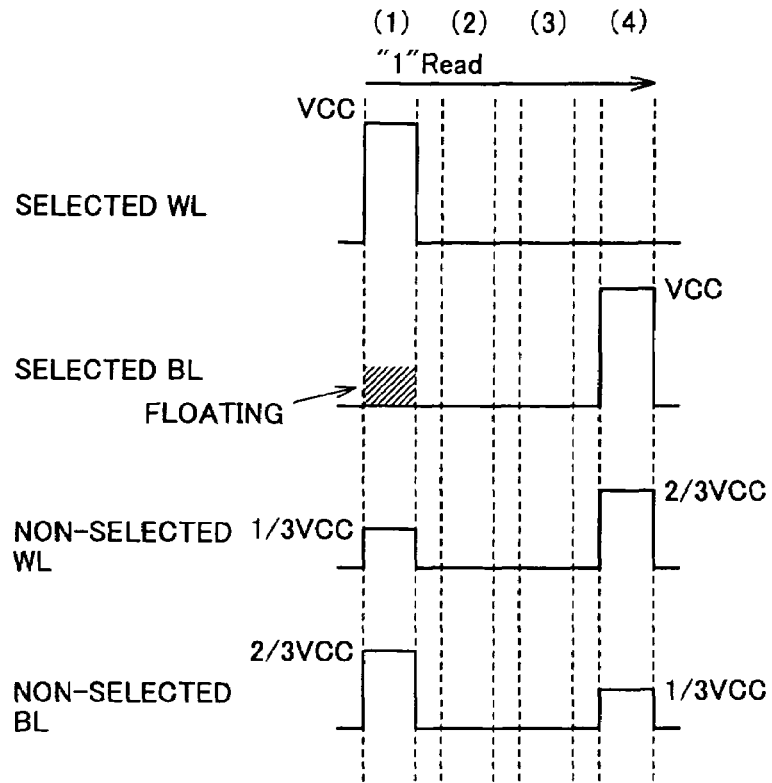
FIG. 56 is a voltage waveform diagram for illustrating a read operation and a rewrite operation of a simple matrix ferroelectric memory according to a second modification of the first embodiment of the present invention.
Figure 57:
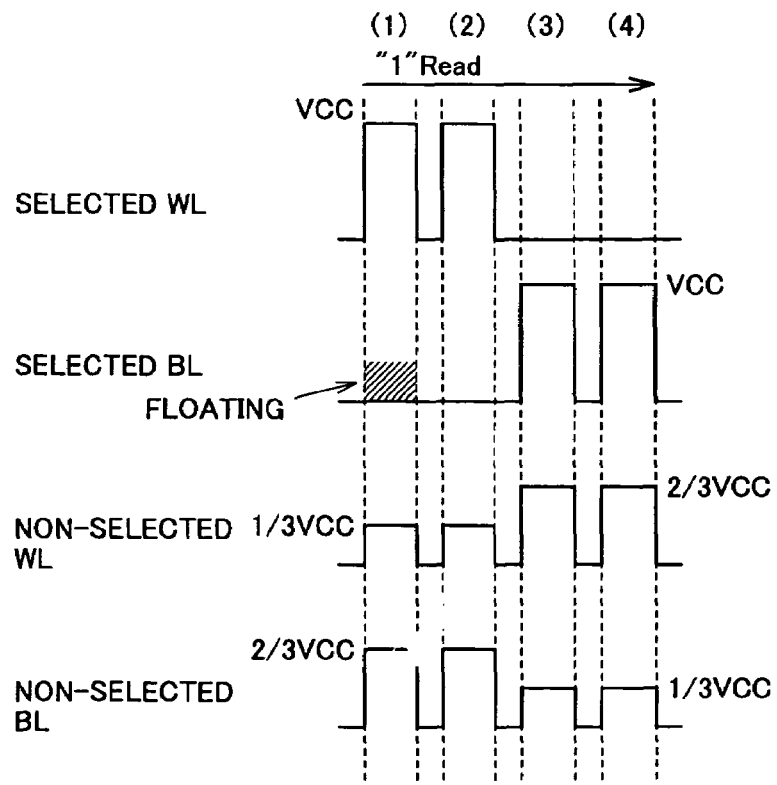
FIG. 57 is a voltage waveform diagram for illustrating a read operation and a rewrite operation of a simple matrix ferroelectric memory according to a third modification of the first embodiment of the present invention.
Figure 58:
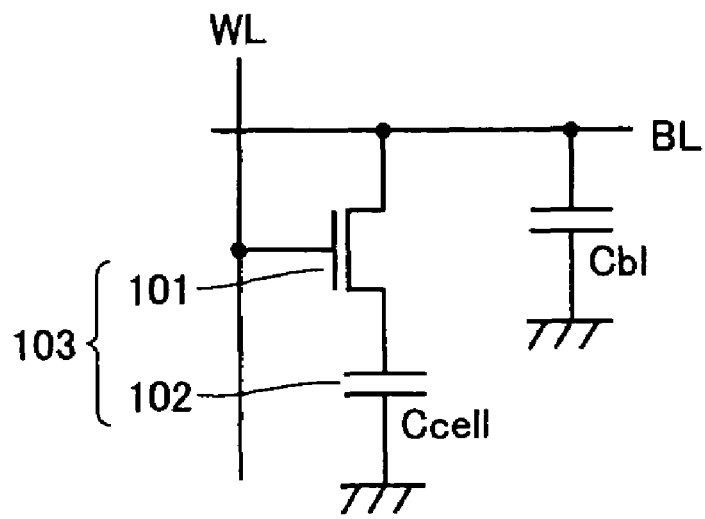
FIG. 58 is an equivalent circuit diagram showing the structure of a memory cell of a conventional DRAM.
Figure 59:
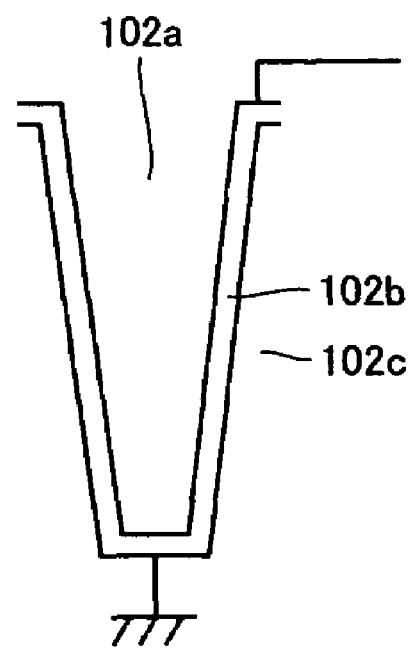
FIG. 59 is a sectional view showing the structure of a trench-type capacitor of the conventional DRAM.
Figure 60:
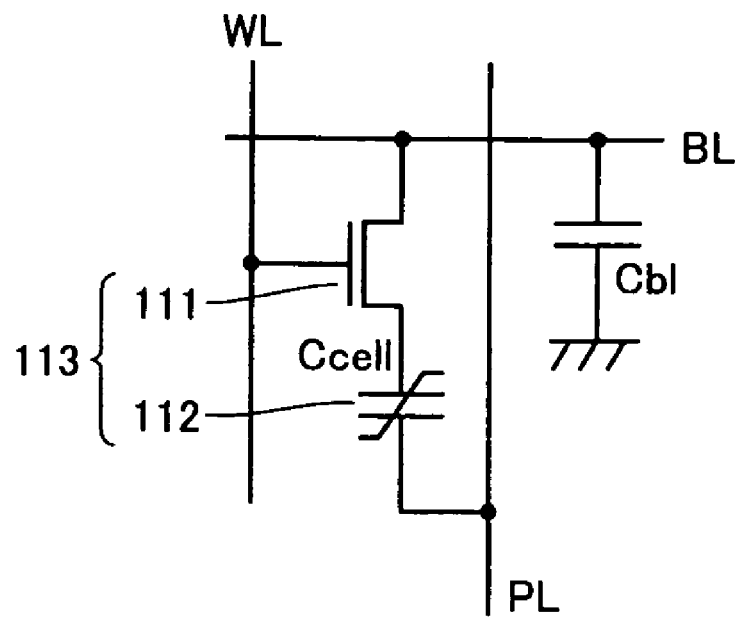
FIG. 60 is an equivalent circuit diagram showing a memory cell of a conventional or transistor one-capacitor ferroelectric memory.

While the ferroelectric memory according to the first embodiment shown in FIG. 4 terminates the read operation and the rewrite operation only in the periods (1) and (2) when reading data "1", the present invention is not restricted to this but the ferroelectric memory may alternatively perform read and rewrite operations in the sequence of the periods (1) to (4) when reading data "1", as in each of second and third modifications of the first embodiment shown in FIGS. 56 and 57. In this case, the ferroelectric memory performs the read and rewrite operation in the sequence of the periods (1) to (4) shown in FIG. 56 or 57 when reading data "1", while performing the read and rewrite operations in the sequence of the periods (1) to (4) shown in FIG. 4 when reading data "0".

What is claimed is:

1. A memory comprising:
a bit line;
a word line arranged to intersect with said bit line;
a first storage elements comprising a ferroelectric capacitor connected between said bit line and said word line; and
driving circuitry configured for applying to said first storage element a voltage pulse not inverting storage data of said first storage element simultaneously with, before or after at least one operation of a read operation, a rewrite operation or a write operation.

2. A memory comprising:
a bit line;
a word line arranged to intersect with said bit line;
a first storage element comprising a ferroelectric capacitor connected between said bit line and said word line; and
driving circuitry configured for applying to said first storage element a first voltage pulse providing an electric field of a first direction inverting storage data of said first storage element and a second voltage pulse providing an electric field opposite to said first direction not inverting storage data of said first storage element in at least one operation of a read operation, a rewrite operation or a write operation.

3. A memory comprising:
a bit line;
a word line arranged to intersect with said bit line;
a first storage element connected between said bit line and said word line; and
driving circuitry configured for applying to said first storage element a first voltage pulse providing an electric field of a first direction inverting storage data in said first storage element and a second voltage pulse providing an electric field opposite to said first direction not inverting storage data in said first storage element in at least one operation of a read operation or a rewrite operation.

4. The memory according to claim 3, wherein said driving circuitry is configured for applying said first voltage pulse and said second voltage pulse by the same number of times respectively while varying a technique for applying said first voltage pulse and said second voltage pulse to said first storage element depending on data read by said read operation.

5. The memory according to claim 4, wherein said driving circuitry is configured for varying the technique for applying said first and second voltage pulses to said first storage element throughout said read operation and said rewrite operation depending on the data read by said read operation.

6. The memory according to claim 3, further comprising a plurality of first storage elements including said first storage element, wherein
said plurality of first storage elements receiving said first voltage pulse and said second voltage pulse at least includes:
a selected first storage element connected to selected said bit line and selected said word line, and
a non-selected first storage element other than said selected first storage element.

7. The memory according to claim 3, wherein said driving circuitry is configured for performing said read operation, two operations of rewriting first data and an operation of rewriting second data, when said second data is read by said read operation.

8. The memory according to claim 3, wherein said driving circuitry is configured for starting said read operation after setting said word line and said bit line to substantially identical potentials.

9. The memory according to claim 3, further comprising a second storage element outputting reference data to be compared with data read by said read operation, wherein
said driving circuitry is configured for applying a first voltage pulse providing an electric field of a first direction and a second voltage pulse providing an electric field opposite to said first direction to said second storage element by the same number of times respectively throughout a read operation and an operation of rewriting read data while varying a technique for applying said first voltage pulse and said second voltage pulse to said second storage element depending on data read by said read operation.

10. The memory according to claim 1, wherein said driving circuitry is configured for previously writing data reverse to data to be written to said selected first storage element and thereafter writing said data to be written in said write operation.

11. The memory according to claim 6, wherein said driving circuitry is configured for applying a voltage not more than a polarization-inverted coercive voltage to non-selected said first storage element.

12. The memory according to claim 3, further comprising a plurality of first storage elements including said first storage element, a plurality of bit lines including said bit line, and a plurality of word lines including said word line, wherein
said plurality of first storage elements at least include selected first storage element connected to a selected bit line and a selected word line, and a non-selected first storage element other than said selected first storage element, and said driving circuitry is configured for applying to said selected first storage element either a first selected voltage pulse providing an electric field of a first direction inverting storage data in said selected first storage element or a second selected voltage pulse providing an electric field opposite to said first direction not inverting storage data in said selected first storage element while applying to said non-selected first storage element at least one of a first non-selected voltage pulse providing an electric field of a first direction inverting storage data in said non-selected first storage element and a second non-selected voltage pulse providing an electric field opposite to said first direction not inverting storage data in said non-selected first storage element in said read operation, and said driving circuitry is further configured for applying said first non-selected voltage pulse and said second non-selected voltage pulse to said non-selected first storage element in said rewrite operation.

13. A memory comprising:

bit lines;

word lines arranged to intersect with said bit lines, repectively;

first storage elements each connected between a corresponding bit line and a corresponding word line; and a driving circuit for driving said bit lines and said word lines, wherein said first storage elements include at least a selected first storage element connected to a selected bit line and a selected word line, and an non-selected first storage element other than said selected first storage element, and said driving circuit performs a read operation or a rewrite operation to said selected first storage element while applying to said non-selected first storage element a voltage pulse not inverting storage data in said non-selected first storage element in said rewrite operation after said read operation.

14. The memory according to claim 13, wherein each of said first storage elements includes a ferroelectric film.

15. The memory according to claim 13, wherein said driving circuit applies to said selected first storage element either a first selected voltage pulse providing an electric field of a first direction inverting storage data in said selected first storage element or a second selected voltage pulse providing an electric field opposite to said first direction not inverting storage data in said selected first storage elements while applying to said non-selected first storage elements at least one of a first non-selected voltage pulse providing an electric field of a first direction inverting storage data in said non-selected first storage element or a second non-selected voltage pulse providing an electric field opposite to said first direction not inverting storage data in said non-selected first storage element in said read operation, and said driving circuit applies said first non-selected voltage pulse and said second non-selected voltage pulse to said non-selected first storage element in said rewrite operation, wherein said voltage pulse not inverting storage data in said first storage element includes said second non-selected voltage pulse.

16. The memory according to claim 15, wherein said driving circuit applies a first selected word line voltage to said selected word line for applying one of said first selected voltage pulse and said second selected voltage pulse to said selected first storage element, and, applies a first non-selected word line voltage to said non-selected word line for applying one of said first non-selected voltage pulse and said second non-selected voltage pulse to said non-selected first storage element, and, applies a first selected bit line voltage to said selected bit line for applying one of said first selected voltage pulse and said second selected voltage pulse to said selected first storage element, and, applies a first non-selected bit line voltage to said non-selected bit line for applying one of said first non-selected voltage pulse and said second non-selected voltage pulse to said non-selected first storage element in said read operation, a rewrite operation is divided into a first period and a second period, said driving circuit applies said first non-selected word line voltage to said non-selected word line while applying said first non-selected bit line voltage to said non-selected bit line during said first period, and said driving circuit applies a second non-selected word line voltage to said non-selected word line for applying the other of said first non-selected voltage pulse and said second non-selected voltage pulse to said first storage elements while applying a second non-selected bit line voltage to said non-selected bit line for applying the other of said first non-selected voltage pulse and said second non-selected voltage pulse to said first non-selected storage element during said second period.

17. The memory according to claim 16, wherein said driving circuit sets said word lines and said bit lines to identical potentials in a period between said first period and said second period.

18. The memory according to claim 13, wherein said driving circuit includes a row decoder driving said word lines, and a column decoder driving said bit lines, wherein said row decoder and said column decoder perform a read operation or a rewrite operation to at least one said selected first storage element while applying a voltage pulse not inverting storage data in said first storage element to said non-selected first storage element in said rewrite operation after said read operation.

* * * * *